(12) United States Patent
Kusunoki et al.

(10) Patent No.: US 11,502,003 B2
(45) Date of Patent: Nov. 15, 2022

(54) IMAGE PROCESSING METHOD

(71) Applicant: Semiconductor Energy Laboratory Co., Ltd., Atsugi (JP)

(72) Inventors: Koji Kusunoki, Isehara (JP); Kazunori Watanabe, Machida (JP); Susumu Kawashima, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 359 days.

(21) Appl. No.: 16/632,673

(22) PCT Filed: Aug. 20, 2018

(86) PCT No.: PCT/IB2018/056264
§ 371 (c)(1),
(2) Date: Jan. 21, 2020

(87) PCT Pub. No.: WO2019/038651
PCT Pub. Date: Feb. 28, 2019

(65) Prior Publication Data
US 2021/0098300 A1    Apr. 1, 2021

(30) Foreign Application Priority Data

Aug. 24, 2017 (JP) .............................. JP2017-161057

(51) Int. Cl.
*G09G 5/02* (2006.01)
*H01L 21/8232* (2006.01)
(Continued)

(52) U.S. Cl.
CPC ........ *H01L 21/8232* (2013.01); *G06F 3/1446* (2013.01); *G09G 5/026* (2013.01);
(Continued)

(58) Field of Classification Search
CPC ............... G09G 3/3233; G09G 3/3648; G09G 2300/04; G09G 2300/02;
(Continued)

(56) References Cited

U.S. PATENT DOCUMENTS 6,233,365 B1    5/2001    Teruhiko
8,780,034 B2    7/2014    Kimura
(Continued)

FOREIGN PATENT DOCUMENTS

CN    104123722 A    10/2014
EP        0810550 A    12/1997
(Continued)

OTHER PUBLICATIONS

Kawashima.S et al., "13.3-in. 8K × 4K 664-ppi OLED Display Using CAAC-OS FETs", SID Digest '14 : SID International Symposium Digest of Technical Papers, Jun. 3, 2014, pp. 627-630.
(Continued)

*Primary Examiner* — Hau H Nguyen
(74) *Attorney, Agent, or Firm* — Robinson Intellectual Property Law Office; Eric J. Robinson

(57) ABSTRACT

A novel image processing method is provided.
In a display device in which a video signal is individually supplied to a screen divided into two, the entire screen is subjected to up-conversion processing after being divided, and another up-conversion processing is performed for a boundary portion of the screen divided into two. The divided up-conversion processing for the entire screen and the up-conversion processing for the boundary portion are performed in parallel with the use of a plurality of arithmetic units. The divided up-conversion processing for the entire screen and the up-conversion processing for the boundary portion can be performed using different algorithms.

10 Claims, 25 Drawing Sheets

(51) Int. Cl.
*H01L 27/088* (2006.01)
*H04N 5/232* (2006.01)
*G06F 3/14* (2006.01)
*G09G 5/391* (2006.01)
*G09G 5/399* (2006.01)

(52) U.S. Cl.
CPC ............. *G09G 5/391* (2013.01); *G09G 5/399* (2013.01); *H01L 27/088* (2013.01); *H04N 5/23232* (2013.01)

(58) Field of Classification Search
CPC ... G09G 2310/0221; G09G 2310/0264; G09G 2340/0407; G09G 2340/04; G09G 5/391; G09G 5/393; G09G 5/395; G06F 3/1446; G06T 9/002; G06T 3/4053; G06T 3/40; G06T 3/4046
See application file for complete search history.

(56) References Cited

U.S. PATENT DOCUMENTS

| | | | |
|---|---|---|---|
| 9,343,018 | B2 | 5/2016 | Kimura |
| 9,614,022 | B2 | 4/2017 | Miyake et al. |
| 9,747,665 | B2 | 8/2017 | Orio et al. |
| 9,858,028 | B2 | 1/2018 | Ikeda et al. |
| 9,978,320 | B2 | 5/2018 | Kimura |
| 10,141,069 | B2 | 11/2018 | Ikeda et al. |
| 10,159,135 | B2 | 12/2018 | Ikeda et al. |
| 2010/0259653 | A1 | 10/2010 | Kimura |
| 2011/0032422 | A1 | 2/2011 | Yamamoto et al. |
| 2015/0103101 | A1 | 4/2015 | Lee et al. |
| 2016/0225124 | A1 | 8/2016 | Orio et al. |
| 2016/0343452 | A1* | 11/2016 | Ikeda .................. G11C 27/024 |
| 2016/0358574 | A1 | 12/2016 | Hohjoh |
| 2016/0366365 | A1 | 12/2016 | Iyer et al. |
| 2017/0063351 | A1 | 3/2017 | Kurokawa |
| 2017/0116512 | A1 | 4/2017 | Kurokawa |
| 2017/0118479 | A1 | 4/2017 | Kurokawa |
| 2017/0270405 | A1 | 9/2017 | Kurokawa |
| 2017/0301376 | A1 | 10/2017 | Kurokawa |
| 2017/0324944 | A1 | 11/2017 | Nakajima et al. |
| 2018/0045867 | A1 | 2/2018 | Kunugise et al. |
| 2018/0061344 | A1 | 3/2018 | Kurokawa |
| 2018/0261172 | A1 | 9/2018 | Kimura |
| 2019/0005619 | A1* | 1/2019 | Michelini ............. G06T 3/4046 |
| 2019/0348011 | A1 | 11/2019 | Kurokawa |
| 2020/0051211 | A1 | 2/2020 | Shiokawa et al. |
| 2020/0126510 | A1 | 4/2020 | Shiokawa et al. |
| 2020/0219467 | A1 | 7/2020 | Okamoto |

FOREIGN PATENT DOCUMENTS

| | | |
|---|---|---|
| JP | 09-319866 A | 12/1997 |
| JP | 2002-032063 A | 1/2002 |
| JP | 2010-262276 A | 11/2010 |
| JP | 2016-143006 A | 8/2016 |
| JP | 2016-218274 A | 12/2016 |
| JP | 2018-146648 A | 9/2018 |
| KR | 2015-0042045 A | 4/2015 |
| WO | WO-2009/147795 | 12/2009 |
| WO | WO-2012/157728 | 11/2012 |
| WO | WO-2019/025895 | 2/2019 |

OTHER PUBLICATIONS

Kim.J et al., "Accurate Image Super-Resolution Using Very Deep Convolutional Networks", IEEE Conference On Computer Vision and Pattern Recognition(CVPR), Jun. 27, 2016, pp. 1646-1654.
International Search Report (Application No. PCT/IB2018/056264) dated Nov. 20, 2018.
Written Opinion (Application No. PCT/IB2018/056264) dated Nov. 20, 2018.

* cited by examiner

Display device 100

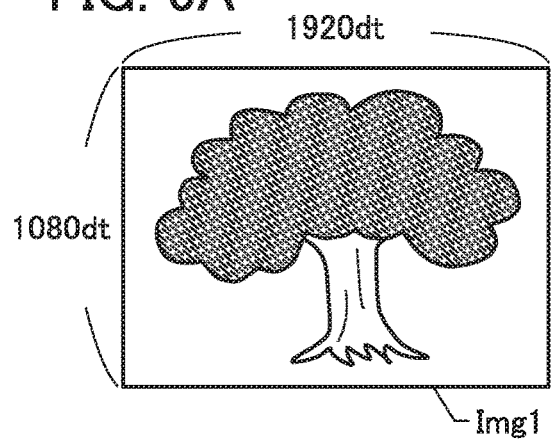
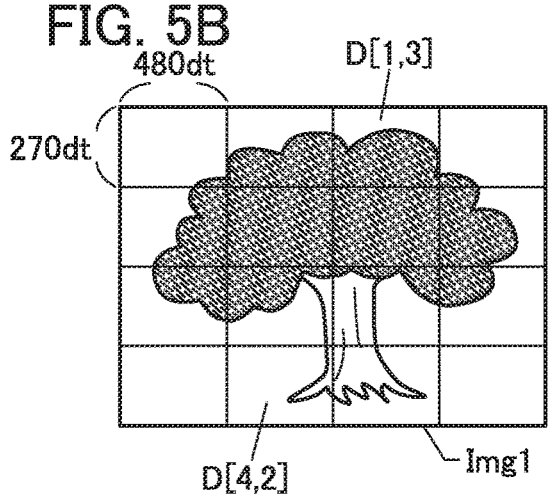
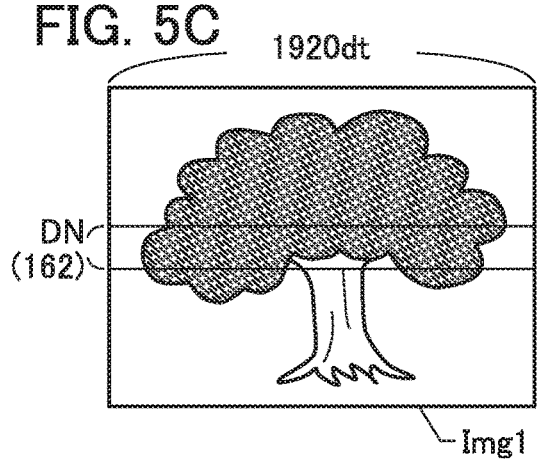
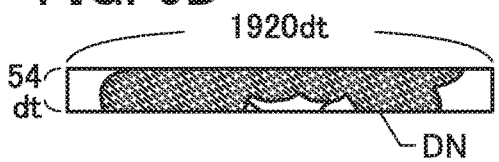
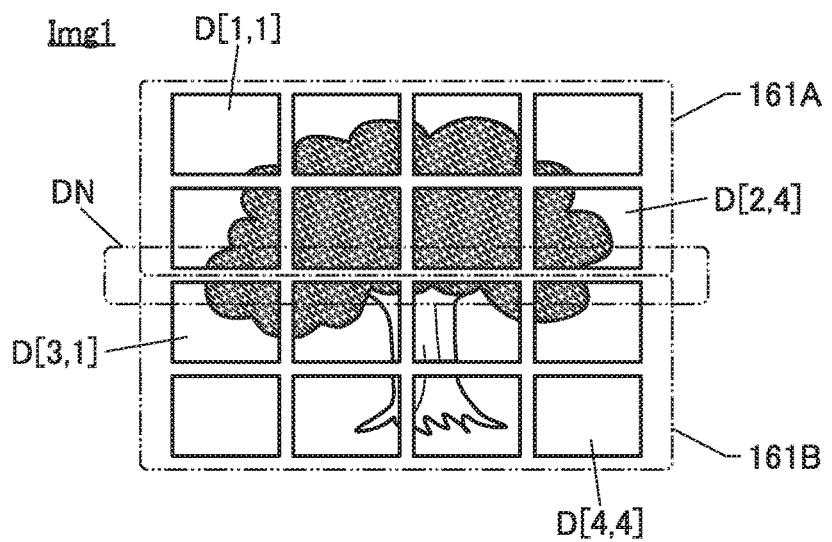

FIG. 6A1
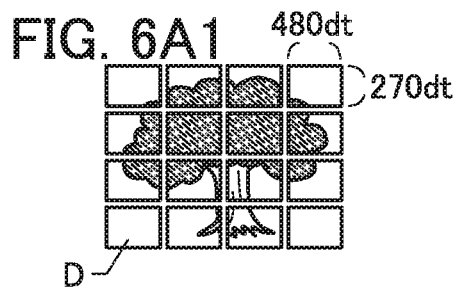
FIG. 6B1
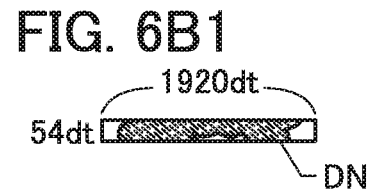
FIG. 6A2
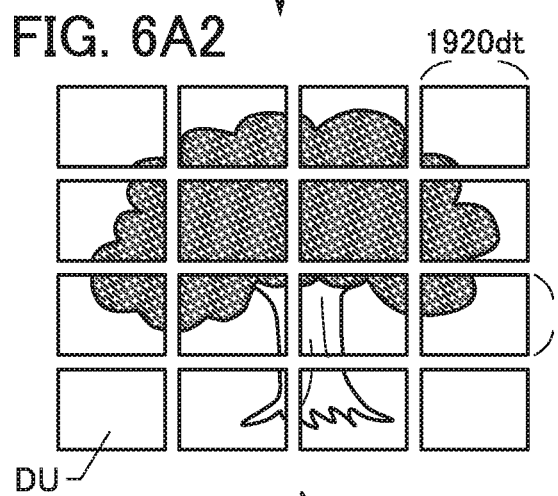
FIG. 6B2
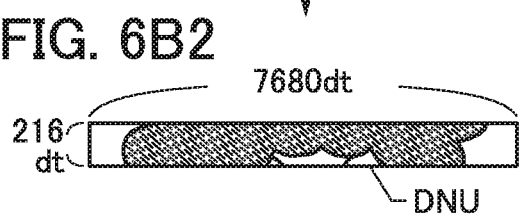
FIG. 6C
Img1U
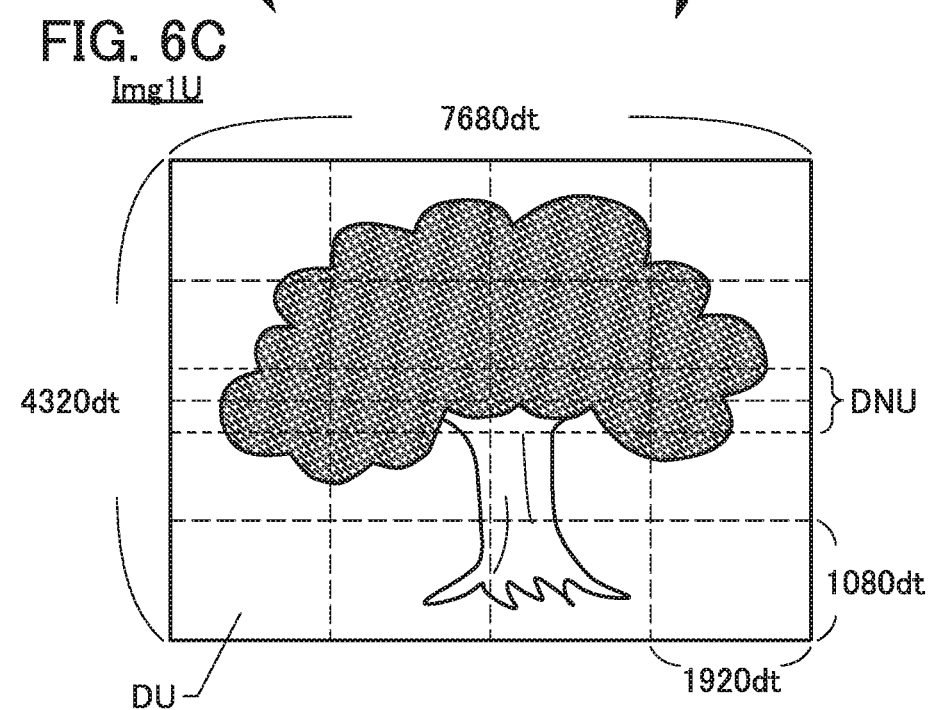

FIG. 7

| Group | Algorithm | Quality | Processing speed |
|---|---|---|---|
| A | Nearest neighbor | Lowest | High ↕ Low |
| A | Bilinear | Low | |
| A | Bicubic | Medium | |
| B | RAISR | High | |
| B | ANR | High | |
| B | A+ | Higher | |
| C | SRCNN | Highest | |

$a = x_1 w_1 + x_2 w_2 + b$

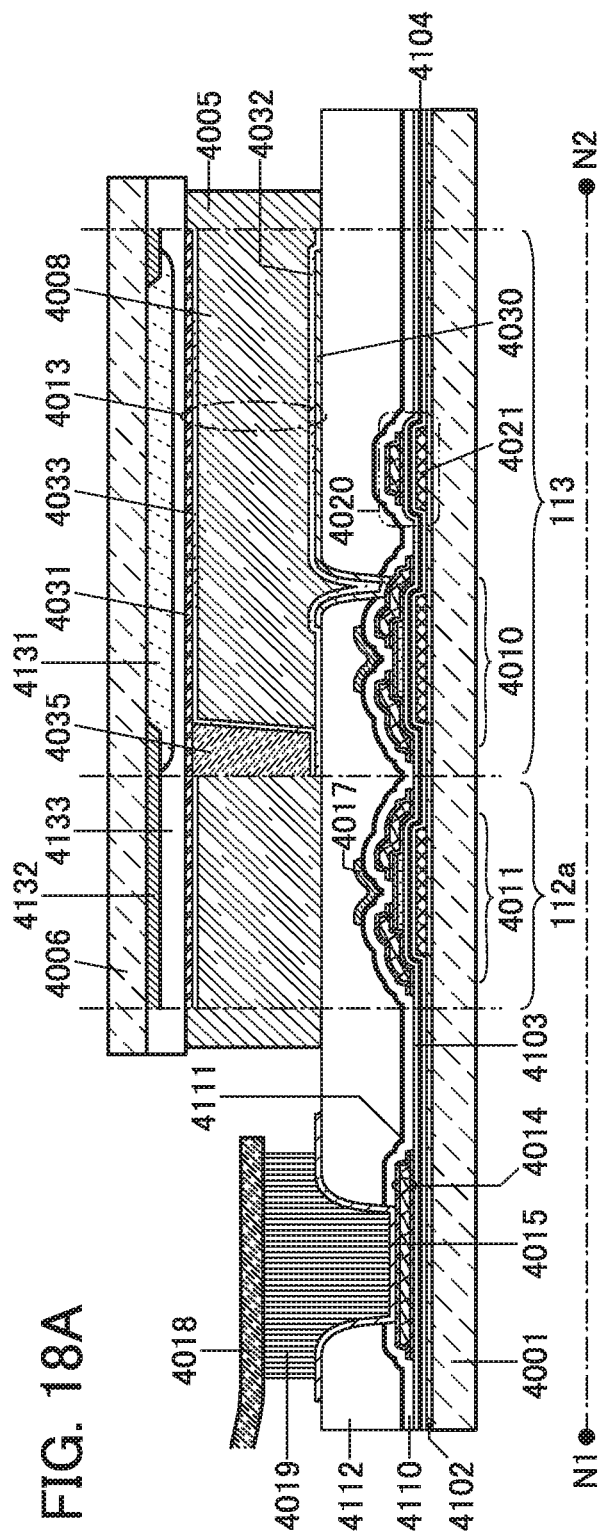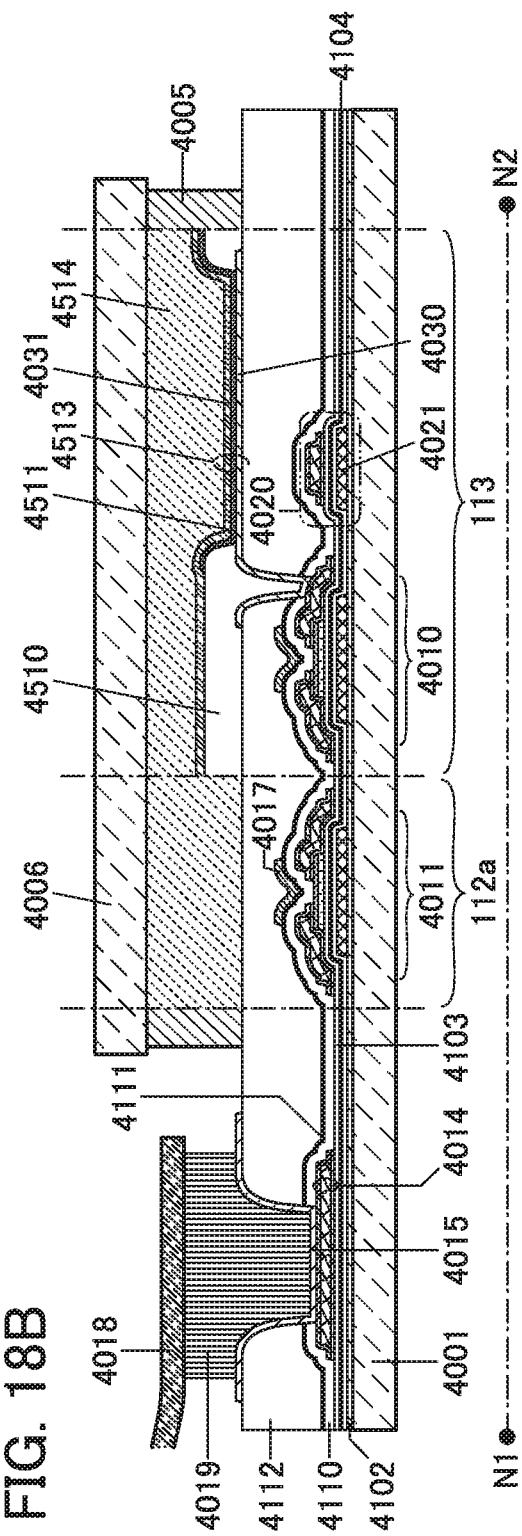

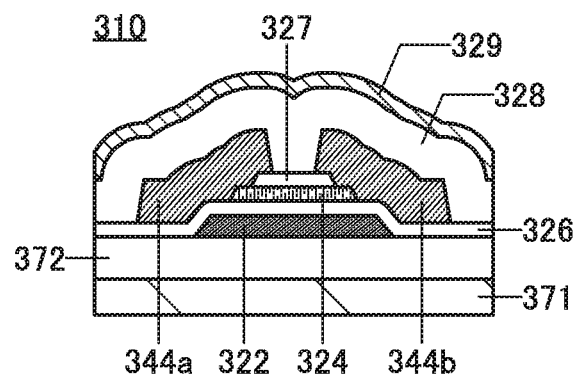
FIG. 19A1
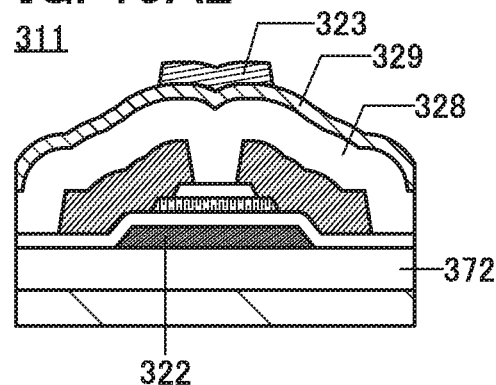
FIG. 19A2
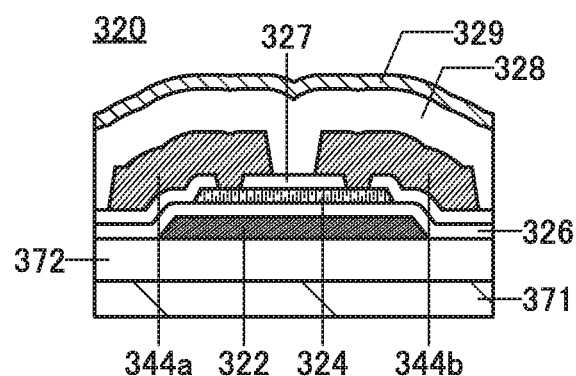
FIG. 19B1
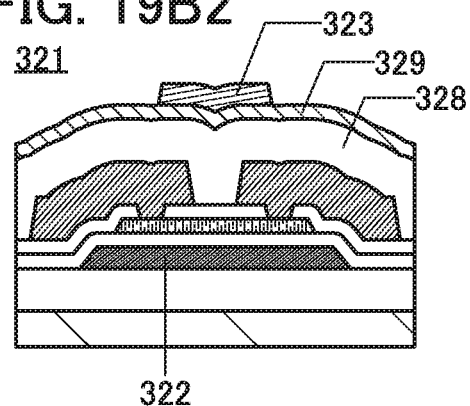
FIG. 19B2
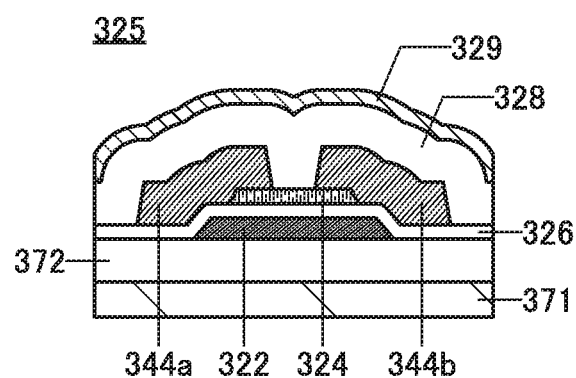
FIG. 19C1
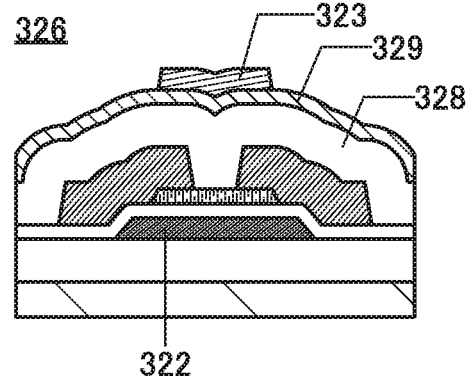
FIG. 19C2

FIG. 20A1
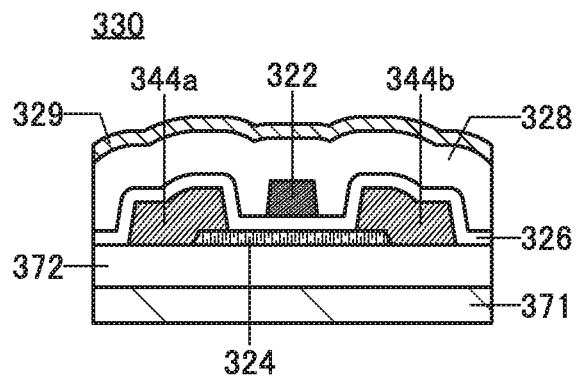
FIG. 20A2
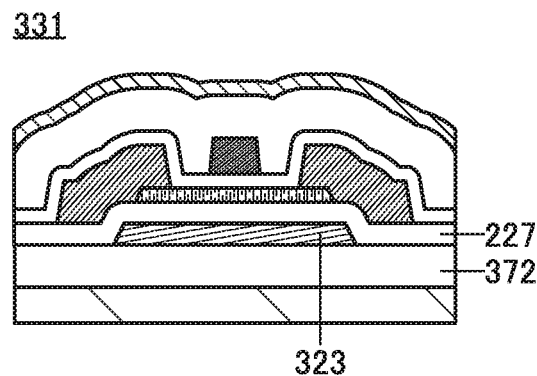
FIG. 20A3
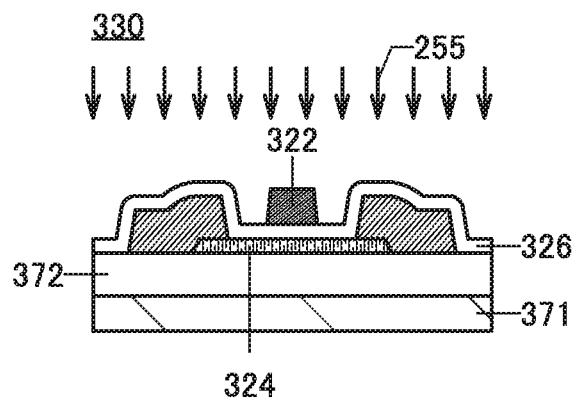
FIG. 20B1
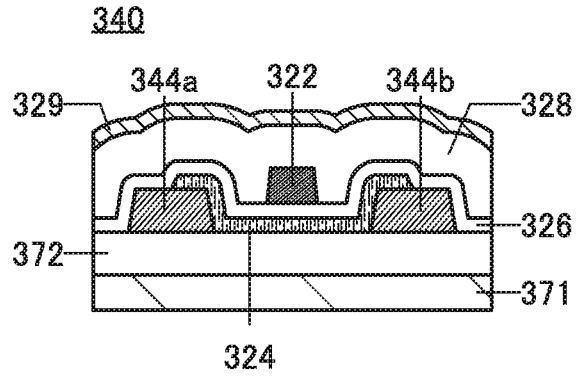
FIG. 20B2
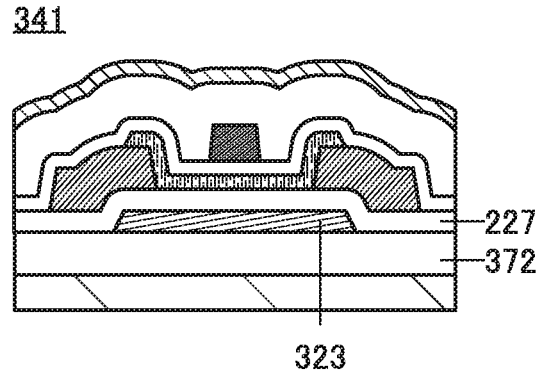

FIG. 21A1
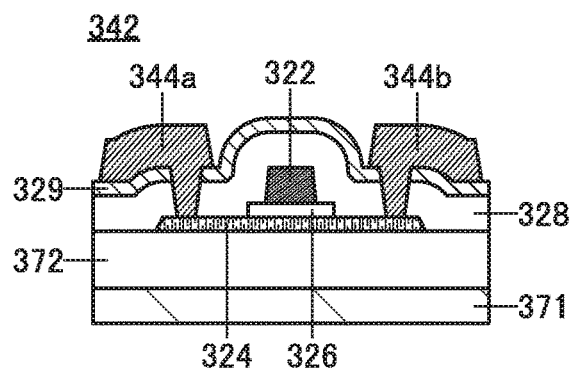
FIG. 21A2
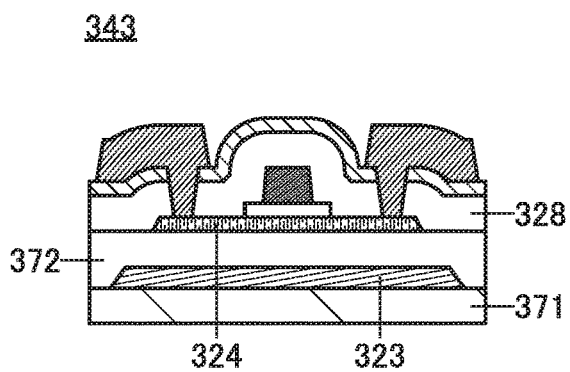
FIG. 21A3
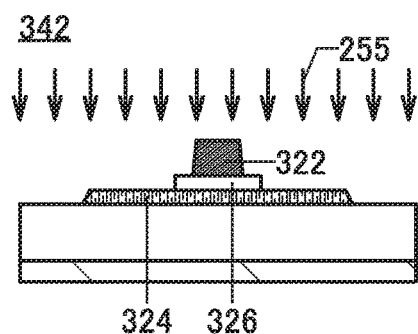
FIG. 21B1
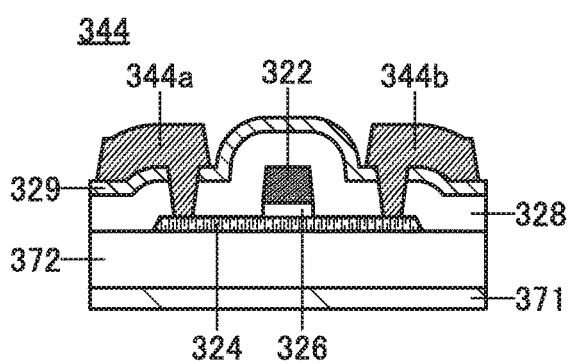
FIG. 21B2
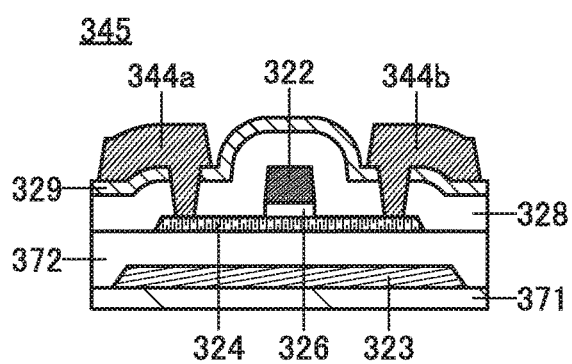
FIG. 21C1
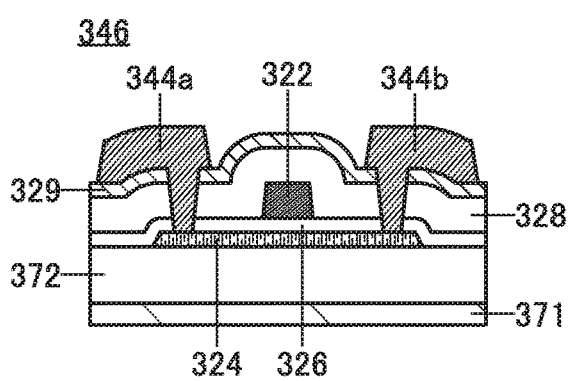
FIG. 21C2
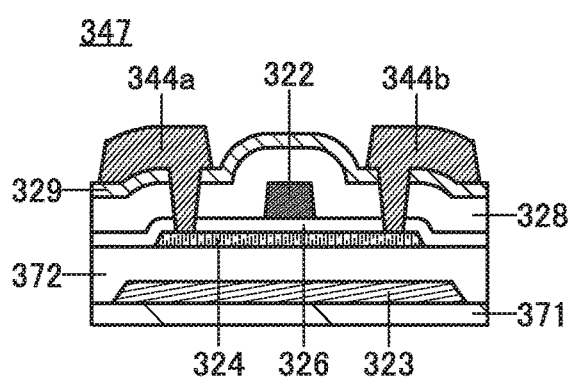

FIG. 22A
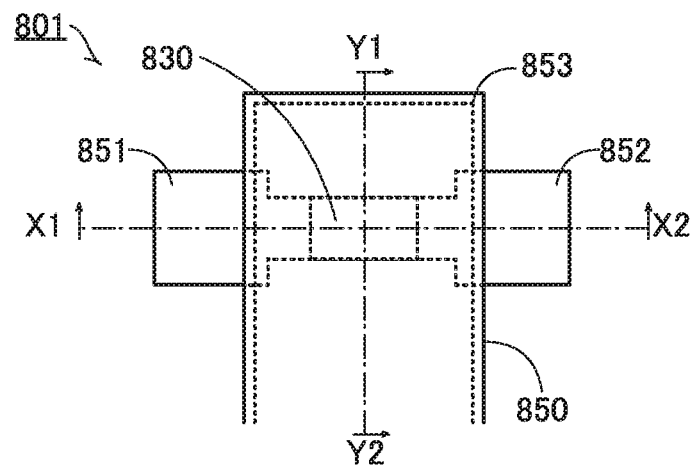
FIG. 22B
FIG. 22C
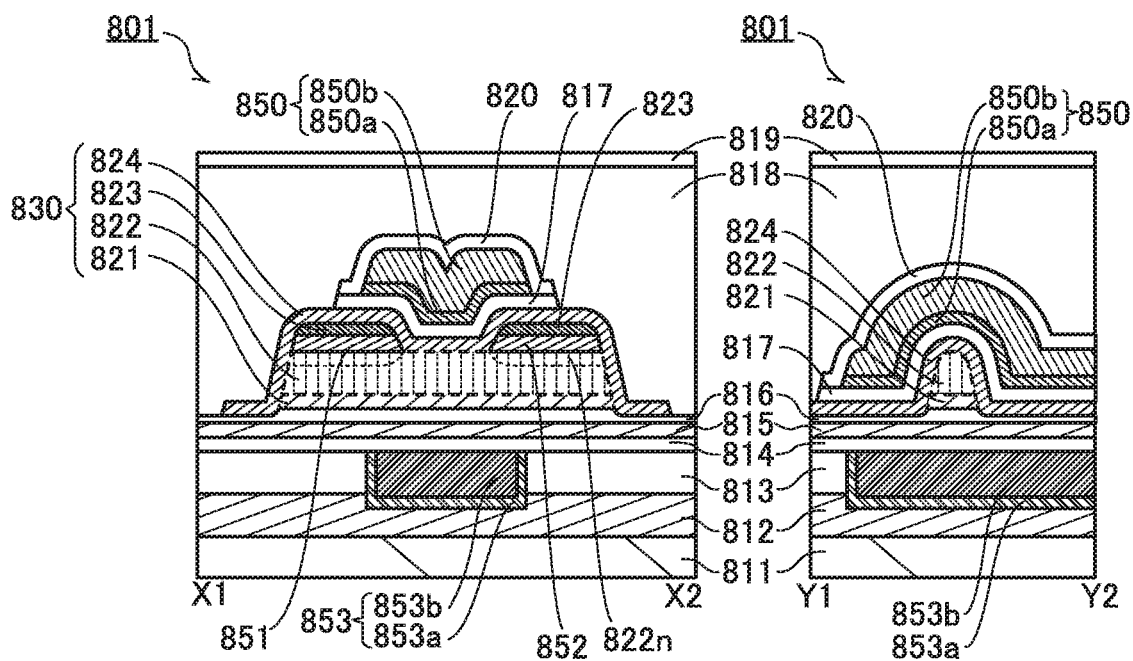

IMAGE PROCESSING METHOD

TECHNICAL FIELD

One embodiment of the present invention relates to a display device and an image processing method.

Note that one embodiment of the present invention is not limited to the above technical field. One embodiment of the invention disclosed in this specification and the like relates to an object, a method, or a manufacturing method. Alternatively, one embodiment of the invention disclosed in this specification and the like relates to a process, a machine, manufacture, or a composition of matter.

More specifically, examples of the technical field of one embodiment of the present invention disclosed in this specification and the like include a display device (a liquid crystal display device, a light-emitting display device, or the like), a projection device, a lighting device, an electro-optical device, a power storage device, a memory device, a semiconductor circuit, an imaging device, an electronic device, a method for driving them, and a method for manufacturing them. In addition, a semiconductor device, a display device, a liquid crystal display device, a light-emitting device, a lighting device, a power storage device, a memory device, an imaging device, a method for driving them, and a method for manufacturing them can be given as examples.

Note that in this specification and the like, a semiconductor device refers to all devices that can function by utilizing semiconductor characteristics. A transistor and a semiconductor circuit are embodiments of semiconductor devices. A display device, a projection device, a lighting device, an electro-optical device, a power storage device, a memory device, a semiconductor circuit, an imaging device, an electronic device, and the like can be regarded as a semiconductor device, in some cases. Alternatively, it can be regarded that they include a semiconductor device, in some cases.

BACKGROUND ART

In recent years, display devices tend to be large, for example, the screen size is 30 inches diagonal or more, and development taking a screen size of 60 inches diagonal or more or 120 inches diagonal or more into consideration has been progressed. In addition, a demand for viewing high-resolution images has been increased. Accordingly, an improvement in resolution of display devices (an increase in the number of pixels) is required. There is a trend in required resolution of display devices toward high definition, for example, full high definition (the number of pixels: 1920× 1080; also referred to as "2K", for example), ultra high definition (the number of pixels: 3840×2160; also referred to as "4K", for example), and super high definition (the number of pixels: 7680×4320; also referred to as "8K", for example).

In Japan, 4K practical broadcasting utilizing communication satellite (CS), cable television, and the like started in 2015, and 4K and 8K test broadcasting utilizing broadcast satellite (BS) started in 2016. In the future, 8K practical broadcasting is planned to start. Therefore, various electronic devices compatible with 8K broadcasting are being developed (Non-Patent Document 1). In 8K practical broadcasting, there are plans to employ 4K broadcasting and 2K broadcasting (full high definition broadcasting) together. A person who sees an image in 8K broadcasting is expected to be able to feel a higher realistic sensation than a person who sees an image in 2K broadcasting, an image in 4K broadcasting, or the like.

Not only televisions but also various electronic devices that incorporate artificial intelligence utilizing artificial neural networks or the like are being developed. With the use of artificial neural networks, computers with higher performance than conventional von Neumann computers are expected to be achieved, and in recent years, various researches for building artificial neural networks in electronic circuits have been carried out.

REFERENCE

Non-Patent Document

[Non-Patent Document 1] S. Kawashima, et al., "13.3-In. 8K×4K 664-ppi OLED Display Using CAAC-OS FETs," SID 2014 DIGEST, pp. 627-630.

SUMMARY OF THE INVENTION

Problems to be Solved by the Invention

Wiring resistance and parasitic capacitance need to be reduced because of an increase in screen size or an increase in definition. Since high-resolution images such as 8K images have a large amount of data, the communication load when transmitting data from a broadcast station to a receiver is large. In order to reduce the communication load, a technology in which a low-resolution image is broadcast by a broadcast station and the resolution is increased on the receiver side which receives the broadcast is needed.

An object of one embodiment of the present invention is to provide an image processing method in which high-resolution image data is generated from low-resolution image data. Another object is to provide a display device with which an image with higher quality than the original quality of a video source can be viewed. Another object is to provide a display device with low power consumption. Another object is to provide a display device with high productivity. Another object is to provide a display device with high reliability. Another object is to provide a novel image processing method. Another object is to provide a novel display device. Another object is to provide a novel semiconductor device.

Note that the descriptions of these objects do not disturb the existence of other objects. One embodiment of the present invention does not need to achieve all the objects. Objects other than these will be apparent from the descriptions of the specification, the drawings, the claims, and the like, and objects other than these can be derived from the descriptions of the specification, the drawings, the claims, and the like.

Means for Solving the Problems

In a display device in which a video signal is individually supplied to a screen divided into two, the entire screen is subjected to up-conversion processing after being divided, and another up-conversion processing is performed for a boundary portion of the screen divided into two. The divided up-conversion processing for the entire screen and the up-conversion processing for the boundary portion are performed in parallel with the use of a plurality of arithmetic units. The divided up-conversion processing for the entire screen and the up-conversion processing for the boundary portion can be performed using different algorithms.

One embodiment of the present invention is an image processing method for generating image data to be displayed on a display device, characterized in that the display device includes a display unit including a plurality of pixels, a scan line driver circuit, a first signal line driver circuit, and a second signal line driver circuit; the display unit includes a first display region and second display region; the display unit includes a boundary region including a part of the first display region and a part of the second display region; the first signal line driver circuit has a function of supplying a signal to the first display region; and the second signal line driver circuit has a function of supplying a signal to the second display region, and the image processing method being characterized by including a first step of dividing first image data into n for generating n (n is an even number greater than or equal to 2) second image data, a second step of generating third image data corresponding to the boundary region, a third step of increasing resolution of each of the n second image data for generating n fourth image data, a fourth step of increasing resolution of the third image data for generating fifth image data, and a fifth step of generating sixth image data using the n fourth image data and the fifth image data.

The display device includes a plurality of arithmetic units, and the first step and the second step can be performed using different arithmetic units. Accordingly, the first step and the second step can be performed in parallel.

The third step is performed by an RAISR method, an ANR method, or an A+ method, or using a neural network. The fourth step may be performed using a neural network. Resolution of the fourth image data can be higher than resolution of the second image data.

The display device may be provided with n+1 or more arithmetic units so that the n fourth image data and the fifth image data may be generated using different arithmetic units. The pixel includes a transistor. Amorphous silicon or the like can be used for a semiconductor layer of the transistor.

Effect of the Invention

According to one embodiment of the present invention, an image processing method in which high-resolution image data is generated from low-resolution image data can be provided. Alternatively, a display device with which an image with higher quality than the original quality of a video source can be viewed can be provided. Alternatively, a display device with low power consumption can be provided. Alternatively, a display device with high productivity can be provided. Alternatively, a display device with high reliability can be provided. Alternatively, a novel image processing method can be provided. Alternatively, a novel display device can be provided. Alternatively, a novel semiconductor device can be provided.

Note that the descriptions of these effects do not disturb the existence of other effects. One embodiment of the present invention does not need to have all the effects. Effects other than these will be apparent from the descriptions of the specification, the drawings, the claims, and the like, and effects other than these can be derived from the descriptions of the specification, the drawings, the claims, and the like.

BRIEF DESCRIPTION OF THE DRAWINGS

FIG. 5 Diagrams illustrating an image processing method.
FIG. 6 Diagrams illustrating an image processing method.
FIG. 7 A diagram showing examples of an algorithm.
FIG. 18 Diagrams illustrating display devices.
FIG. 19 Diagrams illustrating structure examples of a transistor.
FIG. 20 Diagrams illustrating structure examples of a transistor.
FIG. 21 Diagrams illustrating structure examples of a transistor.
FIG. 22 Diagrams illustrating a structure example of a transistor.

MODE FOR CARRYING OUT THE INVENTION

Figure 1A:
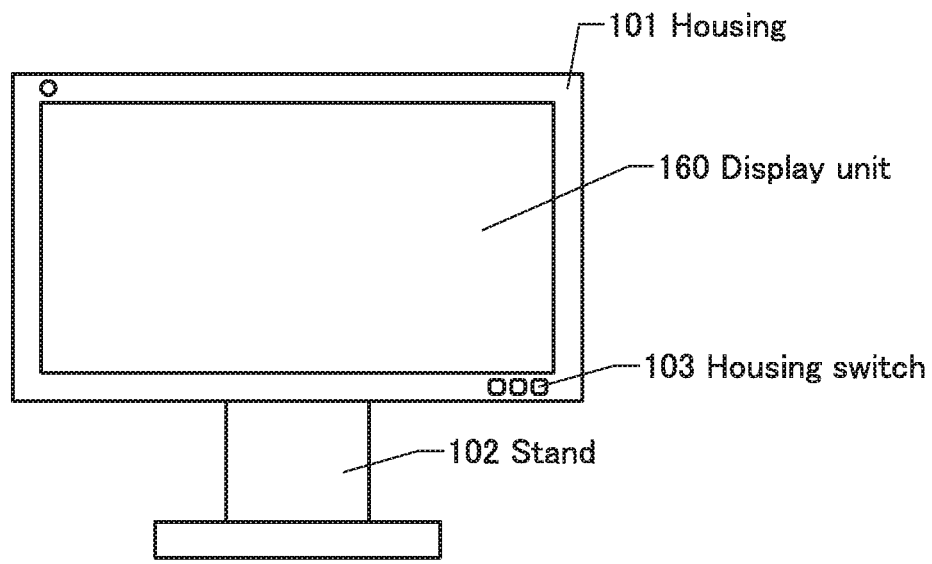
FIG. 1 Diagrams illustrating a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be interpreted as being limited to the description of embodiments below. Note that in the structures of the invention described below, the same portions or portions having similar functions are denoted by the same reference numerals in different drawings, and description thereof is not repeated in some cases.

Furthermore, the position, size, range, and the like of each component illustrated in the drawings and the like do not represent the actual position, size, range, and the like in some cases for easy understanding of the invention. Therefore, the disclosed invention is not necessarily limited to the position, size, range, and the like as disclosed in the drawings and the like. For example, in the actual manufacturing process, a layer, a resist mask, or the like might be unintentionally reduced in size by treatment such as etching, which might not be reflected in the drawings for easy understanding of the invention.

Some components might not be illustrated, especially in a top view (also referred to as a "plan view"), a perspective view, or the like, for easy understanding of the invention. In addition, the description of some hidden lines and the like might be omitted.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. An ordinal number used in this specification and the like and an ordinal number used in the scope of claims might be different from each other. Furthermore, even when a term is provided with an ordinal number in this specification and the like, the ordinal number might be omitted in the scope of claims and the like.

In this specification and the like, the term such as an "electrode" or a "wiring" does not limit a function of the component. For example, an "electrode" is used as part of a "wiring" in some cases, and vice versa. Furthermore, the term "electrode" or "wiring" can also mean the provision of a plurality of "electrodes" and "wirings" in an integrated manner.

Note that the terms "film" and "layer" can be interchanged with each other depending on the case or circumstances. For example, the term "conductive layer" can be changed into the term "conductive film" in some cases. For another example, the term "insulating film" can be changed into the term "insulating layer" in some cases.

Unless otherwise specified, in this specification and the like, a transistor is an element having at least three terminals including a gate (a gate terminal or a gate electrode), a source (a source terminal, a source region, or a source electrode), and a drain (a drain terminal, a drain region, or a drain electrode), or an element having at least four terminals including a back gate in addition to them (a back gate terminal or a back gate electrode). A channel formation region is included between the source and the drain, and current can flow between the source and the drain through the channel formation region. Note that in this specification and the like, a channel formation region refers to a region through which current mainly flows.

Unless otherwise specified, transistors described in this specification and the like are enhancement-type (normally-off-type) field-effect transistors. Furthermore, unless otherwise specified, transistors described in this specification and the like are n-channel transistors. Thus, unless otherwise specified, the threshold voltage (also referred to as "Vth") is higher than 0 V.

Note that the Vth of a transistor including a back gate in this specification and the like refers to a Vth obtained when the potential of the back gate is set equal to that of a source or a gate, unless otherwise specified.

Unless otherwise specified, off-state current in this specification and the like refers to a drain current (also referred to as "Id") of a transistor in an off state (also referred to as a non-conducting state or a cutoff state). Unless otherwise specified, the off state of an n-channel transistor refers to a state where the potential difference between its gate and source based on the source (also referred to as "gate voltage" or "Vg") is lower than the threshold voltage, and the off state of a p-channel transistor refers to a state where Vg is higher than the threshold voltage. For example, the off-state current of an n-channel transistor sometimes refers to a drain current at the time when Vg is lower than Vth.

In the above description of off-state current, a drain may be replaced with a source. That is, the off-state current sometimes refers to current that flows through a source of a transistor in an off state.

In this specification and the like, leakage current sometimes expresses the same meaning as off-state current. Furthermore, in this specification and the like, the off-state current sometimes refers to current that flows between a source and a drain of a transistor in an off state, for example.

In this specification and the like, a potential VDD refers to a power supply potential at a potential higher than a potential VSS. The potential VSS refers to a power supply potential at a potential lower than the potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

A "voltage" usually refers to a potential difference between a given potential and a reference potential (e.g., a ground potential (GND) or a source potential). A "potential" is a relative value, and a potential supplied to a wiring or the like changes depending on the reference potential in some cases. Therefore, the terms "voltage" and "potential" can be replaced with each other in some cases. Note that in this specification and the like, VSS is the reference voltage unless otherwise specified.

Note that the term "over" or "under" in this specification and the like does not necessarily mean directly over or directly under regarding the positional relationship between components, nor limit the positional relationship to direct contact. The expression "electrode B over insulating layer A" does not require the electrode B to be provided on and in direct contact with the insulating layer A, nor excludes the case where another component is provided between the insulating layer A and the electrode B.

In this specification and the like, the term "parallel" refers to a state where two straight lines are positioned at an angle therebetween being greater than or equal to −10° and less than or equal to 10°, unless otherwise specified. Thus, the case where the angle is greater than or equal to −5° and less than or equal to 5° is also included. The term "substantially parallel" refers to a state where two straight lines are positioned at an angle therebetween being greater than or equal to −30° and less than or equal to 30°, unless otherwise specified. Furthermore, the terms "perpendicular" and "orthogonal" refer to a state where two straight lines are positioned at an angle therebetween being greater than or equal to 80° and less than or equal to 100°, unless otherwise specified. Thus, the case where the angle is greater than or equal to 85° and less than or equal to 95° is also included. The term "substantially perpendicular" refers to a state where two straight lines are positioned at an angle therebetween being greater than or equal to 60° and less than or equal to 120°, unless otherwise specified Note that in this specification and the like, the terms "identical", "the same", "equal", "uniform", or the like (including synonyms thereof) used in describing calculation values and measurement values contain an error of ±20% unless otherwise specified.

In this specification and the like, an artificial neural network (ANN, hereinafter referred to as neural network) generally means a model that imitates a biological neural network. In general, a neural network has a structure in which units that imitate neurons are connected to each other through a unit that imitates a synapse.

The strength of connection between synapses (connection between neurons), (also referred to as a weight coefficient), can be changed when the neural network is provided with existing information. The processing for determining the connection strength by providing a neural network with existing information is called "learning" in some cases.

Furthermore, when a neural network in which "learning" is performed (connection strength is determined) is provided with any type of information, new information can be output on the basis of the connection strength. The processing for output of new information on the basis of information provided and the connection strength in a neural network is called "inference" or "recognition" in some cases.

Examples of a neural network model include a Hopfield type, a hierarchical neural type, and the like. In particular, a neural network with a multilayer structure is referred to as a "deep neural network" (DNN), and machine learning using the deep neural network is referred to as "deep learning". Note that in DNN, a full connected-neural network (FC-NN), a convolutional neural network (CNN), a recurrent neural network (RNN), and the like are included.

Note that in this specification and the like, a transistor using an oxide semiconductor, which is a kind of metal oxide, for a semiconductor layer where a channel is formed is also referred to as an "OS transistor". Furthermore, a transistor using silicon for a semiconductor layer where a channel is formed is also referred to as a "Si transistor".

Embodiment 1

First, a structure example of a display device (also referred to as an "image-receiving device") that can employ a driving method of one embodiment of the present invention is described with reference to drawings.

<Structure Example of Display Device>

FIG. 1(A) is a diagram illustrating the front of a display device 100. The display device 100 includes a housing 101, a stand 102, a housing switch 103, and a display unit 160.

Figure 1B:
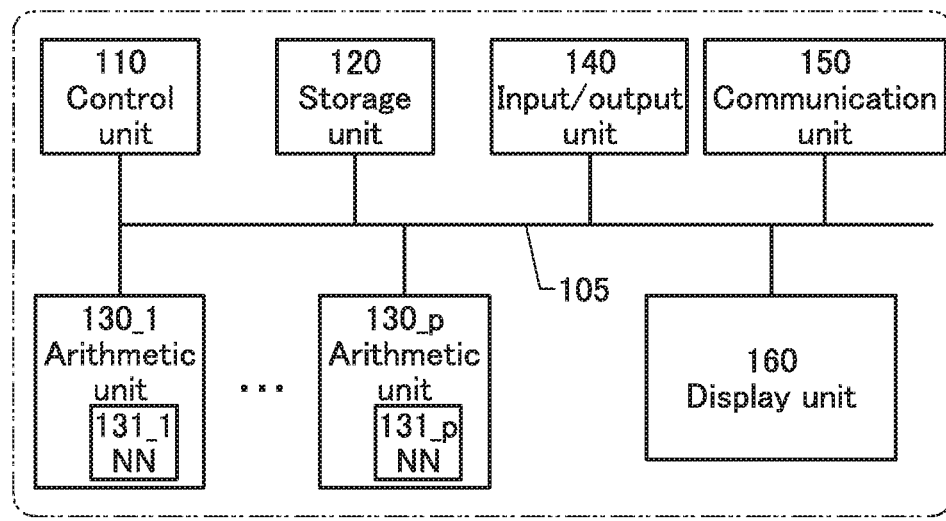

FIG. 1(B) is a block diagram illustrating a structure example of the display device 100. Note that FIG. 1(B) Illustrates the Block Diagram in which Components are Classified According to their functions and shown as independent blocks; however, it is difficult to separate actual components completely according to their functions, and it is possible for one component to relate to a plurality of functions or it is possible for one function to relate to a plurality of components.

The structure of the display device 100 illustrated in this embodiment is an example, and not all the components need to be included. It is acceptable as long as the display device 100 include necessary components among the components illustrated in FIGS. 1(A) and 1(B). A component other than the components illustrated in FIGS. 1(A) and 1(B) may be included.

The display device 100 includes a control unit 110, a storage unit 120, an arithmetic unit 130, an input/output unit 140, a communication unit 150, and the display unit 160. In addition, a touch sensor, a touch sensor control means, a battery, a battery controller, a power receiving means, an antenna, an imaging means, a vibration means, or the like may be included. The control unit 110, the storage unit 120, the arithmetic unit 130, the input/output unit 140, the communication unit 150, and the display unit 160 are electrically connected to one another through a bus line 105.

<Control Unit 110>

The control unit 110 has a function of controlling the operation of the whole display device 100. The control unit 110 controls the operations of the storage unit 120, the arithmetic unit 130, the input/output unit 140, the communication unit 150, the display unit 160, and the like.

<Storage Unit 120>

As the storage unit 120, a memory device using a nonvolatile memory element, such as a flash memory, an MRAM (Magnetoresistive Random Access Memory), a PRAM (Phase change RAM), an ReRAM (Resistive RAM), or an FeRAM (Ferroelectric RAM); a memory device using a volatile memory element, such as a DRAM (Dynamic RAM) or an SRAM (Static RAM); or the like may be used, for example. Furthermore, a memory media drive such as a hard disk drive (HDD) or a solid state drive (SSD) may be used, for example.

A memory device which can be connected and disconnected through the input/output unit 140 with a connector, such as an HDD or an SSD, or a media drive for a recording medium such as a flash memory, a Blu-ray disc, or a DVD can be used as the storage unit 120. Note that the storage unit 120 is not incorporated in the display device 100, and a memory device located outside the display device 100 may be used as the storage unit 120. In that case, the storage unit 120 is connected to the display device 100 through the input/output unit 140. Alternatively, a structure may be employed in which data transmission and reception are wirelessly performed through the communication unit 150.

A plurality of algorithms for performing up-conversion (also referred to as "super-resolution"), a weight coefficient for each algorithm, and the like are stored in the storage unit 120. In addition, a video source to be displayed on the display unit 160 is stored.

<Arithmetic Unit 130>

The arithmetic unit 130 has a function of executing an arithmetic operation associated with the operation of the whole display device 100, and a central processing unit (CPU) or the like can be used, for example.

A CPU and other microprocessors such as a DSP (Digital Signal Processor) and a GPU (Graphics Processing Unit) can be used alone or in combination as the arithmetic unit 130. A structure may be employed in which such a microprocessor is obtained with a PLD (Programmable Logic Device) such as an FPGA (Field Programmable Gate Array) or an FPAA (Field Programmable Analog Array).

The display device 100 includes p arithmetic units 130 (p is an integer greater than or equal to 1). In this specification and the like, the first arithmetic unit 130 is referred to as an "arithmetic unit 130_1" and the p-th arithmetic unit 130 is referred to as an "arithmetic unit 130_p".

The arithmetic unit 130 includes a neural network (NN) 131. The neural network 131 may be formed using software. In this this specification and the like, a neural network 131 included in the arithmetic unit 130_1 is referred to as a "neural network 131_1" and a neural network 131 included in the arithmetic unit 130_p is referred to as a "neural network 131_p".

The arithmetic unit 130 interprets and executes instructions from various programs with the use of a processor to process various kinds of data and control programs. Programs that might be executed by the processor may be stored in a memory region of the processor or may be stored in the storage unit 120.

The arithmetic unit 130 may include a main memory. The main memory can have a structure in which a volatile memory such as a RAM (Random Access Memory) or a nonvolatile memory such as a ROM (Read Only Memory) is provided.

For example, a DRAM (Dynamic Random Access Memory) is used for the RAM provided in the main memory, in which case a memory space as a workspace for the arithmetic unit 130 is virtually allocated and used. An operating system, an application program, a program module, program data, and the like which are stored in the storage unit 120 are loaded into the RAM to be executed.

The data, program, and program module which are loaded into the RAM are directly accessed and operated by the arithmetic unit 130.

Meanwhile, a BIOS (Basic Input/Output System), firmware, and the like for which rewriting is not needed can be stored in the ROM. As the ROM, a mask ROM, an OTPROM (One Time Programmable Read Only Memory), an EPROM (Erasable Programmable Read Only Memory), or the like can be used. As the EPROM, a UV-EPROM (Ultra-Violet Erasable Programmable Read Only Memory) which can erase stored data by ultraviolet irradiation, an EEPROM (Electrically Erasable Programmable Read Only Memory), a flash memory, and the like, can be given.

<Input/Output Unit 140>

Examples of the input/output unit 140 include one or more buttons or switches provided on the housing 101 (also referred to as the housing switches 103), an external port to which another input component can be connected, and the like. The input/output unit 140 is electrically connected to the arithmetic unit 130 through the bus line 105. As the housing switches 103, a switch associated with powering on/off, a button for adjusting luminance or contrast, and the like can be given.

The external port included in the input/output unit 140 can be connected to an external device such as a computer or a printer through a cable, for example. A USB terminal is a typical example. As the external port, a LAN (Local Area Network) connection terminal, a digital broadcasting receiving terminal, an AC adaptor connection terminal, or the like may be provided. Without limitation to wire communication, a structure may be employed in which a transceiver for optical communication using infrared rays, visible light, ultraviolet rays, or the like may be provided.

<Communication Unit 150>

The communication unit 150 controls a control signal for connecting the display device 100 to a computer network in response to an instruction from the control unit 110 and transmits the signal to the computer network, for example. The display device 100 may be provided with an antenna so that communication may be performed via the antenna.

The communication can be performed by the communication unit 150 in such a manner that the display device 100 is connected to a computer network such as the Internet that is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of using a plurality of different communication methods, a plurality of antennas may be provided depending on the communication methods.

The communication unit 150 is provided with a high frequency circuit (RF circuit), for example, to transmit and receive an RF signal. The high frequency circuit is a circuit for performing conversion between an electromagnetic signal and an electric signal in a frequency band that is set by national laws to perform wireless communication with another communication apparatus using the electromagnetic signal. As a practical frequency band, several tens of kilohertz to several tens of gigahertz are generally used. A structure can be employed in which the high frequency circuit includes a circuit portion compatible with a plurality of frequency bands and the circuit portion includes an amplifier, a mixer, a filter, a DSP, an RF transceiver, or the like.

In the case of performing wireless communication, it is possible to use, as a communication protocol or a communication technology, a communication standard such as LTE (Long Term Evolution), GSM (Global System for Mobile Communication: registered trademark), EDGE (Enhanced Data Rates for GSM Evolution), CDMA 2000 (Code Division Multiple Access 2000), or WCDMA (Wideband Code Division Multiple Access: registered trademark), or a communication standard developed by IEEE such as Wi-Fi (registered trademark), Bluetooth (registered trademark), or ZigBee (registered trademark). Alternatively, the third-generation mobile communication system (3G), the fourth-generation mobile communication system (4G), or the fifth-generation mobile communication system (5G) defined by the International Telecommunication Union (ITU) or the like can be used.

The communication unit 150 may have a function of connecting the display device 100 to a telephone line. In the case of making a phone call through a telephone line, the communication unit 150 controls a connection signal for connecting the display device 100 to the telephone line in response to an instruction from the control unit 110 and transmits the signal to the telephone line.

The communication unit 150 may include a tuner for generating a picture signal, which is to be output to the display unit 160, from received airwaves. The tuner can have a structure including, for example, a demodulation circuit, an A-D converter circuit (analog-digital converter circuit), a decoder circuit, and the like. The demodulation circuit has a function of demodulating an input signal. The A-D converter circuit has a function of converting the demodulated analog signal into a digital signal. The decoder circuit has a function of decoding video data contained in the digital signal and generating a picture signal.

A structure may be employed in which the decoder includes a dividing circuit and a plurality of processors. The dividing circuit has a function of dividing input video data spatiotemporally and outputting it to each of the processors. The plurality of processors decode the input video data and generate picture signals. Since the decoder employs a structure in which the plurality of processors perform parallel data processing, video data containing an enormous amount of information can be decoded. In particular, in the case of displaying an image with a resolution higher than the full high definition, the decoder circuit for decoding compressed data preferably includes a processor having extremely high-speed processing capability. The decoder circuit preferably has a structure including a plurality of processors capable of performing 4 or more, preferably 8 or more, further preferably 16 or more processings in parallel, for example. The decoder may include a circuit for separating a signal that is used for an image and contained in the input signal from other signals (e.g., text data, broadcast program data, and certification data).

As airwaves the communication unit 150 can receive, ground waves, waves transmitted from a satellite, and the like can be given. Furthermore, as airwaves that the communication unit 150 can receive, airwaves for analog broadcasting, digital broadcasting, image-and-sound broadcasting, sound broadcasting, and the like can be given. For example, airwaves transmitted in a certain frequency band in a UHF band (approximately 300 MHz to 3 GHz) or a VHF band (30 MHz to 300 MHz) can be received. With the use of a plurality of pieces of data received in a plurality of frequency bands, for example, the transfer rate can be increased and more information can thus be obtained. Accordingly, the display unit 160 can display an image with a resolution higher than the full high definition. For example, an image with a resolution of 4K, 8K, 16K, or higher can be displayed.

Alternatively, the tuner may be configured to generate a picture signal using broadcasting data transmitted with a data transmission technology via a computer network. In the case where the received signal is a digital signal, the tuner does not necessarily include the demodulation circuit and the A-D converter circuit.

The picture signal obtained in the communication unit 150 can be stored in the storage unit 120.

<Display Unit 160>

The display unit 160 is described with reference to FIG. 2. FIG. 2(A) and FIG. 2(B) are block diagrams for illustrating the structure of the display unit 160. The display unit 160 includes a display region 161, a driver circuit 167A, a driver circuit 167B, a driver circuit 168A, and a driver circuit 168B. Note that the driver circuit 167A, the driver circuit 167B, the driver circuit 168A, the driver circuit 168B, and the like are collectively referred to as a "peripheral driver circuit" or simply a "driver circuit", in some cases. Various circuits such as a shift register, a level shifter, an inverter, a latch, an analog switch, and a logic circuit can be used as the peripheral driver circuit.

The driver circuit 167A and the driver circuit 167B can function as, for example, scan line driver circuits. The driver circuit 168A and the driver circuit 168B can function as, for example, signal line driver circuits.

The display region 161 includes a plurality of pixels 165. For example, a plurality of pixels 165 arranged in a matrix of m rows and n columns (m and n are each an integer greater than or equal to 2) are included. The pixels 165 each include a display element. The display region 161 can employ various modes or include various display elements. Examples of display elements include an EL (electroluminescence) element (an organic EL element, an inorganic EL element, or an EL element containing organic and inorganic materials), an LED (e.g., a white LED, a red LED, a green LED, or a blue LED), a transistor (a transistor that emits light depending on current), an electron emitter, a liquid crystal element, electronic ink, an electrophoretic element, a GLV (grating light valve), a display element using MEMS (micro electro mechanical systems), a DMD (digital micromirror device), a DMS (digital micro shutter), MIRASOL (registered trademark), an IMOD (interferometric modulation) element, a MEMS shutter display element, an optical-interference-type MEMS display element, an electrowetting element, a piezoelectric ceramic display, a display element using a carbon nanotube, and the like, which are elements including a display medium whose contrast, luminance, reflectivity, transmittance, or the like is changed by an electrical or magnetic effect. Alternatively, quantum dots may be used as the display element.

Examples of display devices using EL elements as display elements include an EL display device. Examples of display devices using electron emitters as display elements include a field emission display (FED), a surface-conduction electron-emitter display (SED), and the like. Examples of display devices using quantum dots as display elements include a quantum dot display device and the like. Examples of display devices using liquid crystal elements in the display unit 160 include a liquid crystal display device (a transmissive liquid crystal display device, a transflective liquid crystal display device, a reflective liquid crystal display device, a direct-view liquid crystal display device, or a projection liquid crystal display device) and the like. Examples of display devices using electronic ink, Electronic Liquid Powder (registered trademark), or an electrophoretic element as display elements include electronic paper and the like. The display device may be a PDP (Plasma Display Panel). Alternatively, a display device using a micro LED may be used.

Note that in the case of achieving a transflective liquid crystal display device or a reflective liquid crystal display device, some or all of pixel electrodes function as reflective electrodes. For example, some or all of pixel electrodes contain aluminum, silver, or the like. Moreover, in such a case, a memory circuit such as an SRAM can be provided under the reflective electrodes. Thus, the power consumption can be further reduced.

Note that in the case where an LED is used as the display element, graphene or graphite may be provided under an electrode or a nitride semiconductor of the LED. Graphene or graphite may be a multilayer film in which a plurality of layers are stacked. Providing graphene or graphite as described above facilitates deposition of a nitride semiconductor, such as an n-type GaN semiconductor layer containing crystals, thereover. Furthermore, a p-type GaN semiconductor layer containing crystals or the like can be provided thereover to form the LED. Note that an AlN layer may be provided between graphene or graphite and the n-type GaN semiconductor layer containing crystals. The GaN semiconductor layer included in the LED chip may be formed by MOCVD. Note that when graphene is provided, the GaN semiconductor layer included in the LED can be deposited by a sputtering method.

The display unit 160 includes m wirings GL. Each of the m wirings GL extends in the row direction. Each of the m wirings GL is electrically connected to a plurality of pixels 165 arranged in the row direction in the display region 161.

Figure 2A:
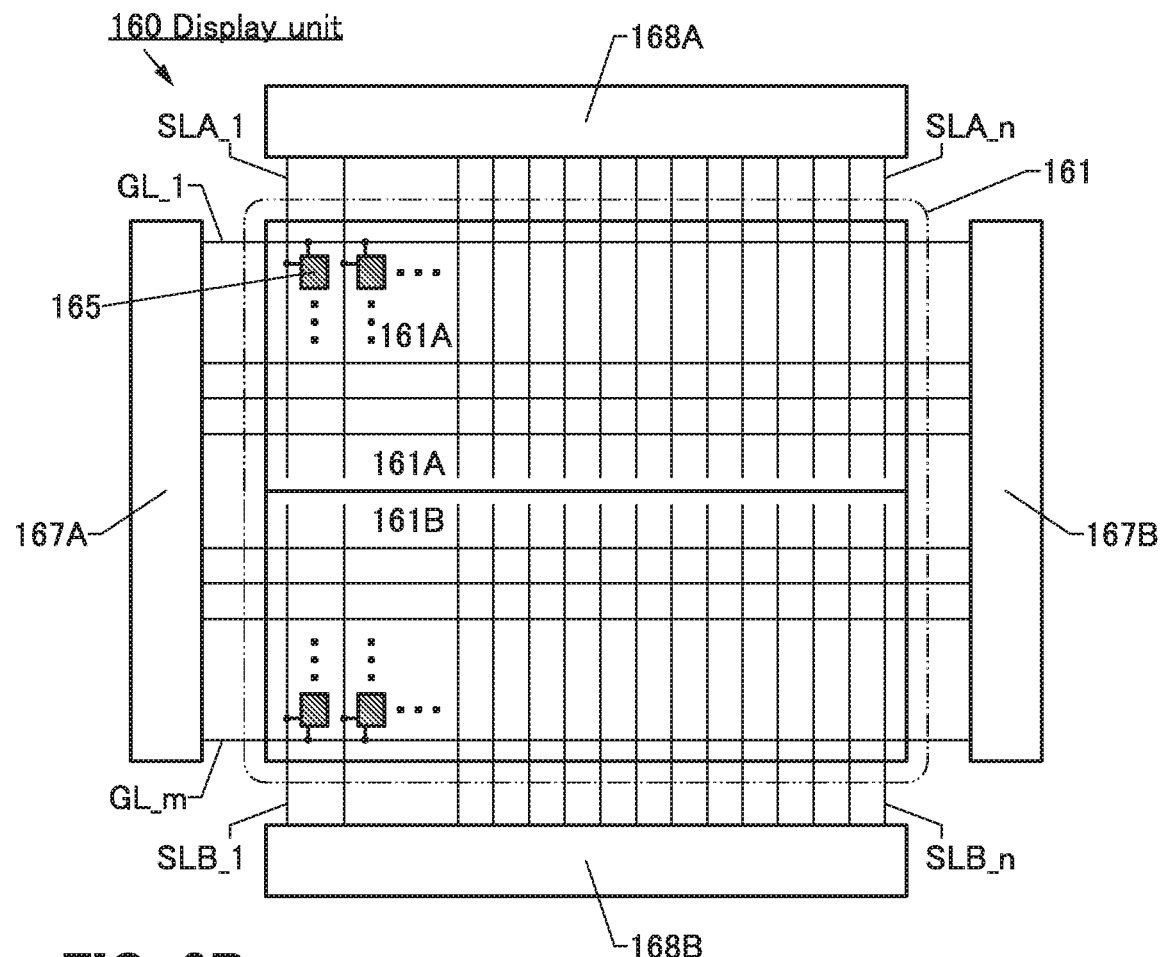
FIG. 2 Diagrams illustrating a display unit.
Figure 2B:
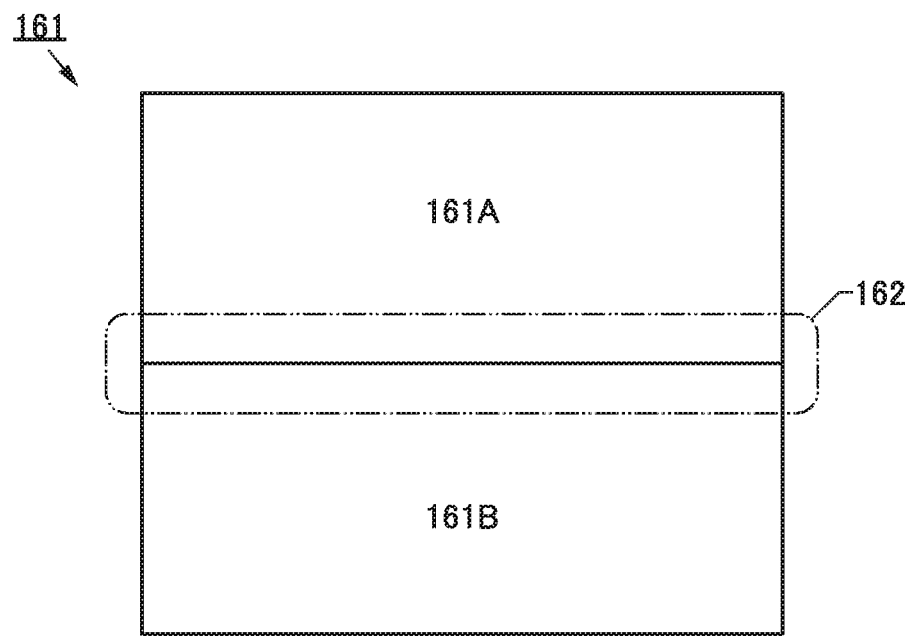

In FIG. 2(A), a wiring GL electrically connected to pixels 165 in the first row is referred to as a wiring GL_1. Furthermore, a wiring GL electrically connected to pixels 165 in the m-th row is referred to as a wiring GL_m. In the case of illustrating a wiring GL electrically connected to pixels 165 in the i-th row (i is a given integer greater than or equal to 1 and less than or equal to m), a wiring GL_i is used.

One end of the wiring GL is electrically connected to the driver circuit 167A and the other end of the wiring GL is electrically connected to the driver circuit 167B. Accordingly, the driver circuit 167A and the driver circuit 167B are provided to face each other with the display region 161 positioned therebetween. Note that the wiring GL is referred to as a "scan line" in some cases.

The driver circuit 167A and the driver circuit 167B have a function of supplying selection signals to the wiring GL_1 to the wiring GL_m in order. In other words, the driver circuit 167A and the driver circuit 167B have a function of scanning the wiring GL_1 to the wiring GL_m in order. After scanning of the wiring GL_m is finished, scanning is performed again in order from the wiring GL_1. The wiring GL has a function of transferring, to the pixels 165, selection signals supplied from the driver circuit 167A and the driver circuit 167B.

When selection signals are supplied from the driver circuit 167A and the driver circuit 167B to the same wiring GL at the same time, the capability of supplying selection signals to the wiring GL can be increased. Note that one of the driver circuit 167A and the driver circuit 167B may be omitted depending on the purpose, for example.

The display unit 160 illustrated in FIG. 2(A) has a display region 162 including a boundary between a display region 161A and a display region 161B and the vicinity thereof. The display region 162 includes some pixels included in the display region 161A and some pixels included in the display region 161B (see FIG. 2(B)).

The display unit 160 includes n wirings SLA and n wirings SLB. Note that in this specifications and the like, a "wiring SL" is merely stated in some cases when referring to both the wirings SLA and the wirings SLB or describing a matter common to the wirings SLA and the wirings SLB. Each of the n wirings SLA extends in the scanning direction (column direction) and is electrically connected to a plurality of pixels 165 arranged in the column direction in the display region 161A. Each of the n wirings SLB extends in the scanning direction (column direction) and is electrically connected to a plurality of pixels 165 arranged in the column direction in the display region 161B.

In FIG. 2(A), in the display region 161A, a wiring SLA electrically connected to pixels 165 in the first column is referred to as a wiring SLA_1. Furthermore, a wiring SLA electrically connected to pixels 165 in the n-th column is referred to as a wiring SLA_n. In the case of illustrating a wiring SLA electrically connected to pixels 165 in the j-th column (j is a given integer greater than or equal to 1 and less than or equal to n), a wiring SLA_j is used.

Furthermore, in the display region 161B, a wiring SLB electrically connected to pixels 165 in the first column is referred to as a wiring SLB_1. Furthermore, a wiring SLB electrically connected to pixels 165 in the n-th column is referred to as a wiring SLB_n. In the case of illustrating a wiring SLB electrically connected to pixels 165 in the j-th column (j is a given integer greater than or equal to 1 and less than or equal to n), a wiring SLB_j is used.

One end of the wiring SLA is electrically connected to the driver circuit 168A and one end of the wiring SLB is electrically connected to the driver circuit 168B. Accordingly, the driver circuit 168A and the driver circuit 168B are provided to face each other with the display region 161 positioned therebetween. Note that the wiring SL is referred to as a "signal line" in some cases.

The driver circuit 168A has a function of supplying an image signal to the wiring SLA. The wiring SLA has a function of transferring, to the pixels 165, the image signal supplied from the driver circuit 168A. The driver circuit 168B has a function of supplying an image signal to the wiring SLB. The wiring SLB has a function of transferring, to the pixels 165, the image signal supplied from the driver circuit 168B.

In the case where all of the pixels 165 provided in the j-th column in the display region 161 are connected by one wiring, signal delay and signal distortion are easily caused by the influence of wiring resistance and parasitic capacitance. Particularly in a display device with a screen size of 30 inches diagonal or more, a reduction in display quality is easily caused. Also in a display device with a resolution of 4K or more, a reduction in display quality is easily caused.

When a wiring connected to the pixels 165 provided in the j-th column is divided into halves like the wiring SLA and the wiring SLB as illustrated in FIG. 2(A), the wiring resistance and the parasitic capacitance can each be reduced to ½. Thus, the influence on the signal delay and signal distortion (the time constant) can be reduced to ¼. That is, the display quality of the display device can be improved.

The length of the wiring SLA_j included in the display region 161A is preferably equal to the length of the wiring SLB_j included in the display region 161B. In that case, the wiring resistance of the wiring SLA_j can be equal to the wiring resistance of the wiring SLB_j. Accordingly, the sum of the wiring resistances of then wirings SLA included in the display region 161A can be equal to the sum of the wiring resistances of then wirings SLB included in the display region 161B.

The number of pixels 165 electrically connected to the wiring SLA_j is preferably equal to the number of pixels 165 electrically connected to the wiring SLB_j. In that case, the parasitic capacitance generated in the wiring SLA_j can be approximately equal to the parasitic capacitance generated in the wiring SLB_j. Accordingly, the sum of the parasitic capacitances of the n wirings SLA included in the display region 161A can be equal to the sum of the parasitic capacitances of the n wirings SLB included in the display region 161B.

Modification Example 1

Figure 3A:
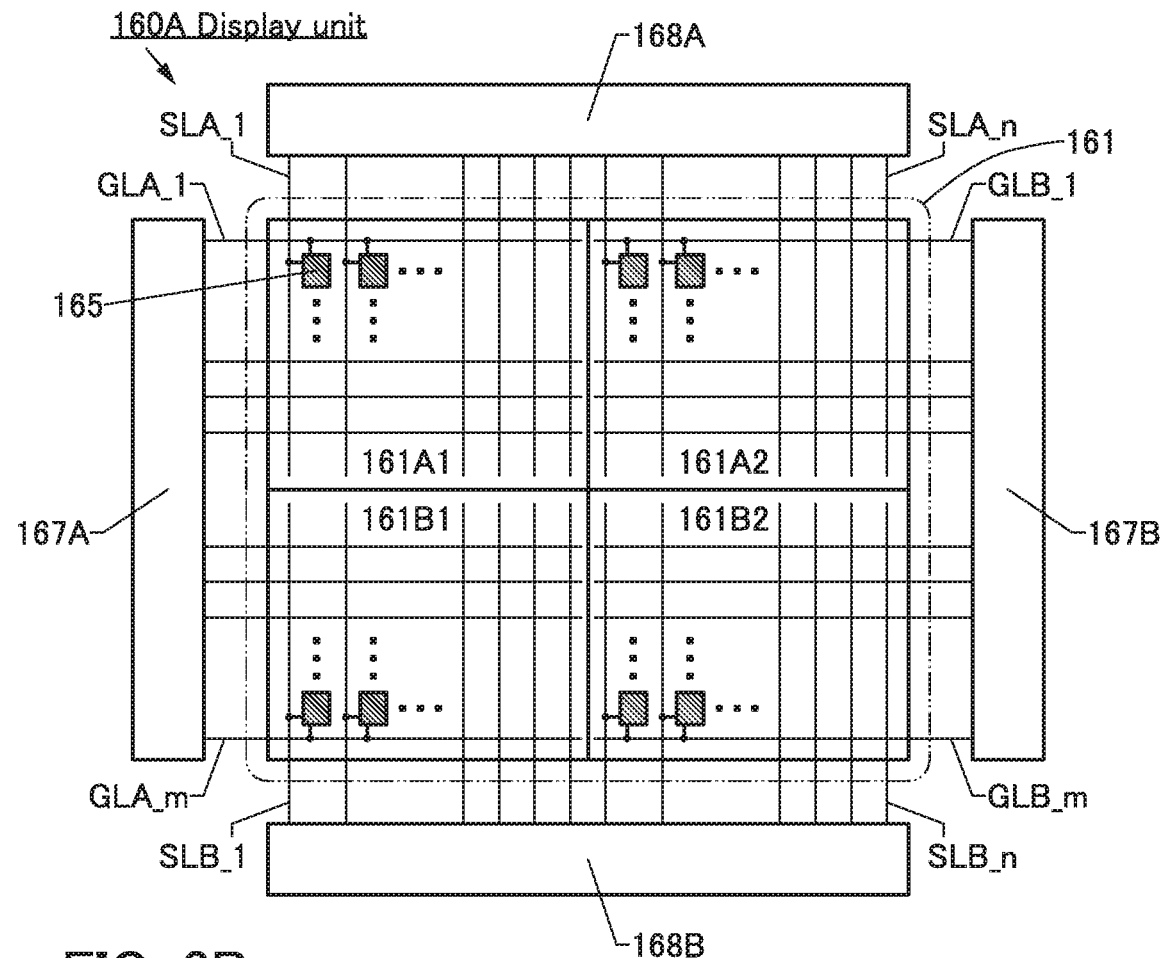
FIG. 3 Diagrams illustrating a display unit.
Figure 3B:
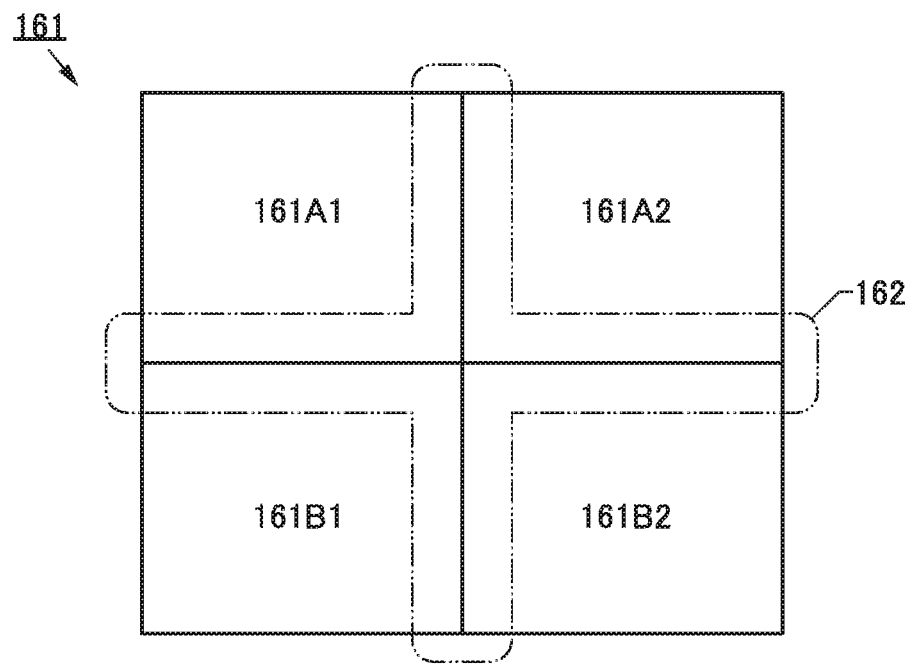

A display unit 160A, which is a modification example of the display unit 160, is illustrated in FIG. 3(A) and FIG. 3(B). As in the display unit 160A illustrated in FIG. 3(A) and FIG. 3(B), the display region 161 may be divided into four. The display unit 160A illustrated in FIG. 3(A) has a structure in which the display region 161 is divided into four regions: a display region 161A1, a display region 161A2, a display region 161B1, and a display region 161B2.

The display unit 160A includes m wirings GLA in total in the display region 161A1 and the display region 161B1. Some of the m wirings GLA are electrically connected to a plurality of pixels 165 arranged in the row direction in the display region 161A1. The others of the m wirings GLA are electrically connected to a plurality of pixels 165 arranged in the row direction in the display region 161B1. The m wirings GLA are electrically connected to the driver circuit 167A.

The display unit 160A includes m wirings GLB in total in the display region 161A2 and the display region 161B2. Some of the m wirings GLB are electrically connected to a plurality of pixels 165 arranged in the row direction in the display region 161A2. The others of the m wirings GLB are electrically connected to a plurality of pixels 165 arranged in the row direction in the display region 161B2. The m wirings GLB are electrically connected to the driver circuit 167B.

When the display unit 160A is driven while the wirings GL are divided into the wirings GLA and the wirings GLB, the wiring resistance and the parasitic capacitance of the wirings GL can be reduced. Accordingly, the loads on the driver circuit 167A and the driver circuit 167B can be reduced, and the display unit 160A can perform high-speed operation easily.

The display unit 160A illustrated in FIG. 3(A) has the display region 162 including a boundary between the display region 161A1 and the display region 161B1, a boundary between the display region 161A2 and the display region 161B2, a boundary between the display region 161A1 and the display region 161A2, a boundary between the display region 161B1 and the display region 161B2, and the vicinity of the boundaries (see FIG. 3(B)).

In the display unit 160A, the display region 162 includes some pixels included in the display region 161A1, some pixels included in the display region 161B1, some pixels included in the display region 161A2, and some pixels included in the display region 161B2.

Modification Example 2

Figure 4A:
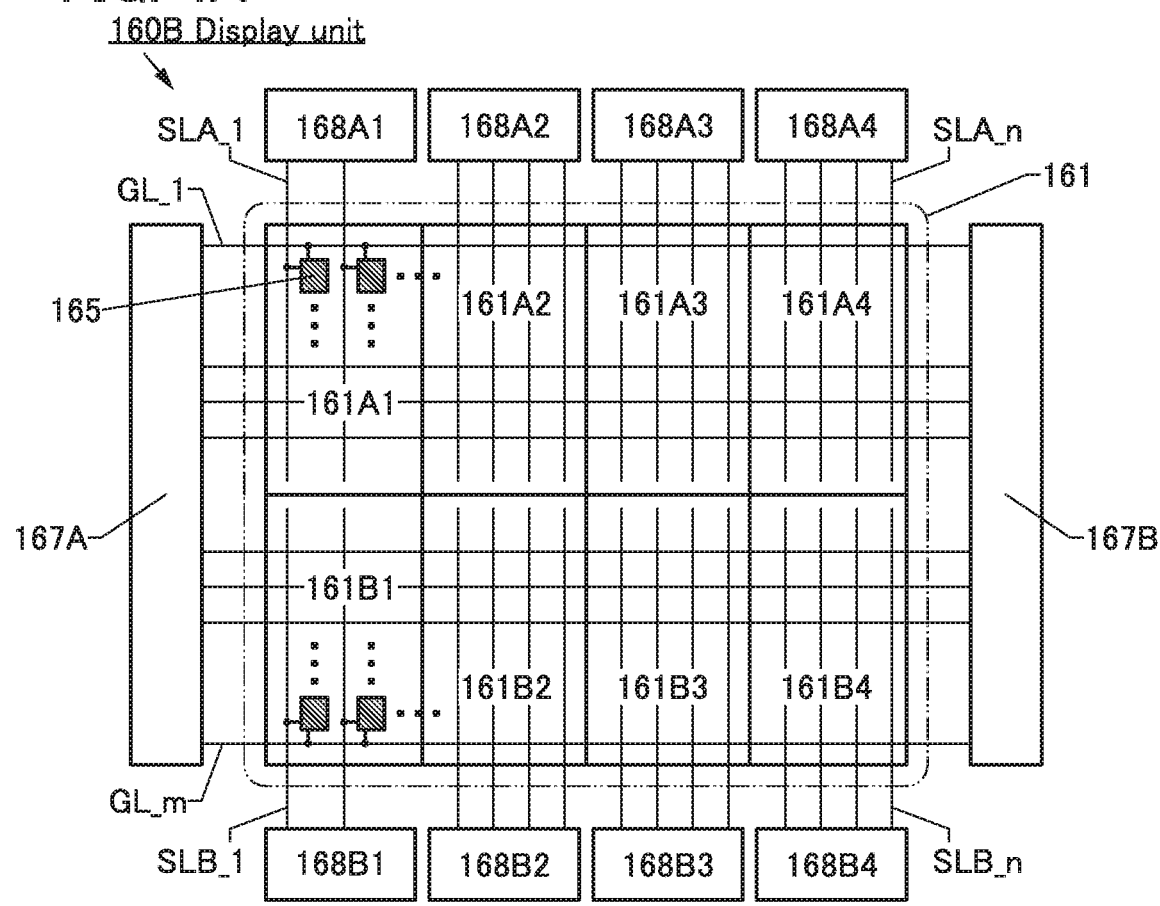
FIG. 4 Diagrams illustrating a display unit.
Figure 4B:
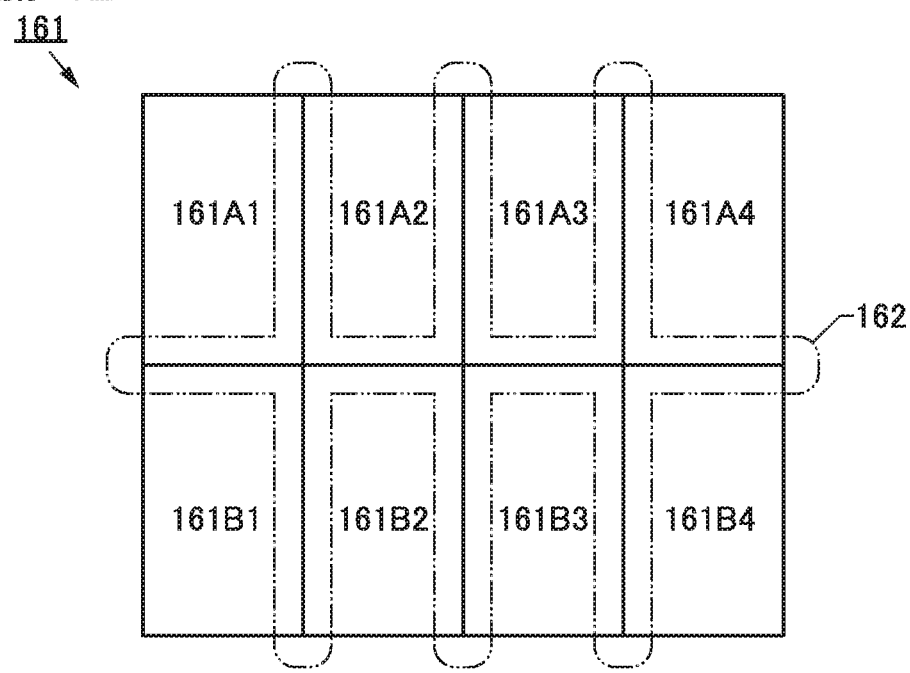

A display unit 160B, which is a modification example of the display unit 160, is illustrated in FIG. 4(A) and FIG. 4(B). The display unit 160B includes a driver circuit 168A1, a driver circuit 168A2, a driver circuit 168A3, and a driver circuit 168A4 as the driver circuit 168A. Furthermore, the display unit 160B includes a driver circuit 168B1, a driver circuit 168B2, a driver circuit 168B3, and a driver circuit 168B4 as the driver circuit 168B. When the driver circuit 168A and the driver circuit 168B are each divided into four and are operated concurrently, signal writing time to the pixels 165 can be quadruple.

In the display unit 160B, the display region 161 can be divided into eight regions: the display region 161A1, the display region 161A2, a display region 161A3, a display region 161A4, the display region 161B1, the display region 161B2, a display region 161B3, and a display region 161B4.

The display unit 160B includes n wirings SLA in total in the display region 161A1 to the display region 161A4. The n wirings SLA are separated into wirings SLA electrically connected to a plurality of pixels 165 arranged in the column direction in the display region 161A1, wirings SLA electrically connected to a plurality of pixels 165 arranged in the column direction in the display region 161A2, wirings SLA electrically connected to a plurality of pixels 165 arranged in the column direction in the display region 161A3, and wirings SLA electrically connected to a plurality of pixels 165 arranged in the column direction in the display region 161A4.

The display unit 160B includes n wirings SLB in total in the display region 161B1 to the display region 161B4. Then wirings SLB are separated into wirings SLB electrically connected to a plurality of pixels 165 arranged in the column direction in the display region 161B1, wirings SLB electrically connected to a plurality of pixels 165 arranged in the column direction in the display region 161B2, wirings SLB electrically connected to a plurality of pixels 165 arranged in the column direction in the display region 161B3, and wirings SLB electrically connected to a plurality of pixels 165 arranged in the column direction in the display region 161B4.

The display unit 160B illustrated in FIG. 4(A) has the display region 162 including a boundary between the display region 161A1 and the display region 161B1, a boundary between the display region 161A2 and the display region 161B2, a boundary between the display region 161A3 and the display region 161B3, a boundary between the display region 161A4 and the display region 161B4, a boundary between the display region 161A1 and the display region 161A2, a boundary between the display region 161A2 and the display region 161A3, a boundary between the display region 161A3 and the display region 161A4, a boundary between the display region 161B1 and the display region 161B2, a boundary between the display region 161B2 and the display region 161B3, a boundary between the display region 161B3 and the display region 161B4, and the vicinity of the boundaries (see FIG. 4(B)).

In the display unit 160B, the display region 162 includes some pixels included in the display region 161A1, some pixels included in the display region 161A2, some pixels included in the display region 161A3, some pixels included in the display region 161A4, some pixels included in the display region 161B1, some pixels included in the display region 161B2, some pixels included in the display region 161B3, and some pixels included in the display region 161B4.

<Example of Image Processing Method>

Figure 8:
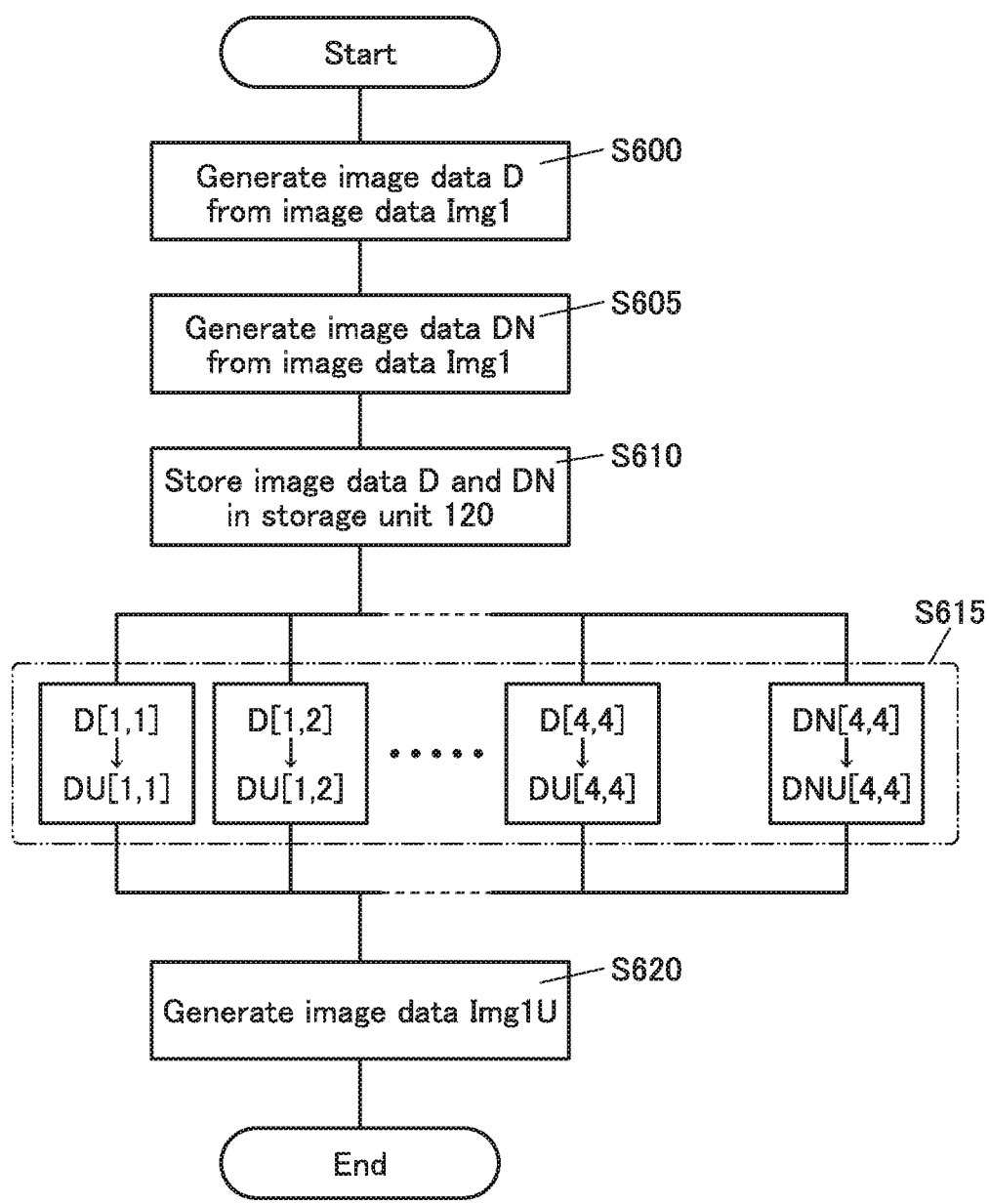
FIG. 8 A flow chart of an operation example.

Next, an example of an image processing method of one embodiment of the present invention is described. FIG. 8 is a flow chart showing the image processing method of one embodiment of the present invention. In this embodiment, the image processing method of one embodiment of the present invention is described regarding the case where the display device 100 includes the display unit 160.

Image data Img1 illustrated in FIG. 5(A) is image data before the resolution is increased. In this embodiment, the resolution of the image data Img1 is 1920×1080 (2K). Note that a numeric value representing the number of pixels is denoted by "dt" in drawings.

<Step S600>

The image data Img1 is divided into a plurality of pieces of image data D by the arithmetic unit 130. FIG. 5(B) illustrates the case where the image data Img1 is divided into a matrix of 4×4. Thus, in this embodiment, the resolution of one image data D is 480×270. In FIG. 5(B), image data D in the first row and the third column is represented by image data D[1, 3] and image data D in the fourth row and the second column is represented by image data D[4, 2].

<Step S605>

Furthermore, image data DN corresponding to the display region 162 is generated from the image data Img1 (see FIGS. 5(C) and 5(D)).

In other words, in the image data Img1, image data corresponding to the display region 161A of the display unit 160 is divided into four: image data D[1, 1] to image data D[2, 4]. In addition, in the image data Img1, image data corresponding to the display region 161B of the display unit 160 is divided into eight: image data D[3, 1] to image data D[4, 4].

The image data DN includes part of each of the image data D[2, 1], the image data D[2, 2], the image data D[2, 3], the image data D[2, 4], the image data D[3, 1], the image data D[3, 2], the image data D[3, 3], and the image data D[3, 4] (see FIG. 5(E)). Specifically, it is acceptable as long as the image data DN includes $\frac{1}{10}$ or more and $\frac{1}{4}$ or less, preferably $\frac{1}{10}$ or more and $\frac{1}{2}$ or less of each image data D. In this embodiment, the image data DN includes $\frac{1}{10}$ of each image data D. Thus, the resolution of the image data DN is 1920×54 in this embodiment (see FIG. 5(D)).

Note that Step S600 and Step S605 may be performed in parallel using different arithmetic units 130.

<Step S610>

The generated image data D and image data DN are stored in the storage unit 120.

<Step S615>

Next, the image data D and the image data DN are each subjected to up-conversion processing, so that image data DU and image data DNU are generated. The arithmetic unit 130 performs the up-conversion processing by reading image data stored in the storage unit 120. Since the up-conversion processings of eight image data D and the image data DN are performed in this embodiment, nine arithmetic units 130 (the arithmetic unit 130_1 to the arithmetic unit 130_9) are used so that the up-conversion processings are performed concurrently.

Performing the up-conversion processings of the image data D and the image data DN by their respective arithmetic units 130 independently enables parallel processing. Parallel processing allows the up-conversion processings to be performed in a short time. When the divided number of the image data Img1 and the total number of the arithmetic units 130 are increased, the time it takes for the up-conversion processings can be further reduced.

In this embodiment, the image data DU that is obtained by up-conversion of the resolution of the image data D from 480×270 to 1920×1080 is generated (see FIGS. 6(A1) and 6(A2)). In addition, the image data DNU that is obtained by up-conversion of the resolution of the image data DN from 1920×54 to 7680×216 is generated (see FIGS. 6(B1) and 6(B2)).

An algorithm, a weight coefficient, and the like installed in the arithmetic unit 130 for the up-conversion are read from the storage unit 120 and stored in the arithmetic unit 130. Note that the algorithm, the weight coefficient, and the like may be stored in a memory region in the arithmetic unit 130 in advance.

A weight coefficient determined by an external device may be used as the algorithm, the weight coefficient, and the like. For example, the display device 100 and an external device are connected to each other via the input/output unit 140 or the communication unit 150, and an algorithm, a weight coefficient, and the like determined by the external device are stored in the arithmetic unit 130.

The weight coefficient determined after learning by the external device is stored in the display device 100 before the factory shipment of the display device 100. The learning by the external device may be continued, and an updated weight coefficient or a new algorithm may be stored in the display device 100. A plurality of external devices may be used to generate a weight coefficient for updating. The weight coefficient can be transmitted and received via a recording medium, such as an SD card, various communication means, or the like. A new weight coefficient may be determined by using a weight coefficient in the display device 100 and a weight coefficient updated by the external device. The use of a new algorithm or a weight coefficient obtained by learning in the external device enables interpolation processing with higher accuracy.

[Algorithms Used for Up-Conversion Processing]

Here, an algorithm used for the up-conversion processing is described. FIG. 7 shows examples of the algorithm used for the up-conversion. In FIG. 7, the algorithms are classified into Groups A, B, and C. Algorithms for simple arithmetic up-conversion belong to Group A, algorithms for machine learning up-conversion belong to Group B, and algorithms for deep learning up-conversion using a neural network belong to Group C.

A Nearest neighbor method, a Bilinear method, and a Bicubic method are shown in FIG. 7 as Group A. An RAISR (Rapid and Accurate Image Super-Resolution) method, an ANR (Anchored Neighborhood Regression) method, and an A+ method are shown as Group B. An SRCNN (Super-Resolution Convolutional Neural Network) method is shown as Group C.

The image quality after up-conversion is the lowest in a Nearest neighbor method and the highest in an SRCNN method. FIG. 7 shows the orders of the processing speeds and the image qualities obtained using the algorithms in the case where the image quality obtained by a Nearest neighbor method is the "lowest" and the image quality obtained by an SRCNN method is the "highest". In general algorithms, the processing speed becomes lower as the image quality after up-conversion becomes higher. In particular, in an up-conversion method using a multilayered neural network, like an SRCNN method, an image with a high quality can be obtained but the processing time becomes longer.

An algorithm that belongs to Group B or C is preferably used for the up-conversion processings of the image data D and the image data DN. For example, in the case where a large number of pixels are included in the image data D (or the resolution is high), an algorithm with high processing speed may be used. In the case where a small number of pixels are included in the image data D (or the resolution is low), an algorithm with which the processing speed is low but the image quality after up-conversion is high can be used.

An algorithm to be used may be selected depending on a type of image scene displayed as the image data Img1. An algorithm to be used may be switched between the case where an image to be displayed is relatively close to a still image such as a landscape and the case of a fast-moving image such as sports, for example.

Meanwhile, since a boundary portion between the display region 161A and the display region 161B is noticeable, an algorithm with which the image quality after up-conversion is high is preferably used for the up-conversion processing of the image data DN. It is particularly preferable to use an algorithm that belongs to Group C for the up-conversion processing of the image data DN. The up-conversion processing of the image data D and the up-conversion processing of the image data DN may be performed using the same algorithm. Note that an algorithm with which the image quality after up-conversion is high in the case of the up-conversion processing of the image data DN as compared with the case of the up-conversion processing of the image data D is preferably used.

In the case of taking time to perform the up-conversion processing of the image data DN, the image data DN may be divided into a plurality of pieces and up-conversion processings may be performed using different arithmetic units 130.

The up-conversion processings of the plurality of pieces of image data D may be performed using different algorithms.

<Step S620>

Next, the image data DU and the image data DNU are combined, so that image data Img1U is generated (see FIG. 6(C)). The image data Img1U is generated using the arithmetic unit 130 which is different from the arithmetic unit 130 used for the up-conversion processing. Accordingly, the up-conversion processing and the generation of the image data Img1U can be performed in parallel. The generation of the image data Img1U and the up-conversion processing of the next image can be performed in parallel.

The generated image data Img1U is stored in the storage unit 120. In this manner, the image data Img1U can be generated by update processing of the image data Img1. The image processing method of one embodiment of the present invention can increase the resolution of image data and improve the display quality of the display device.

The image processing method of one embodiment of the present invention is effective particularly for up-conversion processing for generating an image with a resolution of 4K or more or 8K or more. It is also effective for a display device whose screen size is 30 inches diagonal or more or 60 inches diagonal or more.

Figure 9:
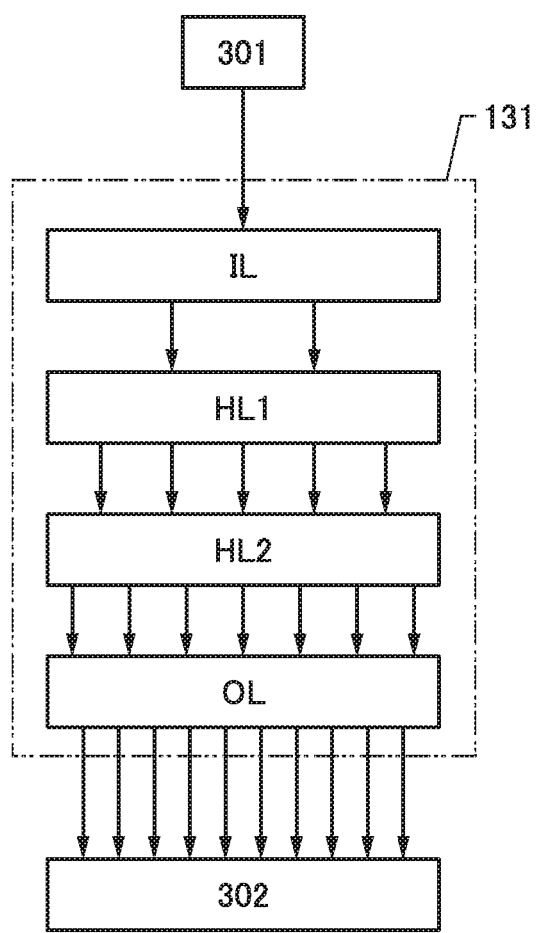
FIG. 9 A diagram illustrating a structure example of a neural network.

Here, a structure example of the neural network 131 is described (see FIG. 9). The neural network 131 includes an input layer IL, a middle layer HL1 (hidden layer), a middle layer HL2 (hidden layer), and an output layer OL. As the neural network 131, a hierarchical neural network is formed of the input layer IL, the middle layer HL1, the middle layer HL2, and the output layer OL. The middle layer HL1 and the middle layer HL2 include a given number of nodes. Note that the number of the middle layers is not limited to two. The number of the middle layers may be one or three or more.

Image data 301 (e.g., the image data DN) is input to the input layer IL and weighted data is input to the middle layer HL1. The data input to the middle layer HL1 is weighted and then input to the middle layer HL2. The data input to the middle layer HL2 is weighted and then input to the output layer OL. An image data 302 is output from the output layer OL.

The neural network 131 has a structure in which the number of neurons increases as the level of the hierarchy becomes deeper. That is, the number of neurons included in the middle layer HL1 is larger than the number of neurons included in the input layer IL, and the number of neurons included in the middle layer HL2 is larger than the number of neurons included in the middle layer HL1. Furthermore, the number of neurons included in the output layer OL is larger than the number of neurons included in the middle layer HL2. Note that the number of neurons are shown in FIG. 9 as the number of arrows connecting the levels. Since the neural network 131 has a structure in which the number of neurons increases as the level of the hierarchy becomes deeper, the image data 302 whose resolution is increased can be generated. In addition, the image data 302 in which not only the resolution but also the number of grayscale levels are increased can be generated from the image data 301.

In the hierarchical neural network, the layers can be fully connected or the layers can be partially connected. A structure using convolution layers or pooling layers between the layers, that is, a CNN, can be used.

Note that when the number of neurons is increased for the purpose of improving the processing capability, power consumption is increased. Since an OS transistor has an extremely low off-state current, a circuit using an OS transistor can have lower power consumption than a circuit using a Si transistor.

For example, when an OS transistor is used as a transistor included in the neural network 131, power consumption can be reduced to 1/10 or lower of that of the case of using a Si transistor. Accordingly, both a reduction in power consumption and an increase in the number of neurons can be achieved. In the case of consuming the same amount of power, the processing capability of the circuit using an OS transistor can be increased by ten times or more.

This embodiment can be implemented in an appropriate combination with the structures described in the other embodiments and the like.

Embodiment 2

In this embodiment, a structure example of a semiconductor device, which can be used in the neural network described in the above embodiment, will be described.

Figure 10A:
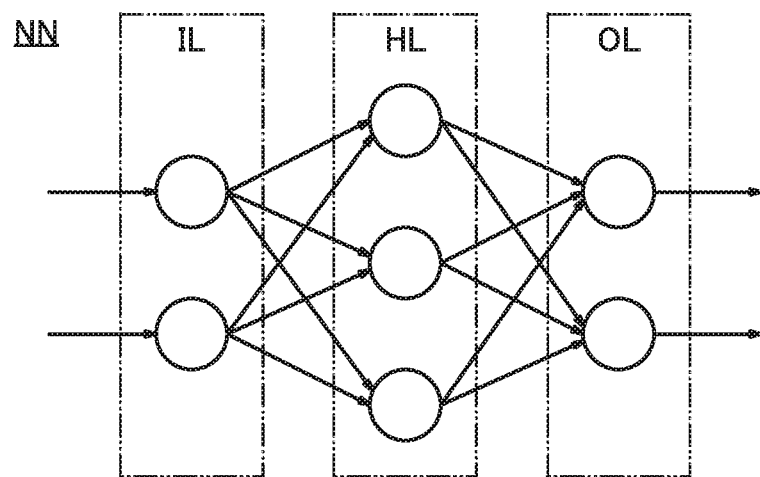
FIG. 10 Diagrams illustrating a structure example of a neural network.

As illustrated in FIG. 10(A), the neural network NN can be formed of the input layer IL, the output layer OL, and the middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as DNN (deep neural network), and learning using a deep neural network can also be referred to as deep learning.

Input data are input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 10B:
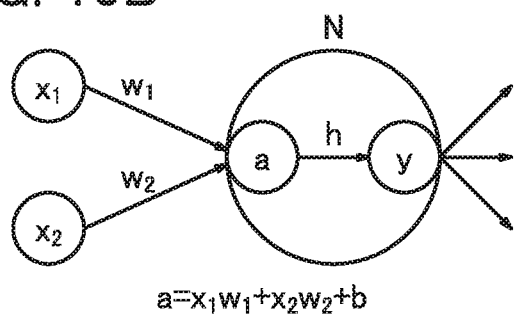

FIG. 10(B) illustrates an example of an operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result $(x_1w_1)$ of the output $x_1$ and a weight $w_1$ and a multiplication result $(x_2w_2)$ of the output $x_2$ and a weight $w_2$ is calculated, and then a bias b is added as necessary, so that a value $a=x_1w_1+x_2w_2+b$ is obtained. Then, the value a is converted with an activation function h, and an output signal $y=h(a)$ is output from the neuron N.

As described above, the operation with the neurons includes the product-sum operation, that is, the operation that sums the products of the outputs and the weights of the neurons in the previous layer ($x_1w_1+x_2w_2$ described above). This product-sum operation may be performed using a program on software or using hardware. In the case where the product-sum operation is performed using hardware, a product-sum operation circuit can be used. Either a digital circuit or an analog circuit may be used as this product-sum operation circuit. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit may be formed using a transistor including silicon (such as single crystal silicon) in a channel formation region (also referred to as a "Si transistor") or may be formed using a transistor including an oxide semiconductor, which is a kind of metal oxide, in a channel formation region (also referred to as an "OS transistor"). An OS transistor is particularly suitable for a transistor included in a memory of the product-sum operation circuit because of its extremely low off-state current. Note that the product-sum operation circuit may be formed using both a Si transistor and an OS transistor. A configuration example of a semiconductor device having a function of the product-sum operation circuit will be described below.

<Configuration Example of Semiconductor Device>

Figure 11:
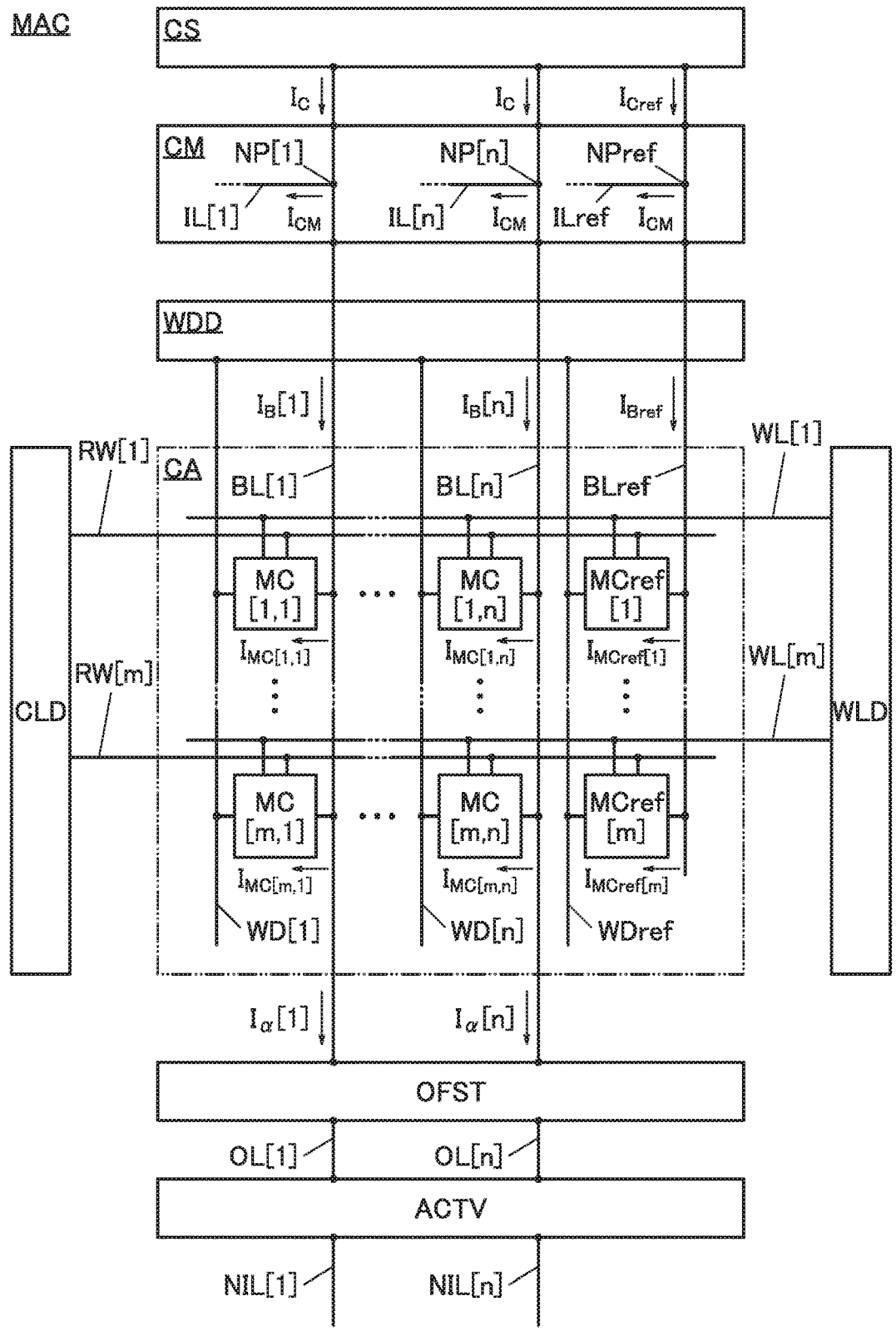
FIG. 11 A diagram illustrating a configuration example of a semiconductor device.

FIG. 11 illustrates a configuration example of a semiconductor device MAC having a function of performing an operation of a neural network. The semiconductor device MAC has a function of performing a product-sum operation of first data corresponding to the connection strength between neurons (weight) and second data corresponding to input data. Note that the first data and the second data can each be analog data or multilevel digital data (discrete data). The semiconductor device MAC also has a function of converting data obtained by the product-sum operation with an activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. FIG. 11 illustrates a configuration example in which the cell array CA includes the memory cells MC in m rows and n columns (MC[1, 1] to MC[m, n]) and the m memory cells MCref (MCref[1] to MCref[m]) (m and n are integers greater than or equal to 1). The memory cells MC each have a function of storing the first data. In addition, the memory cells MCref each have a function of storing reference data used for the product-sum operation. Note that the reference data can be analog data or multilevel digital data.

The memory cell MC[i, j] (i is an integer greater than or equal to 1 and less than or equal to m, and j is an integer greater than or equal to 1 and less than or equal to n) is connected to a wiring WL[i], a wiring RW[i], a wiring WD[j], and a wiring BL[j]. In addition, the memory cell MCref[i] is connected to the wiring WL[i], the wiring RW[i], a wiring WDref, and a wiring BLref. Here, a current flowing between the memory cell MC[i, j] and the wiring BL[j] is denoted by $I_{MC[i,\,j]}$, and a current flowing between the memory cell MCref[i] and the wiring BLref is denoted by $I_{MCref[i]}$.

Figure 12:
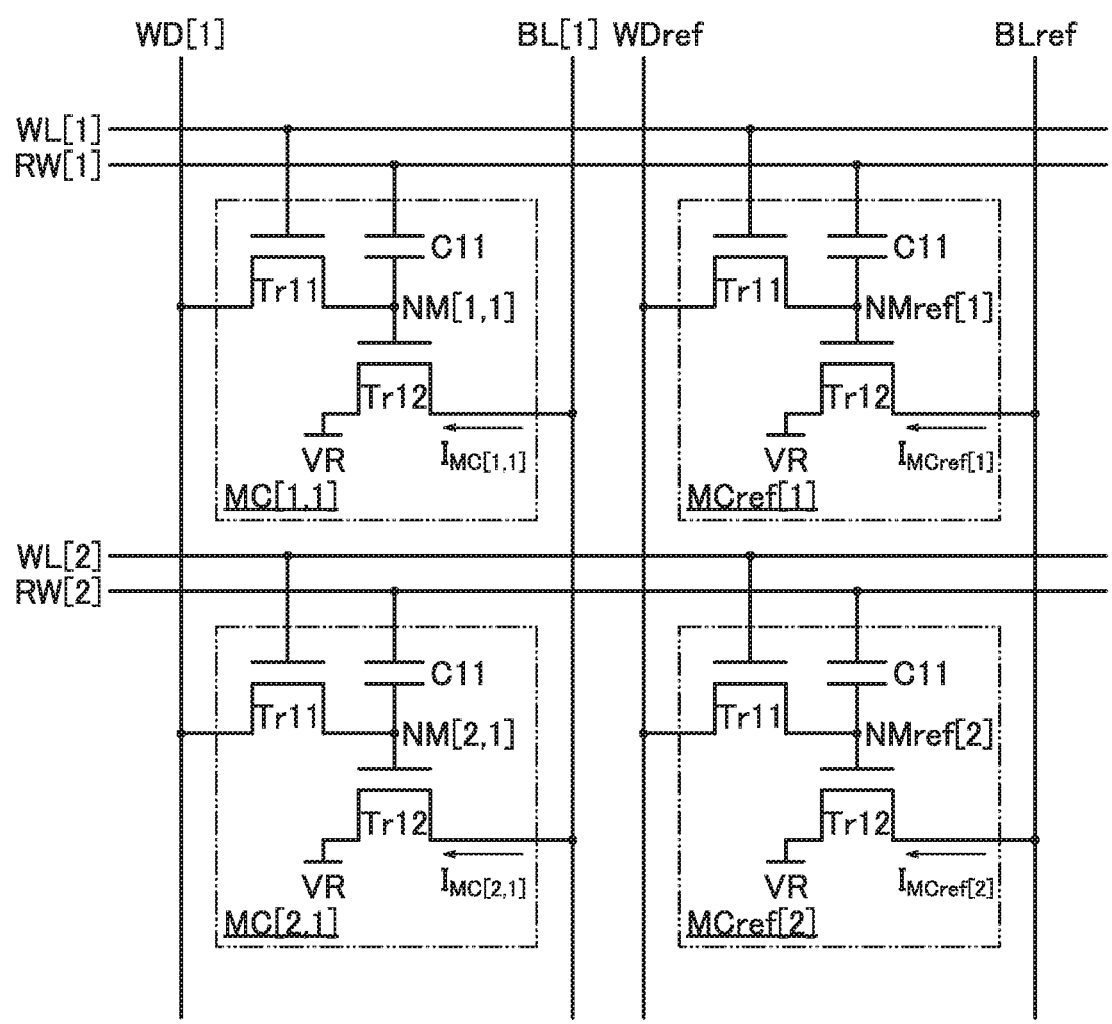
FIG. 12 A diagram illustrating a configuration example of a memory cell.

FIG. 12 illustrates a specific configuration example of the memory cells MC and the memory cells MCref. Although the memory cells MC[1, 1] and MC[2, 1] and the memory cells MCref[1] and MCref[2] are illustrated in FIG. 12 as typical examples, similar configurations can be used for other memory cells MC and memory cells MCref. The memory cells MC and the memory cells MCref each include transistors Tr11 and Tr12 and a capacitor C11. Here, the case where the transistor Tr11 and the transistor Tr12 are n-channel transistors will be described.

In the memory cell MC, a gate of the transistor Tr11 is connected to the wiring WL, one of a source and a drain is connected to a gate of the transistor Tr12 and a first electrode of the capacitor C11, and the other of the source and the drain is connected to the wiring WD. One of a source and a drain of the transistor Tr12 is connected to the wiring BL, and the other of the source and the drain is connected to a wiring VR. A second electrode of the capacitor C11 is connected to the wiring RW. The wiring VR is a wiring having a function of supplying a predetermined potential. Here, the case where a low power supply potential (e.g., a ground potential) is supplied from the wiring VR is described as an example.

A node connected to the one of the source and the drain of the transistor Tr11, the gate of the transistor Tr12, and the first electrode of the capacitor C11 is referred to as a node NM. The nodes NM in the memory cells MC[1, 1] and MC[2, 1] are referred to as nodes NM[1, 1] and NM[2, 1], respectively.

The memory cells MCref have a configuration similar to that of the memory cell MC. However, the memory cells MCref are connected to the wiring WDref instead of the wiring WD and connected to the wiring BLref instead of the wiring BL. Nodes in the memory cells MCref[1] and MCref[2] each of which is connected to the one of the source and the drain of the transistor Tr11, the gate of the transistor Tr12, and the first electrode of the capacitor C11 are referred to as nodes NMref[1] and NMref[2], respectively.

The node NM and the node NMref function as holding nodes of the memory cell MC and the memory cell MCref, respectively. The first data is held in the node NM and the reference data is held in the node NMref. Currents $I_{MC[1,\,1]}$, and $I_{MC[2,\,1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 has a function of holding the potential of the node NM or the node NMref, the off-state current of the transistor Tr11 is preferably low. Thus, it is preferable to use an OS transistor, which has extremely low off-state current, as the transistor Tr11. This inhibits a change in the potential of the node NM or the node NMref, so that the operation accuracy can be improved. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS has a function of supplying currents to the wirings BL[1] to BL[n] and the wiring BLref. Note that the value of the current supplied to the wirings BL[1] to BL[n] may be different from the value of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref. Here, portions where the wirings IL[1] to IL[n] are connected to the respective wirings BL[1] to BL[n] are referred to as nodes NP[1] to NP[n]. Furthermore, a portion where the wiring ILref is connected to the wiring BLref is referred to as a node NPref.

The current mirror circuit CM has a function of making a current $I_{CM}$ corresponding to the potential of the node NPref flow to the wiring ILref and a function of making this current $I_{CM}$ flow also to the wirings IL[1] to IL[n]. In the example illustrated in FIG. 11, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by IB[1] to IB[n]. Furthermore, a current flowing from the current mirror circuit CM to the cell array CA through the wiring BLref is denoted by IBref.

The circuit WDD is connected to the wirings WD[1] to WD[n] and the wiring WDref. The circuit WDD has a function of supplying a potential corresponding to the first data to be stored in the memory cells MC to the wirings WD[1] to WD[n]. The circuit WDD also has a function of supplying a potential corresponding to the reference data to be stored in the memory cell MCref to the wiring WDref. The circuit WLD is connected to wirings WL[1] to WL[m]. The circuit WLD has a function of supplying a signal for selecting the memory cell MC or the memory cell MCref to which data is to be written, to any of the wirings WL[1] to WL[m]. The circuit CLD is connected to the wirings RW[1] to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of detecting the amount of currents flowing from the wirings BL[1] to BL[n] to the offset circuit OFST and/or the amount of change in the currents flowing from the wirings BL[1] to BL[n] to the offset circuit OFST. The offset circuit OFST also has a function of outputting detection results to the wirings OL[1] to OL[n]. Note that the offset circuit OFST may output currents corresponding to the detection results to the wirings OL, or may convert the currents corresponding to the detection results into voltages to output the voltages to the wirings OL. The currents flowing between the cell array CA and the offset circuit OFST are denoted by $I_\alpha[1]$ to $I_\alpha[n]$.

Figure 13:
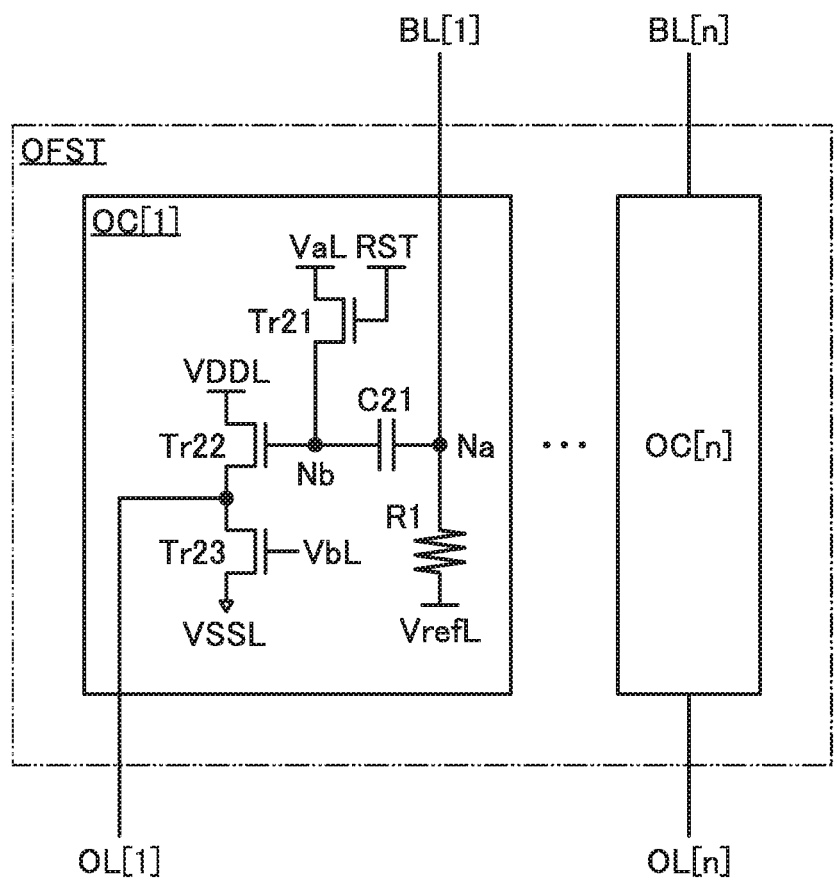
FIG. 13 A diagram illustrating a configuration example of an offset circuit.

FIG. 13 illustrates a configuration example of the offset circuit OFST. The offset circuit OFST illustrated in FIG. 13 includes circuits OC[1] to OC[n]. The circuits OC[1] to OC[n] each include a transistor Tr21, a transistor Tr22, a transistor Tr23, a capacitor C21, and a resistor R1. Connection relations of the elements are illustrated in FIG. 13. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. Furthermore, a wiring VDDL has a function of supplying a potential VDD, and a wiring VSSL has a function of supplying a potential VSS. Here, the case where the potential VDD is a high power supply potential and the potential VSS is a low power supply potential is described. A wiring RST has a function of supplying a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] will be described. Note that although an operation example of the circuit OC[1] is described here as a typical example, the circuits OC[2] to OC[n] can operate in a similar manner. First, when a first current flows to the wiring BL[1], the potential of the node Na becomes a potential corresponding to the first current and the resistance value of the resistor R1. At this time, the transistor Tr21 is in an on state, and thus the potential Va is supplied to the node Nb. Then, the transistor Tr21 is brought into an off state.

Next, when a second current flows to the wiring BL[1], the potential of the node Na changes to a potential corresponding to the second current and the resistance value of the resistor R1. At this time, since the transistor Tr21 is in an off state and the node Nb is in a floating state, the potential of the node Nb changes because of capacitive coupling, following the change in the potential of the node Na. Here, when the amount of change in the potential of the node Na is $\Delta V_{Na}$ and the capacitive coupling coefficient is 1, the potential of the node Nb is $Va+\Delta V_{Na}$. When the threshold voltage of the transistor Tr22 is Vth, a potential $Va+\Delta V_{Na}-V_{th}$ is output from the wiring OL[1]. Here, when $Va=V_{th}$, the potential $\Delta V_{Na}$ can be output from the wiring OL[1].

The potential $\Delta V_{Na}$ is determined by the amount of change from the first current to the second current, the resistor R1, and the potential Vref. Here, since the resistor R1 and the potential Vref are known, the amount of change in the current flowing to the wiring BL can be found from the potential $\Delta V_{Na}$.

A signal corresponding to the amount of current and/or the amount of change in the current that are/is detected by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV has a function of performing an operation for converting the signal input from the offset circuit OFST in accordance with the predefined activation function. As the activation function, for example, a sigmoid function, a tan h function, a softmax function, a ReLU function, a threshold function, or the like can be used. The signal converted by the activation function circuit ACTV is output as output data to the wirings NIL[1] to NIL[n].

<Operation Example of Semiconductor Device>

The product-sum operation of the first data and the second data can be performed using the above semiconductor device MAC. An operation example of the semiconductor device MAC at the time of performing the product-sum operation is described below.

Figure 14:
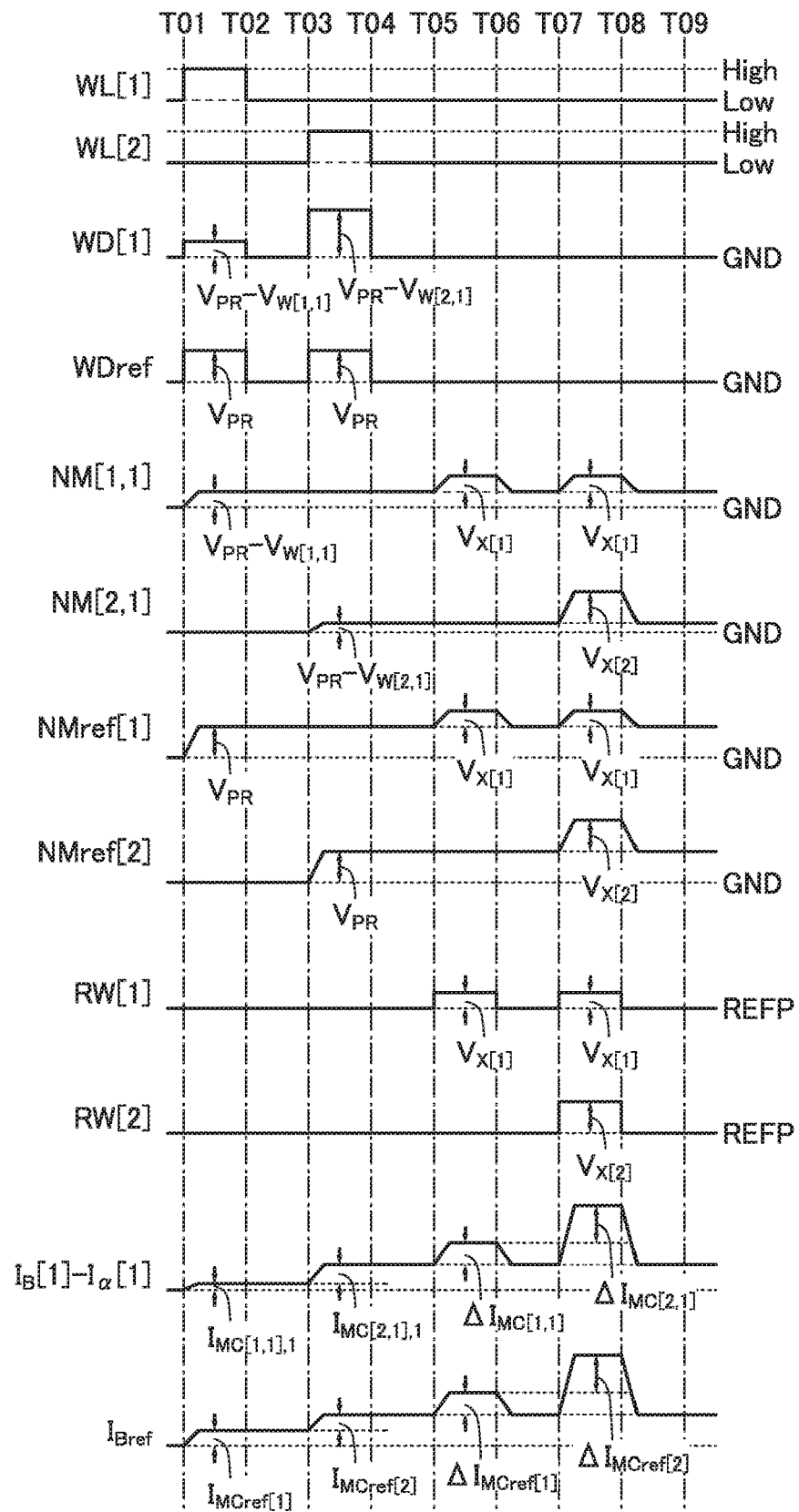
FIG. 14 A timing chart showing an operation example of a semiconductor device.

FIG. 14 illustrates a timing chart of the operation example of the semiconductor device MAC. FIG. 14 shows changes in the potentials of the wiring WL[1], the wiring WL[2], the wiring WD[1], the wiring WDref, the node NM[1, 1], the node NM[2, 1], the node NMref[1], the node NMref[2], the wiring RW[1], and the wiring RW[2] in FIG. 12 and changes in the values of a current $I_B[1]-I_\alpha[1]$ and the current $I_{Bref}$. The current $I_B[1]-I_\alpha[1]$ corresponds to the sum total of the currents flowing from the wiring BL[1] to the memory cells MC[1, 1] and MC[2, 1].

Although an operation is described with a focus on the memory cells MC[1, 1] and MC[2, 1] and the memory cells MCref[1] and MCref[2] illustrated in FIG. 12 as a typical example, the other memory cells MC and the other memory cells MCref can be operated in a similar manner.

[Storage of First Data]

First, from Time T01 to Time T02, the potential of the wiring WL[1] becomes a high level, the potential of the wiring WD[1] becomes a potential greater than a ground potential (GND) by $V_{PR}-V_{W[1, 1]}$, and the potential of the wiring WDref becomes a potential greater than the ground potential by $V_{PR}$. The potentials of the wiring RW[1] and the wiring RW[2] become reference potentials (REFP). Note that the potential $V_{W[1, 1]}$ is a potential corresponding to the first data stored in the memory cell MC[1, 1]. The potential $V_{PR}$ is a potential corresponding to the reference data. Thus, the transistors Tr11 included in the memory cell MC[1, 1] and the memory cell MCref[1] are brought into on states, and the potential of the node NM[1, 1] becomes $V_{PR}-V_{W[1, 1]}$ and the potential of the node NMref[1] becomes $V_{PR}$.

In this case, a current $I_{MC[1, 1], 0}$ flowing from the wiring BL[1] to the transistor Tr12 in the memory cell MC[1, 1] can be expressed by the following formula. Here, k is a constant determined by the channel length, the channel width, the mobility, the capacitance of a gate insulating film, and the like of the transistor Tr12. Furthermore, $V_{th}$ is the threshold voltage of the transistor Tr12.

$$I_{MC[1, 1], 0}=k(V_{PR}-V_{W[1, 1]}-V_{th})^2 \qquad (E1)$$

Furthermore, a current $I_{MCref[1], 0}$ flowing from the wiring BLref to the transistor Tr12 in the memory cell MCref[1] can be expressed by the following formula.

$$I_{MCref[1], 0}=k(V_{PR}-V_{th})^2 \qquad (E2)$$

Next, from Time T02 to Time T03, the potential of the wiring WL[1] becomes a low level. Consequently, the transistors Tr11 included in the memory cell MC[1, 1] and the memory cell MCref[1] are brought into off states, and the potentials of the node NM[1, 1] and the node NMref[1] are retained.

As described above, an OS transistor is preferably used as the transistor Tr11. This can suppress the leakage current of the transistor Tr11, so that the potentials of the node NM[1, 1] and the node NMref[1] can be retained accurately.

Next, from Time T03 to Time T04, the potential of the wiring WL[2] becomes the high level, the potential of the wiring WD[1] becomes a potential greater than the ground potential by $V_{PR}-V_{W[2, 1]}$, and the potential of the wiring WDref becomes a potential greater than the ground potential by $V_{PR}$. Note that the potential $V_{W[2, 1]}$ is a potential corresponding to the first data stored in the memory cell MC[2, 1]. Thus, the transistors Tr1 included in the memory cell MC[2, 1] and the memory cell MCref[2] are brought into on states, and the potential of the node NM[2, 1] becomes $V_{PR}-V_{W[2, 1]}$ and the potential of the node NMref [2] becomes $V_{PR}$.

In this case, a current $I_{MC[2, 1], 0}$ flowing from the wiring BL[1] to the transistor Tr12 in the memory cell MC[2, 1] can be expressed by the following formula.

$$I_{MC[2, 1], 0} = k(V_{PR} - V_{W[2,1]} - V_{th})^2 \qquad (E3)$$

Furthermore, a current $I_{MCref[2], 0}$ flowing from the wiring BLref to the transistor Tr12 in the memory cell MCref[2] can be expressed by the following formula.

$$I_{MCref[2], 0} = k(V_{PR} - V_{th})^2 \qquad (E4)$$

Next, from Time T04 to Time T05, the potential of the wiring WL[2] becomes the low level. Consequently, the transistors Tr1 included in the memory cell MC[2, 1] and the memory cell MCref[2] are brought into off states, and the potentials of the node NM[2, 1] and the node NMref[2] are retained.

Through the above operation, the first data is stored in the memory cells MC[1, 1] and MC[2, 1], and the reference data is stored in the memory cells MCref[1] and MCref[2].

Here, currents flowing through the wiring BL[1] and the wiring BLref from Time T04 to Time T05 are considered. A current is supplied from the current source circuit CS to the wiring BLref. The current flowing through the wiring BLref is discharged to the current mirror circuit CM and the memory cells MCref[1] and MCref[2]. The following formula holds where $I_{Cref}$ is the current supplied from the current source circuit CS to the wiring BLref and $I_{CM, 0}$ is the current discharged from the wiring BLref to the current mirror circuit CM.

$$I_{Cref} - I_{CM, 0} = I_{MCref[1], 0} + I_{MCref[2], 0} \qquad (E5)$$

A current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The following formula holds where $I_{C, 0}$ is the current supplied from the current source circuit CS to the wiring BL[1] and $I_{\alpha, 0}$ is the current flowing from the wiring BL[1] to the offset circuit OFST.

$$I_C - I_{CM, 0} = I_{MC[1, 1], 0} + I_{MC[2, 1], 0} + I_{\alpha, 0} \qquad (E6)$$

[Product-Sum Operation of First Data and Second Data]

Next, from Time T05 to Time T06, the potential of the wiring RW[1] becomes a potential greater than the reference potential by $V_{X[1]}$. At this time, the potential $V_{X[1]}$ is supplied to the capacitor C11 in each of the memory cell MC[1, 1] and the memory cell MCref[1], so that the potential of the gate of the transistor Tr12 is increased because of capacitive coupling. Note that the potential $V_{X[1]}$ is a potential corresponding to the second data supplied to the memory cell MC[1, 1] and the memory cell MCref[1].

The amount of change in the potential of the gate of the transistor Tr12 corresponds to the value obtained by multiplying the amount of change in the potential of the wiring RW by a capacitive coupling coefficient determined by the memory cell configuration. The capacitive coupling coefficient is calculated using the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is 1. In practice, the potential $V_X$ can be determined in consideration of the capacitive coupling coefficient.

When the potential $V_{X[1]}$ is supplied to the capacitors C11 in the memory cell MC[1, 1] and the memory cell MCref[1], the potentials of the node NM[1, 1] and the node NMref[1] each increase by $V_{X[1]}$.

Here, a current $I_{MC[1, 1], 1}$ flowing from the wiring BL[1] to the transistor Tr12 in the memory cell MC[1, 1] from Time T05 to Time T06 can be expressed by the following formula.

$$I_{MC[1, 1], 1} = k(V_{PR} - V_{W[1, 1]} + V_{X[1]} - V_{th})^2 \qquad (E7)$$

That is, when the potential $V_{X[1]}$ is supplied to the wiring RW[1], the current flowing from the wiring BL[1] to the transistor Tr12 in the memory cell MC[1, 1] increases by $\Delta I_{MC[1, 1]} = I_{MC[1, 1], 1} - I_{MC[1, 1], 0}$.

A current $I_{MCref[1], 1}$ flowing from the wiring BLref to the transistor Tr12 in the memory cell MCref[1] from Time T05 to Time T06 can be expressed by the following formula.

$$I_{MCref[1], 1} = k(V_{PR} + V_{X[1]} - V_{th})^2 \qquad (E8)$$

That is, when the potential $V_{X[1]}$ is supplied to the wiring RW[1], the current flowing from the wiring BLref to the transistor Tr12 in the memory cell MCref[1] increases by $\Delta I_{MCref}[1] = I_{MCref[1], 1} - I_{MCref[1], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The following formula holds where $I_{CM, 1}$ is the current discharged from the wiring BLref to the current mirror circuit CM.

$$I_{Cref} - I_{CM, 1} = I_{MCref[1], 1} + I_{MCref[2], 0} \qquad (E9)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The following formula holds where $I_{\alpha, 1}$ is the current flowing from the wiring BL[1] to the offset circuit OFST.

$$I_C - I_{CM, 1} = I_{MC[1, 1], 1} + I_{MC[2, 1], 1} + I_{\alpha, 1} \qquad (E10)$$

In addition, from the formula (E1) to the formula (E10), a difference between the current $I_{\alpha, 0}$ and the current $I_{\alpha, 1}$ (differential current $\Delta I_\alpha$) can be expressed by the following formula.

$$\Delta I_\alpha = I_{\alpha, 0} - I_{\alpha, 1} = 2kV_{W[1, 1]}V_{X[1]} \qquad (E11)$$

Thus, the differential current $\Delta I_\alpha$ is a value corresponding to the product of the potentials $V_{W[1, 1]}$ and $V_{X[1]}$.

After that, from Time T06 to Time T07, the potential of the wiring RW[1] becomes the ground potential, and the potentials of the node NM[1, 1] and the node NMref[1] become similar to those from Time T04 to Time T05.

Next, from Time T07 to Time T08, the potential of the wiring RW[1] becomes a potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitor C11 in each of the memory cell MC[1, 1] and the memory cell MCref[1], and the potentials of the node NM[1, 1] and the node NMref[1] each increase by $V_{X[1]}$ because of capacitive coupling. Furthermore, the potential $V_{X[2]}$ is supplied to the capacitor C1in each of the memory cell MC[2, 1] and the memory cell MCref[2], and the potentials of the node NM[2, 1] and the node NMref[2] each increase by $V_{X[2]}$ because of capacitive coupling.

Here, a current $I_{MC[2, 1], 1}$ flowing from the wiring BL[1] to the transistor Tr12 in the memory cell MC[2, 1] from Time T07 to Time T08 can be expressed by the following formula.

$$I_{MC[2,1], 1} = k(V_{PR} - V_{W[2,1]} + V_{X[2]} - V_{th})^2 \quad (E12)$$

That is, when the potential $V_{X[2]}$ is supplied to the wiring RW[2], the current flowing from the wiring BL[1] to the transistor Tr12 in the memory cell MC[2, 1] increases by $\Delta I_{MC[2, 1]} = I_{MC[2, 1], 1} - I_{MC[2, 1], 0}$.

A current $I_{MCref[2], 1}$ flowing from the wiring BLref to the transistor Tr12 in the memory cell MCref[2] from Time T05 to Time T06 can be expressed by the following formula.

$$I_{MCref[2], 1} = k(V_{PR} + V_{X[2]} - V_{th})^2 \quad (E13)$$

That is, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The following formula holds where $I_{CM, 2}$ is the current discharged from the wiring BLref to the current mirror circuit CM.

$$I_{Cref} - I_{CM, 2} = I_{MCref[1], 1} + I_{MCref[2], 1} \quad (E14)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The following formula holds where $I_{\alpha, 2}$ is the current flowing from the wiring BL[1] to the offset circuit OFST.

$$I_C - I_{CM, 2} = I_{MC[1, 1], 1} + I_{MC[2, 1], 1} + I_{\alpha, 2} \quad (E15)$$

In addition, from the formula (E1) to the formula (E8) and the formula (E12) to the formula (E15), a difference between the current $I_{\alpha, 0}$ and the current $I_{\alpha, 2}$ (differential current $\Delta I_\alpha$) can be expressed by the following formula.

$$\Delta I_\alpha = I_{\alpha, 0} - I_{\alpha, 2} = 2k(V_{W[1,1]} V_{X[1]} + V_{W[2,1]} V_{X[2]}) \quad (E16)$$

Thus, the differential current $\Delta I_\alpha$ is a value corresponding to the sum of the product of the potential $V_{W[1, 1]}$ and the potential $V_{X[1]}$ and the product of the potential $V_{W[2, 1]}$ and the potential $V_{X[2]}$.

After that, from Time T08 to Time T09, the potentials of the wirings RW[1] and RW[2] become the ground potential, and the potentials of the nodes NM[1, 1] and NM[2, 1] and the nodes NMref[1] and NMref[2] become similar to those from Time T04 to Time T05.

As represented by the formula (E9) and the formula (E16), the differential current $\Delta I_\alpha$ input to the offset circuit OFST is a value corresponding to the sum of the products of the potentials $V_X$ corresponding to the first data (weight) and the potentials $V_W$ corresponding to the second data (input data). In other words, measurement of the differential current $\Delta I_\alpha$ with the offset circuit OFST gives the result of the product-sum operation of the first data and the second data.

Note that although the memory cells MC[1, 1] and MC[2, 1] and the memory cells MCref[1] and MCref[2] are particularly focused on in the above description, the number of the memory cells MC and the memory cells MCref can be freely set. In the case where the number m of rows of the memory cells MC and the memory cells MCref is an arbitrary number, the differential current $\Delta I_\alpha$ can be expressed by the following formula.

$$\Delta I_\alpha = 2k \Sigma_i V_{W[i,1]} V_{X[i]} \quad (E17)$$

When the number n of columns of the memory cells MC and the memory cells MCref is increased, the number of product-sum operations executed in parallel can be increased.

The product-sum operation of the first data and the second data can be performed using the semiconductor device MAC as described above. Note that the use of the configuration of the memory cells MC and the memory cells MCref in FIG. 12 allows the product-sum operation circuit to be formed of fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 10(A) is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the structure of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), or the like.

The product-sum operation in the neural network can be performed using the semiconductor device MAC as described above. Furthermore, the memory cells MC and the memory cells MCref illustrated in FIG. 12 are used for the cell array CA, whereby an integrated circuit with improved operation accuracy, lower power consumption, or a reduced circuit scale can be provided.

This embodiment can be implemented in an appropriate combination with the structures described in the other embodiments and the like.

Embodiment 3

In this embodiment, configuration examples of the pixel 165 are described. The pixel 165 includes a pixel circuit 534 and a display element.

When three pixels 165 function as one pixel, full-color display can be achieved. The three pixels 165 each control the transmittance, reflectance, amount of emitted light, or the like of red light, green light, or blue light. The light colors controlled by the three pixels 165 are not limited to the combination of red, green, and blue and may be yellow, cyan, and magenta.

A pixel 165 that controls white light may be added to the pixels controlling red light, green light, and blue light so that the four pixels 165 may collectively function as one pixel. The addition of the pixel 165 controlling white light can increase the luminance of the display region. When the number of pixels 165 functioning as one pixel is increased and red, green, blue, yellow, cyan, and magenta are used in appropriate combination, the range of color reproduction can be widened.

Using the pixels arranged in a matrix of 1920×1080, the display unit 160 that can achieve display with a resolution of what is called full high definition (also referred to as "2K resolution", "2K1K", "2K", or the like) can be obtained. For example, using the pixels arranged in a matrix of 3840× 2160, the display unit 160 that can achieve display with a resolution of what is called ultra high definition (also referred to as "4K resolution", "4K2K", "4K", or the like) can be obtained. For example, using the pixels arranged in a matrix of 7680×4320, the display unit 160 that can achieve display with a resolution of what is called super high definition (also referred to as "8K resolution", "8K4K", "8K", or the like) can be obtained. By increasing the number of pixels, the display unit 160 that can achieve display with 16K or 32K resolution can be obtained.

FIG. 15(A), FIG. 15(B), FIG. 16(A), and FIG. 16(B) illustrate circuit configuration examples that can be used for the pixel 165.

<Example of Pixel Circuit for Light-Emitting Display Device>

Figure 15A:
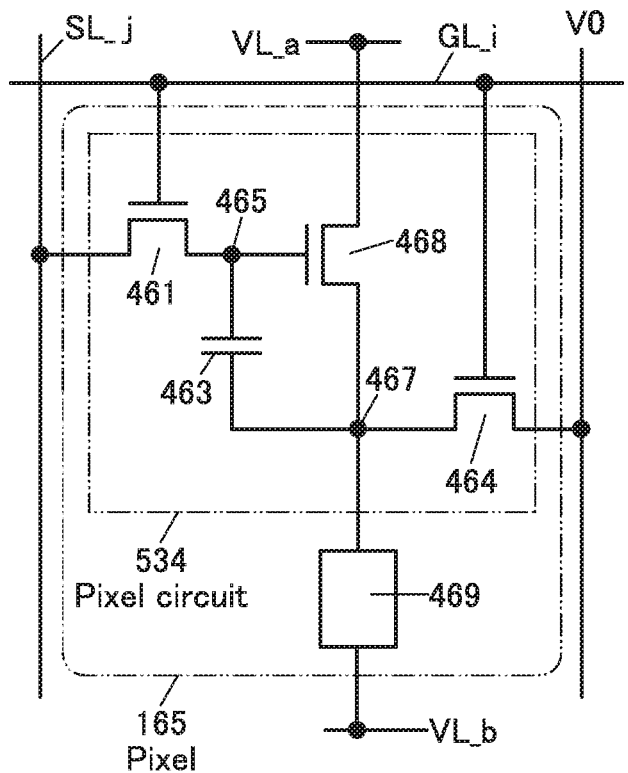
FIG. 15 Diagrams illustrating circuit configuration examples of a pixel.

The pixel circuit 534 illustrated in FIG. 15(A) includes a transistor 461, a capacitor 463, a transistor 468, and a transistor 464. The pixel circuit 534 illustrated in FIG. 15(A) is electrically connected to a light-emitting element 469 that can function as a display element.

OS transistors can be used as the transistor 461, the transistor 468, and the transistor 464. It is particularly preferable to use an OS transistor as the transistor 461.

One of a source and a drain of the transistor 461 is electrically connected to a wiring SL_j (the wiring SLA_j or the wiring SLB_j). Furthermore, a gate of the transistor 461 is electrically connected to the wiring GL_i (a wiring GLA_i or a wiring GLB_i). A video signal is supplied from the wiring SL_j.

The transistor 461 has a function of controlling writing of a video signal to a node 465.

One of a pair of electrodes of the capacitor 463 is electrically connected to the node 465, and the other is electrically connected to a node 467. The other of the source and the drain of the transistor 461 is electrically connected to the node 465.

The capacitor 463 has a function of a storage capacitor for retaining data written to the node 465.

One of a source and a drain of the transistor 468 is electrically connected to a potential supply line VL_a, and the other is electrically connected to the node 467. Furthermore, a gate of the transistor 468 is electrically connected to the node 465.

One of a source and a drain of the transistor 464 is electrically connected to a potential supply line V0, and the other is electrically connected to the node 467. Furthermore, a gate of the transistor 464 is electrically connected to the wiring GL_i.

One of an anode and a cathode of the light-emitting element 469 is electrically connected to a potential supply line VL_b, and the other is electrically connected to the node 467.

As the light-emitting element 469, an organic electroluminescent element (also referred to as an organic EL element) can be used, for example. Note that the light-emitting element 469 is not limited thereto; an inorganic EL element formed of an inorganic material may be used, for example.

A high power supply potential VDD is supplied to one of the potential supply line VL_a and the potential supply line VL_b, and a low power supply potential VSS is supplied to the other, for example.

In the display unit 160 including the pixel circuits 534 in FIG. 15(A), the pixels 165 are sequentially selected row by row by a driver circuit 521a and/or a driver circuit 521b, and then the transistor 461 and the transistor 464 are brought into an on state and a video signal is written to the node 465.

The pixel 165 in which data has been written to the node 465 is brought into a holding state when the transistor 461 and the transistor 464 are brought into an off state. Furthermore, the amount of current flowing between the source electrode and the drain electrode of the transistor 468 is adjusted in accordance with the potential of the data written to the node 465, and the light-emitting element 469 emits light with a luminance corresponding to the amount of flowing current.

This operation is sequentially performed row by row; thus, an image can be displayed.

Figure 16A:
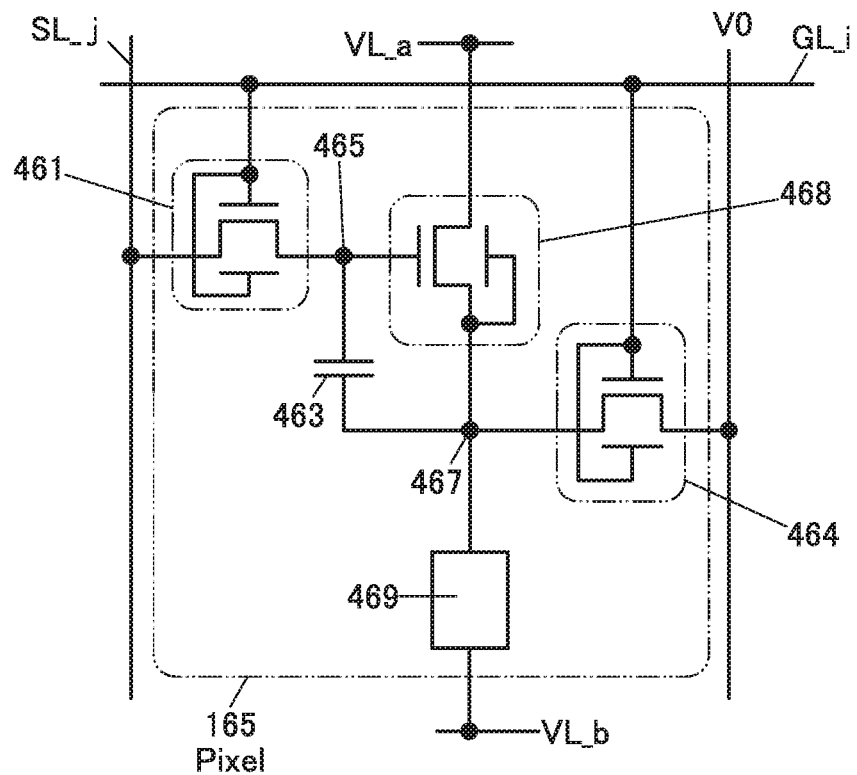
FIG. 16 Diagrams illustrating circuit configuration examples of a pixel.

As illustrated in FIG. 16(A), a transistor having a backgate may be used as the transistor 461, the transistor 464, and the transistor 468. In each of the transistor 461 and the transistor 464 illustrated in FIG. 16(A), the gate is electrically connected to the backgate. Thus, the gate and the backgate always have the same potential. The backgate of the transistor 468 is electrically connected to the node 467. Thus, the backgate always has the same potential as the node 467.

The transistor described in the above embodiment can be used as at least one of the transistor 461, the transistor 468, and the transistor 464.

<Example of Pixel Circuit for Liquid Crystal Display Device>

Figure 15B:
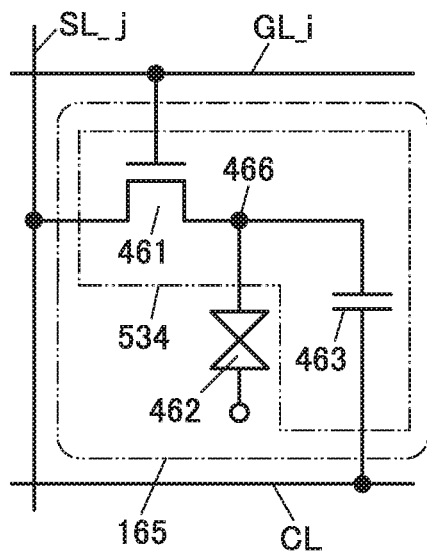

The pixel circuit 534 illustrated in FIG. 15(B) includes the transistor 461 and the capacitor 463. The pixel circuit 534 illustrated in FIG. 15(B) is electrically connected to a liquid crystal element 462 that can function as a display element. It is preferable to use an OS transistor as the transistor 461.

The potential of one of a pair of electrodes of the liquid crystal element 462 is set as appropriate according to the specifications of the pixel circuit 534. For example, the one of the pair of electrodes of the liquid crystal element 462 may be supplied with a common potential, or may have the same potential as a capacitor line CL which is described later. Alternatively, a potential supplied to the one of the pair of electrodes of the liquid crystal element 462 may vary among the pixels 165. The other of the pair of electrodes of the liquid crystal element 462 is electrically connected to a node 466. The alignment state of the liquid crystal element 462 depends on data written to the node 466.

As a driving method of the display device including the liquid crystal element 462, for example, a TN (Twisted Nematic) mode, an STN (Super Twisted Nematic) mode, a VA mode, an ASM (Axially Symmetric Aligned Micro-cell) mode, an OCB (Optically Compensated Birefringence) mode, an FLC (Ferroelectric Liquid Crystal) mode, an AFLC (AntiFerroelectric Liquid Crystal) mode, an MVA mode, a PVA (Patterned Vertical Alignment) mode, an IPS mode, an FFS mode, a TBA (Transverse Bend Alignment) mode, and the like may be used. Examples of a driving method of the display device include, in addition to the above driving methods, an ECB (Electrically Controlled Birefringence) mode, a PDLC (Polymer Dispersed Liquid Crystal) mode, a PNLC (Polymer Network Liquid Crystal) mode, and a guest-host mode. However, not limited to the above, a variety of liquid crystal elements and the driving methods thereof can be used.

When the liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

A liquid crystal exhibiting a blue phase for which an alignment film is not needed may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for 5 weight % or more is used for the liquid crystal layer in order to improve the temperature range. The liquid crystal composition that contains a liquid crystal exhibiting the blue phase and a chiral material has a short response time of 1 msec or less, has optical isotropy, which makes the alignment process unneeded, and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, the productivity of the liquid crystal display device can be increased.

Moreover, it is possible to use a method called domain multiplication or multi-domain design, in which a pixel (pixel) is divided into some regions (subpixels) and molecules are aligned in different directions in their respective regions.

The specific resistivity of a liquid crystal material is greater than or equal to $1\times10^9$ Ω·cm, preferably greater than or equal to $1\times10^{11}$ Ω·cm, further preferably greater than or equal to $1\times10^{12}$ Ω·cm. Note that a value of the specific resistivity in this specification is a value measured at 20° C.

In the pixel circuit 534 in the g-th row and the h-th column, one of the source and the drain of the transistor 461 is electrically connected to the wiring SL_j, and the other is electrically connected to the node 466. The gate of the transistor 461 is electrically connected to the wiring GL_i. A video signal is supplied from the wiring SL_j. The transistor 461 has a function of controlling writing of a video signal to the node 466.

One of the pair of electrodes of the capacitor 463 is electrically connected to a wiring to which a particular potential is supplied (hereinafter, the capacitor line CL), and the other is electrically connected to the node 466. Note that the potential value of the capacitor line CL is set as appropriate according to the specifications of the pixel circuit 534. The capacitor 463 has the function of a storage capacitor for retaining data written to the node 466.

In the display unit 160 including the pixel circuits 534 in FIG. 15(B), for example, the pixel circuits 534 are sequentially selected row by row by the driver circuit 521a and/or the driver circuit 521b, and then the transistor 461 is brought into an on state and a video signal is written to the node 466.

The pixel circuit 534 in which the video signal has been written to the node 466 is brought into a holding state when the transistor 461 is brought into an off state. This operation is sequentially performed row by row; thus, an image can be displayed on a display region 531.

Figure 16B:
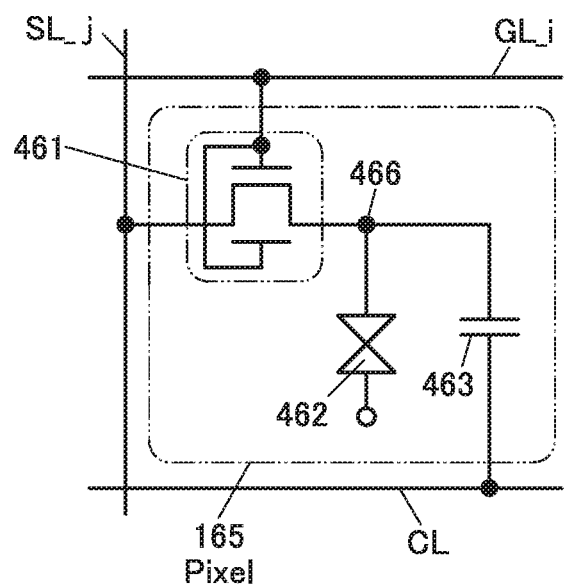

As illustrated in FIG. 16(B), a transistor having a backgate may be used as the transistor 461. In the transistor 461 illustrated in FIG. 16(B), the gate is electrically connected to the backgate. Thus, the gate and the backgate always have the same potential.

This embodiment can be implemented in an appropriate combination with the structures described in the other embodiments and the like.

Embodiment 4

Figure 17A:
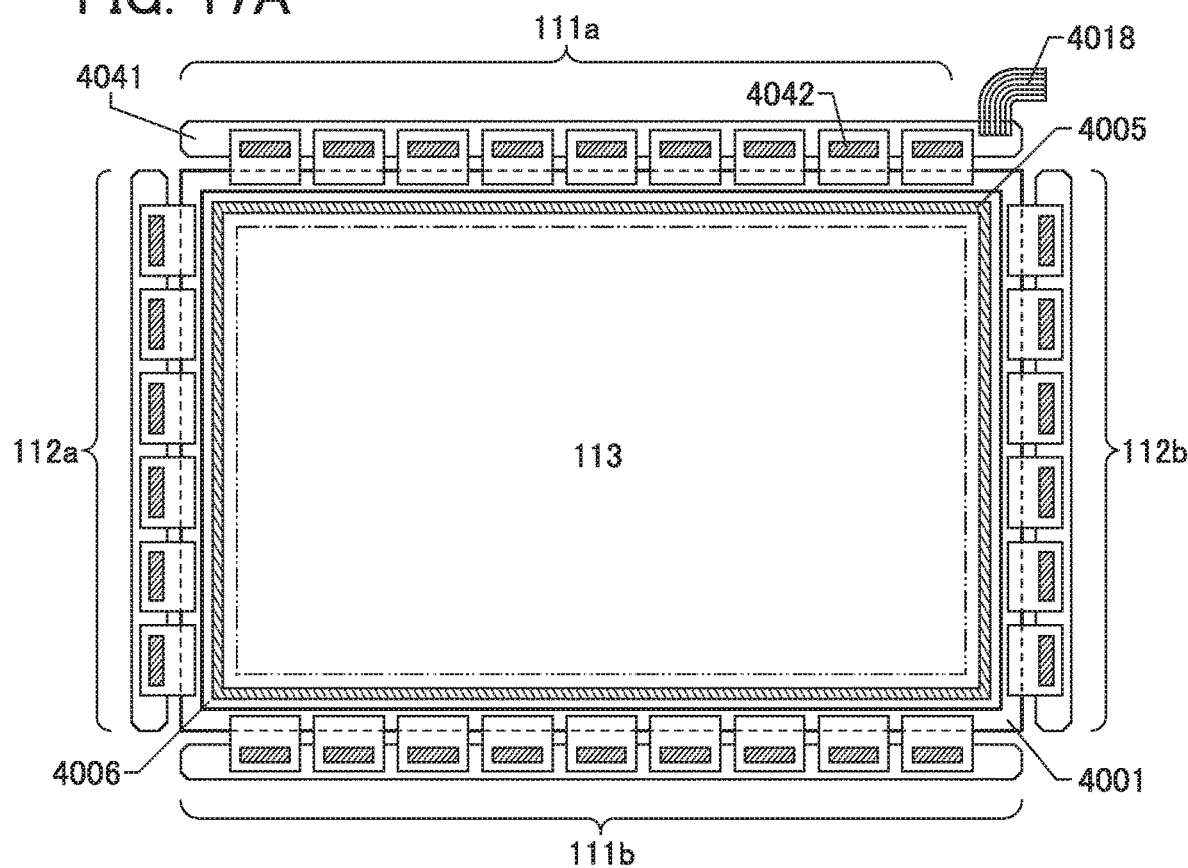
FIG. 17 Diagrams illustrating display devices.

In this embodiment, a structure example of the display unit 160 using a liquid crystal element as a display element and a structure example of the display unit 160 using an EL element as a display element are described. In FIG. 17(A), a sealant 4005 is provided so as to surround a display region 113 provided over a first substrate 4001, and the display region 113 is sealed by the sealant 4005 and a second substrate 4006.

In FIG. 17(A), a data driver 111a, a data driver 111b, a gate driver 112a, and a gate driver 112b each include a plurality of integrated circuits 4042 provided over a printed circuit board 4041. The integrated circuits 4042 are formed using a single crystal semiconductor or a polycrystalline semiconductor. The data driver 111a and the data driver 111b function in a manner similar to that of the driver circuits 511 (signal line driver circuits) described in the above embodiment. The gate driver 112a and the gate driver 112b function in a manner similar to that of the driver circuit 521a and the driver circuit 521b (scan line driver circuits) described in the above embodiment.

A variety of signals and potentials supplied to the gate driver 112a, the gate driver 112b, the data driver 111a, and the data driver 111b are supplied through an FPC 4018.

The integrated circuits 4042 included in the gate driver 112a and the gate driver 112b have a function of supplying a selection signal to the display region 113. The display region 113 functions in a manner similar to that of the display region 531 described in the above embodiment. The integrated circuits 4042 included in the data driver 111a and the data driver 111b have a function of supplying a video signal to the display region 113. The integrated circuits 4042 are mounted by a TAB (Tape Automated Bonding) method in a region different from a region surrounded by the sealant 4005 over the first substrate 4001.

Note that there is no particular limitation on the connection method of the integrated circuits 4042; a wire bonding method, a COG (Chip On Glass) method, a TCP (Tape Carrier Package) method, a COF (Chip On Film) method, or the like can be used.

Figure 17B:
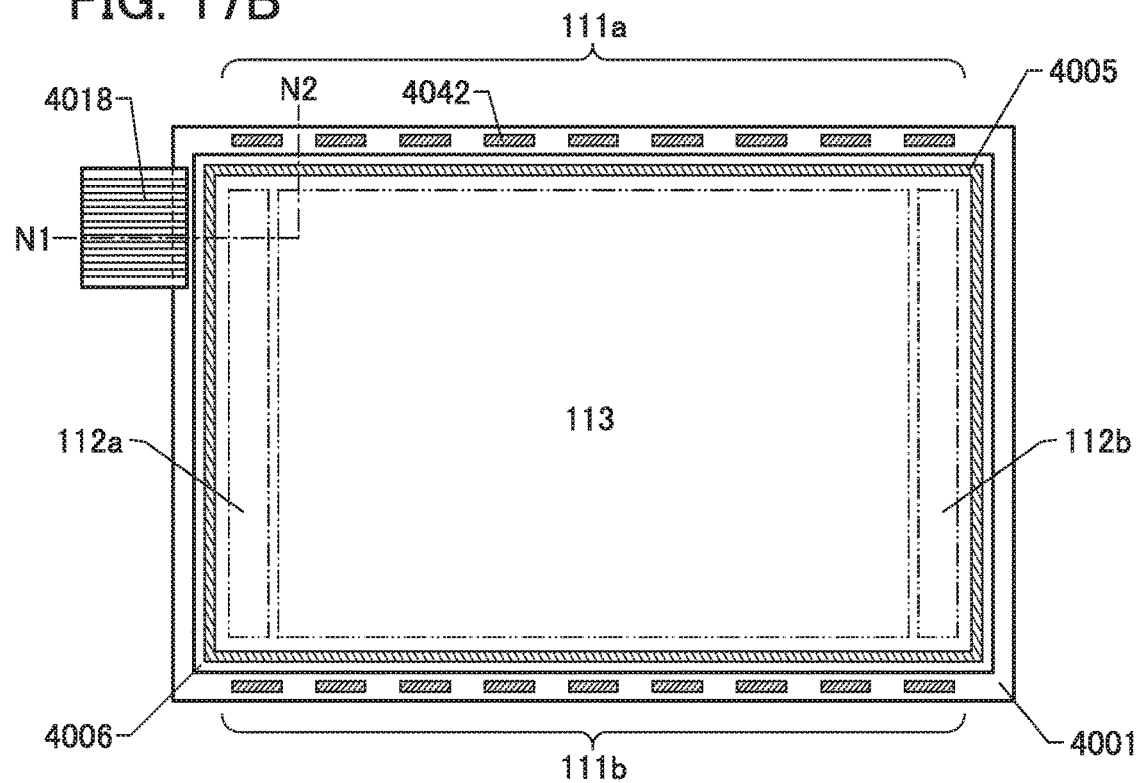

FIG. 17(B) illustrates an example of mounting the integrated circuits 4042 included in the data driver 11a and the data driver 111b by a COG method. With the use of the transistor described in the above embodiment, some or all of the driver circuits can be integrally formed over the same substrate as the display region 113, whereby a system-on-panel can be formed.

In the example illustrated in FIG. 17(B), the gate driver 112a and the gate driver 112b are formed over the same substrate as the display region 113. When the driver circuits are formed concurrently with the pixel circuit in the display region 113, the number of components can be reduced. Accordingly, the productivity can be increased.

In FIG. 17(B), the sealant 4005 is provided to surround the display region 113, the gate driver 112a, and the gate driver 112b over the first substrate 4001. The second substrate 4006 is provided over the display region 113, the gate driver 112a, and the gate driver 112b. Consequently, the display region 113, the gate driver 112a, and the gate driver 112b are sealed together with a display element by the first substrate 4001, the sealant 4005, and the second substrate 4006.

Although the data driver 111a and the data driver 111b are formed separately and mounted on the first substrate 4001 in the example illustrated in FIG. 17(B), one embodiment of the present invention is not limited to this structure. The gate driver may be formed separately and then mounted, or part of the data driver or part of the gate driver may be formed separately and then mounted.

In some cases, the display unit 160 encompasses a panel in which the display element is sealed, and a module in which an IC or the like including a controller is mounted on the panel.

The display unit and the gate driver provided over the first substrate each include a plurality of transistors.

A transistor included in a peripheral driver circuit and a transistor included in the pixel circuit of the display unit may have the same structure or different structures. Transistors included in the peripheral driver circuit may have the same structure or a combination of two or more kinds of structures. Similarly, transistors included in the pixel circuit may have the same structure or a combination of two or more kinds of structures.

FIG. 18(A) and FIG. 18(B) are cross-sectional views of a portion indicated by the chain line N1-N2 in FIG. 17(B). The display units 160 illustrated in FIG. 18(A) and FIG. 18(B) each include an electrode 4015, and the electrode 4015 is electrically connected to a terminal included in the FPC 4018 through an anisotropic conductive layer 4019. In FIG. 18(A) and FIG. 18(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display region 113 and the gate driver 112a provided over the first substrate 4001 include a plurality of transistors, and in FIG. 18(A) and FIG. 18(B), the transistor 4010 included in the display region 113 and the transistor 4011 included in the gate driver 112a are illustrated as examples. In the examples illustrated in FIG. 18(A) and FIG. 18(B), the transistor 4010 and the transistor 4011 are bottom-gate transistors.

In FIG. 18(A) and FIG. 18(B), the insulating layer 4112 is provided over the transistor 4010 and the transistor 4011. A partition wall 4510 is formed over the insulating layer 4112 in FIG. 18(B).

The transistor 4010 and the transistor 4011 are provided over an insulating layer 4102.

The transistor 4010 and the transistor 4011 each include an electrode 4017 formed over the insulating layer 4111. The electrode 4017 can function as a back gate electrode.

The display units 160 illustrated in FIG. 18(A) and FIG. 18(B) each include a capacitor 4020. The capacitor 4020 includes an electrode 4021 formed in the same step as a gate electrode of the transistor 4010, and an electrode formed in the same step as a source electrode and a drain electrode thereof. The electrodes overlap with each other with an insulating layer 4103 therebetween.

In general, the capacitance of a capacitor provided in a pixel portion of the display unit 160 is set in consideration of leakage current or the like of a transistor provided in the pixel portion so that charge can be held for a predetermined period. The capacitance of the capacitor may be set in consideration of off-state current of the transistor or the like.

The transistor 4010 provided in the display region 113 is electrically connected to the display element. FIG. 18(A) is an example of the display unit 160 using a liquid crystal element as a display element. In FIG. 18(A), a liquid crystal element 4013 that is a display element includes the first electrode layer 4030, a second electrode layer 4031, and a liquid crystal layer 4008. An insulating layer 4032 and an insulating layer 4033 having a function of alignment films are provided to sandwich the liquid crystal layer 4008. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided to adjust a distance (cell gap) between the first electrode layer 4030 and the second electrode layer 4031. Note that a spherical spacer may be used.

A black matrix (light-blocking layer), a coloring layer (color filter), an optical member (optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

In the display unit 160 illustrated in FIG. 18(A), a light-blocking layer 4132, a coloring layer 4131, and an insulating layer 4133 are provided between the substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stacked-layer film of films containing the materials of the coloring layer can also be used for the light-blocking layer. For example, a stacked-layer structure of a film containing a material used for a coloring layer that transmits light of a certain color and a film containing a material used for a coloring layer that transmits light of another color can be employed. The use of the same material for the coloring layer and the light-blocking layer is preferable, in which case the same apparatus can be used and the process can be simplified.

As examples of a material that can be used for the coloring layer, a metal material, a resin material, and a resin material containing a pigment or dye can be given. The light-blocking layer and the coloring layer may be formed by a method similar to the above-described methods for forming the layers. For example, an inkjet method may be used.

The display units 160 illustrated in FIG. 18(A) and FIG. 18(B) include the insulating layer 4111 and an insulating layer 4104. As the insulating layer 4111 and the insulating layer 4104, insulating layers through which an impurity element does not easily pass are used. A semiconductor layer of the transistor is sandwiched between the insulating layer 4111 and the insulating layer 4104, whereby entry of impurities from the outside can be prevented.

As the display element included in the display unit 160, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected from the anode side and electrons are injected from the cathode side to the EL layer. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. The carriers (electrons and holes) are recombined, and thus, a light-emitting organic compound forms an excited state, and light is emitted when the excited state returns to a ground state. Owing to such a mechanism, this light-emitting element is referred to as a current-excitation light-emitting element.

Besides the light-emitting compound, the EL layer may also include a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localized type light emission that utilizes inner-shell electron transition of metal ions. Note that the description is made here using an organic EL element as a light-emitting element.

In order that light emitted from the light-emitting element can be extracted, at least one of the pair of electrodes is transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

FIG. 18(B) is an example of the display unit 160 using a light-emitting element as a display element. A light-emitting element 4513 that is a display element is electrically connected to the transistor 4010 provided in the display region 113. The structure of the light-emitting element 4513 is a stacked-layer structure of the first electrode layer 4030, a light-emitting layer 4511, and the second electrode layer 4031; however, the structure is not limited thereto. The structure of the light-emitting element 4513 can be changed as appropriate depending on, for example, the direction in which light is extracted from the light-emitting element 4513.

The partition wall 4510 is formed using an organic insulating material or an inorganic insulating material. It is particularly preferable that a photosensitive resin material be used, and an opening portion be formed over the first electrode layer 4030 such that a side surface of the opening portion is formed to be an inclined surface having continuous curvature.

The light-emitting layer 4511 may be formed using a single layer or a plurality of layers stacked.

The emission color of the light-emitting element 4513 can be changed to white, red, green, blue, cyan, magenta, yellow, or the like depending on the material that forms the light-emitting layer 4511.

Examples of a method for achieving color display include a method in which the light-emitting element 4513 that emits white light is combined with a coloring layer and a method in which the light-emitting element 4513 that emits light of a different emission color is provided in each pixel. The former method is more productive than the latter method. On the other hand, the latter method, which requires separate formation of the light-emitting layer 4511 pixel by pixel, is less productive than the former method. However, the latter method can produce higher color purity of the emission color than the former method. In the latter method, the color purity can be further increased when the light-emitting element 4513 has a microcavity structure.

Note that the light-emitting layer 4511 may contain an inorganic compound such as quantum dots. For example, when used for the light-emitting layer, the quantum dots can serve as a light-emitting material.

A protective layer may be formed over the second electrode layer 4031 and the partition wall 4510 in order to prevent entry of oxygen, hydrogen, moisture, carbon dioxide, and the like into the light-emitting element 4513. For the protective layer, silicon nitride, silicon nitride oxide, aluminum oxide, aluminumnitride, aluminum oxynitride, aluminumnitride oxide, DLC (Diamond Like Carbon), or the like can be formed. In a space that is sealed by the first substrate 4001, the second substrate 4006, and the sealant 4005, a filler 4514 is provided for sealing. In this manner, it is preferable that packaging (sealing) be performed with a protective film (such as a laminate film or an ultraviolet curable resin film) or a cover material with high air-tightness and little degasification to prevent exposure to the outside air.

As the filler 4514, an ultraviolet curable resin or a thermosetting resin as well as an inert gas such as nitrogen or argon can be used; and PVC (polyvinyl chloride), an acrylic resin, polyimide, an epoxy resin, a silicone resin, PVB (polyvinyl butyral), EVA (ethylene vinyl acetate), or the like can be used. In addition, a drying agent may be contained in the filler 4514.

For the sealant 4005, a glass material such as a glass frit or a resin material such as a light curable resin, a thermosetting resin, or a curable resin that is cured at room temperature, such as a two-component-mixture-type resin, can be used. In addition, a drying agent may be contained in the sealant 4005.

In addition, if necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment that can reduce glare by diffusing reflected light with projections and depressions on a surface can be performed.

When the light-emitting element has a microcavity structure, light with high color purity can be extracted. Furthermore, when a microcavity structure and a color filter are used in combination, glare can be reduced and visibility of a displayed image can be increased.

The first electrode layer and the second electrode layer (also referred to as a pixel electrode layer, a common electrode layer, a counter electrode layer, or the like) for applying voltage to the display element have light-transmitting properties or light-reflecting properties, which depends on the direction in which light is extracted, the position where the electrode layer is provided, and the pattern structure of the electrode layer.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added can be used.

The first electrode layer 4030 and the second electrode layer 4031 can be formed using one or more kinds of metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and metal nitrides thereof.

The first electrode layer 4030 and the second electrode layer 4031 can be formed using a conductive composition including a conductive macromolecule (also referred to as a conductive polymer). As the conductive macromolecule, what is called a π-electron conjugated conductive macromolecule can be used. Examples include polyaniline or a derivative thereof, polypyrrole or a derivative thereof, polythiophene or a derivative thereof, and a copolymer of two or more kinds of aniline, pyrrole, and thiophene or a derivative thereof.

Since the transistor is easily broken owing to static electricity or the like, a protective circuit for protecting the driver circuit is preferably provided. The protective circuit is preferably formed using a nonlinear element.

This embodiment can be implemented in an appropriate combination with the structures described in the other embodiments and the like.

Embodiment 5

In this embodiment, examples of transistors that can be used for the display device 100 or the like of one embodiment of the present invention are described with reference to drawings.

The display device 100 or the like of one embodiment of the present invention can be fabricated by using a transistor with any of various modes, such as a bottom-gate transistor or a top-gate transistor. For example, a planar transistor may be used or a staggered transistor may be used. Therefore, a material used for a semiconductor layer or a transistor structure can be easily changed depending on the existing production line.

<Bottom-Gate Transistor>

FIG. 19(A1) is a cross-sectional view of a channel protective transistor 310 that is a type of bottom-gate transistor. In FIG. 19(A1), the transistor 310 is formed over a substrate 371. The transistor 310 includes an electrode 322 over the substrate 371 with an insulating layer 372 therebetween. Furthermore, a semiconductor layer 324 is provided over the electrode 322 with an insulating layer 326 therebetween. The electrode 322 can function as a gate electrode. The insulating layer 326 can function as a gate insulating layer.

An insulating layer 327 is provided over a channel formation region in the semiconductor layer 324. An electrode 344a and an electrode 344b which are partly in contact with the semiconductor layer 324 are provided over the insulating layer 326. The electrode 344a can function as one of a source electrode and a drain electrode. The electrode 344b can function as the other of the source electrode and the drain electrode. Part of the electrode 344a and part of the electrode 344b are formed over the insulating layer 327.

The insulating layer 327 can function as a channel protective layer. With the insulating layer 327 provided over the channel formation region, the semiconductor layer 324 can be prevented from being exposed at the time of forming the electrode 344a and the electrode 344b. Thus, the channel formation region in the semiconductor layer 324 can be prevented from being etched at the time of forming the electrode 344a and the electrode 344b. According to one embodiment of the present invention, a transistor with favorable electrical characteristics can be provided.

The transistor 310 includes an insulating layer 328 over the electrode 344a, the electrode 344b, and the insulating layer 327 and includes an insulating layer 329 over the insulating layer 328.

In the case where a semiconductor such as silicon is used for the semiconductor layer 324, a layer that functions as an n-type semiconductor or a p-type semiconductor is preferably provided between the semiconductor layer 324 and the electrode 344a and between the semiconductor layer 324 and the electrode 344b. The layer that functions as an n-type semiconductor or a p-type semiconductor can function as a source region or a drain region in the transistor.

The insulating layer 329 is preferably formed using a material that has a function of preventing or reducing diffusion of impurities into the transistor from the outside. The insulating layer 329 can be omitted as necessary.

A transistor 311 illustrated in FIG. 19(A2) is different from the transistor 310 in that an electrode 323 that can function as a back gate electrode is provided over the insulating layer 329. The electrode 323 can be formed using a material and a method similar to those of the electrode 322.

In general, a back gate electrode is formed using a conductive layer and positioned so that a channel formation region of a semiconductor layer is sandwiched between a gate electrode and the back gate electrode. Thus, the back gate electrode can function similarly to the gate electrode. The potential of the back gate electrode may be set equal to the potential of the gate electrode, or may be a ground potential (GND potential) or a given potential. Moreover, by changing the potential of the back gate electrode not in synchronization with but independently of the potential of the gate electrode, the threshold voltage of the transistor can be changed.

The electrode 322 and the electrode 323 can each function as a gate electrode. Thus, the insulating layer 326, the insulating layer 328, and the insulating layer 329 can each function as a gate insulating layer. The electrode 323 may be provided between the insulating layer 328 and the insulating layer 329.

In the case where one of the electrode 322 and the electrode 323 is referred to as a "gate electrode", the other is referred to as a "back gate electrode". For example, in the case where the electrode 323 in the transistor 311 is referred to as a "gate electrode", the electrode 322 is referred to as a "back gate electrode". In the case where the electrode 323 is used as a "gate electrode", the transistor 311 can be considered as a kind of top-gate transistor. In some case, one of the electrode 322 and the electrode 323 is referred to as a "first gate electrode", and the other is referred to as a "second gate electrode".

By providing the electrode 322 and the electrode 323 with the semiconductor layer 324 therebetween and setting the potential of the electrode 322 equal to the potential of the electrode 323, a region of the semiconductor layer 324 through which carriers flow is enlarged in the film thickness direction; thus, the number of transferred carriers is increased. Asa result, the on-state current of the transistor 311 is increased and the field-effect mobility is increased.

Therefore, the transistor 311 is a transistor having a high on-state current for its occupation area. That is, the occupation area of the transistor 311 can be small for a required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity or the like). When the back gate electrode is formed larger than the semiconductor layer such that the semiconductor layer is covered with the back gate electrode, the electric field blocking function can be enhanced.

Since the gate electrode and the back gate electrode each have a function of blocking an electric field from the outside, charges of charged particles and the like generated above and below the transistor do not influence the channel formation region in the semiconductor layer. As a result, degradation due to a stress test (e.g., an NGBT (Negative Gate Bias-Temperature) stress test where a negative voltage is applied to a gate (also referred to as "NBT" or "NBTS")) is inhibited. In addition, the gate electrode and the back gate electrode can block an electric field generated from the drain electrode so that the electric field do not influence the semiconductor layer. Thus, a change in the rising voltage of on-state current due to a change in drain voltage can be inhibited. Note that this effect is significant when a potential is applied to each of the gate electrode and the back gate electrode.

A change in threshold voltage of a transistor including a back gate electrode between before and after a PGBT (Positive Gate Bias-Temperature) stress test where a positive voltage is applied to a gate (also referred to as "PBT" or "PBTS") is smaller than that of a transistor including no back gate.

The BT stress test such as NGBT or PGBT is a kind of accelerated test and can evaluate, in a short time, a change by long-term use (i.e., a change over time) in characteristics of transistors. In particular, the amount of change in threshold voltage of the transistor between before and after the BT stress test is an important indicator when the reliability is examined. The smaller the amount of change in the threshold voltage between before and after the BT stress test is, the higher the reliability of the transistor becomes.

By providing the gate electrode and the back gate electrode and setting their potentials equal to each other, the change in threshold voltage is reduced. Accordingly, variation in electrical characteristics among a plurality of transistors is also reduced.

In the case where light enters from the back gate electrode side, when the back gate electrode is formed using a light-blocking conductive film, the light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 19(B1) illustrates a cross-sectional view of a channel-protective transistor 320 that is one of bottom-gate transistors. The transistor 320 has substantially the same structure as the transistor 310 but is different from the transistor 310 in that the insulating layer 327 covers the semiconductor layer 324. The semiconductor layer 324 is electrically connected to the electrode 344a in an opening portion formed by removing selected part of the insulating layer 327 which overlaps with the semiconductor layer 324. The semiconductor layer 324 is electrically connected to the electrode 344b in another opening portion formed by removing selected part of the insulating layer 327 which overlaps with the semiconductor layer 324. A region of the insulating layer 327 which overlaps with the channel formation region can function as a channel protective layer.

A transistor 321 illustrated in FIG. 19(B2) is different from the transistor 320 in that the electrode 323 that can function as a back gate electrode is provided over the insulating layer 329.

With the insulating layer 327, the semiconductor layer 324 can be prevented from being exposed at the time of forming the electrode 344a and the electrode 344b. Thus, the semiconductor layer 324 can be prevented from being thinned at the time of forming the electrode 344a and the electrode 344b.

The distance between the electrode 344a and the electrode 322 and the distance between the electrode 344b and the electrode 322 in the transistor 320 and the transistor 321 are larger than those in the transistor 310 and the transistor 311. Thus, the parasitic capacitance generated between the electrode 344a and the electrode 322 can be reduced. Moreover, the parasitic capacitance generated between the electrode 344b and the electrode 322 can be reduced.

According to one embodiment of the present invention, a transistor with favorable electrical characteristics can be provided.

A transistor 325 illustrated in FIG. 19(C1) is a channel-etching transistor that is one of bottom-gate transistors. In the transistor 325, the electrode 344a and the electrode 344b are formed without the insulating layer 327. Thus, part of the semiconductor layer 324 that is exposed at the time of forming the electrode 344a and the electrode 344b is etched in some cases. However, since the insulating layer 327 is not provided, the productivity of the transistor can be increased.

A transistor 326 illustrated in FIG. 19(C2) is different from the transistor 325 in that the electrode 323 that can function as a back gate electrode is provided over the insulating layer 329.

<Top-Gate Transistor>

FIG. 20(A1) illustrates a cross-sectional view of a transistor 330 that is a type of top-gate transistor. The transistor 330 includes the semiconductor layer 324 over the insulating layer 372, includes the electrode 344a in contact with part of the semiconductor layer 324 and the electrode 344b in contact with part of the semiconductor layer 324 over the semiconductor layer 324 and the insulating layer 372, includes the insulating layer 326 over the semiconductor layer 324, the electrode 344a, and the electrode 344b, and includes the electrode 322 over the insulating layer 326.

Since the electrode 322 does not overlap with the electrode 344a and the electrode 322 does not overlap with the electrode 344b in the transistor 330, the parasitic capacitance generated between the electrode 322 and the electrode 344a and the parasitic capacitance generated between the electrode 322 and the electrode 344b can be reduced. After the formation of the electrode 322, an impurity 255 is introduced into the semiconductor layer 324 using the electrode 322 as a mask, so that an impurity region can be formed in the semiconductor layer 324 in a self-aligned manner (see FIG. 20(A3)). According to one embodiment of the present invention, a transistor with favorable electrical characteristics can be provided.

The introduction of the impurity 255 can be performed with an ion implantation apparatus, an ion doping apparatus, or a plasma treatment apparatus.

As the impurity 255, for example, at least one kind of element of Group 13 elements and Group 15 elements can be used. In the case where an oxide semiconductor is used for the semiconductor layer 324, it is possible to use at least one kind of element of a rare gas, hydrogen, and nitrogen as the impurity 255.

A transistor 331 illustrated in FIG. 20(A2) is different from the transistor 330 in that the electrode 323 and an insulating layer 227 are included. The transistor 331 includes the electrode 323 formed over the insulating layer 372 and includes the insulating layer 227 formed over the electrode 323. The electrode 323 can function as a back gate electrode. Thus, the insulating layer 227 can function as a gate insulating layer. The insulating layer 227 can be formed using a material and a method similar to those of the insulating layer 326.

Like the transistor 311, the transistor 331 is a transistor having a high on-state current for its occupation area. That is, the occupation area of the transistor 331 can be small for a required on-state current. According to one embodiment of the present invention, the occupation area of a transistor can be reduced. Therefore, according to one embodiment of the present invention, a semiconductor device having a high degree of integration can be provided.

A transistor 340 illustrated as an example in FIG. 20(B1) is one of top-gate transistors. The transistor 340 is different from the transistor 330 in that the semiconductor layer 324 is formed after the formation of the electrode 344a and the electrode 344b. A transistor 341 illustrated as an example in FIG. 20(B2) is different from the transistor 340 in that the electrode 323 and the insulating layer 227 are included. In the transistor 340 and the transistor 341, part of the semiconductor layer 324 is formed over the electrode 344a and another part of the semiconductor layer 324 is formed over the electrode 344b.

Like the transistor 311, the transistor 341 is a transistor having a high on-state current for its occupation area. That is, the occupation area of the transistor 341 can be small for a required on-state current. According to one embodiment of the present invention, the occupation area of a transistor can be reduced. Therefore, according to one embodiment of the present invention, a semiconductor device having a high degree of integration can be provided.

A transistor 342 illustrated as an example in FIG. 21(A1) is one of top-gate transistors. The transistor 342 is different from the transistor 330 and the transistor 340 in that the electrode 344a and the electrode 344b are formed after the formation of the insulating layer 329. The electrode 344a and the electrode 344b are electrically connected to the semiconductor layer 324 in opening portions formed in the insulating layer 328 and the insulating layer 329.

Part of the insulating layer 326 that does not overlap with the electrode 322 is removed, and the impurity 255 is introduced into the semiconductor layer 324 using the electrode 322 and the insulating layer 326 that is left as a mask, so that an impurity region can be formed in the semiconductor layer 324 in a self-aligned manner (see FIG. 21(A3)). The transistor 342 includes a region where the insulating layer 326 extends beyond an end portion of the electrode 322. The semiconductor layer 324 in a region into which the impurity 255 is introduced through the insulating layer 326 when the impurity 255 is introduced into the semiconductor layer 324 has a lower impurity concentration than a region into which the impurity 255 is introduced without through the insulating layer 326. Thus, an LDD (Lightly Doped Drain) region is formed in a region of the semiconductor layer 324 that does not overlap with the electrode 322.

A transistor 343 illustrated in FIG. 21(A2) is different from the transistor 342 in that the electrode 323 is included. The transistor 343 includes the electrode 323 that is formed over the substrate 371 and overlaps with the semiconductor layer 324 with the insulating layer 372 therebetween. The electrode 323 can function as a back gate electrode.

As in a transistor 344 illustrated in FIG. 21(B1) and a transistor 345 illustrated in FIG. 21(B2), the insulating layer 326 in a region that does not overlap with the electrode 322 may be completely removed. Alternatively, as in a transistor 346 illustrated in FIG. 21(C1) and a transistor 347 illustrated in FIG. 21(C2), the insulating layer 326 may be left.

Also in the transistor 342 to the transistor 347, the impurity 255 is introduced into the semiconductor layer 324 using the electrode 322 as a mask after the formation of the electrode 322, so that an impurity region can be formed in the semiconductor layer 324 in a self-aligned manner. According to one embodiment of the present invention, a transistor with favorable electrical characteristics can be provided. Furthermore, according to one embodiment of the present invention, a semiconductor device having a high degree of integration can be provided.

[Substrate]

There is no great limitation on a material used for the substrate. The material is determined by the purpose in consideration of whether it has a light-transmitting property, heat resistance high enough to withstand heat treatment, or the like. For example, a glass substrate of barium borosilicate glass, aluminosilicate glass, or the like; a ceramic substrate; a quartz substrate; a sapphire substrate; or the like can be used. Alternatively, a semiconductor substrate, a flexible substrate, an attachment film, a base film, or the like may be used.

Examples of the semiconductor substrate include a semiconductor substrate using silicon, germanium, or the like as a material and a compound semiconductor substrate using silicon carbide, silicon germanium, gallium arsenide, indium phosphide, zinc oxide, or gallium oxide as a material. For the semiconductor substrate, a single-crystal semiconductor or a polycrystalline semiconductor may be used.

As the substrate, for example, a large-sized glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used. Thus, a large-sized display device can be manufactured. With the increase in substrate size, a larger number of display devices can be produced from one substrate, which can reduce production cost.

In order that the flexibility of the display unit 160 may be increased, a flexible substrate, an attachment film, a base film, or the like may be used as the substrate.

As the materials of the flexible substrate, the attachment film, the base film, and the like, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used.

When the above-described material is used for the substrate, a lightweight display device can be provided. Furthermore, when the above-described material is used for the substrate, a shock-resistant display device can be provided. Moreover, when the above-described material is used for the substrate, a display device that is less likely to be broken can be provided.

The flexible substrate used as the substrate preferably has a lower coefficient of linear expansion because deformation due to an environment is inhibited. For the flexible substrate used as the substrate, for example, a material whose coefficient of linear expansion is lower than or equal to $1\times10^{-3}$/K, lower than or equal to $5\times10^{-5}$/K, or lower than or equal to $1\times10^{-5}$/K is used. In particular, aramid is suitable for the flexible substrate because of its low coefficient of linear expansion.

[Conductive Layer]

As a conductive material that can be used for the gate, the source, and the drain of the transistor and conductive layers such as various wirings and electrodes included in the display device, a metal element selected from aluminum (Al), chromium (Cr), copper (Cu), silver (Ag), gold (Au), platinum (Pt), tantalum (Ta), nickel (Ni), titanium (Ti), molybdenum (Mo), tungsten (W), hafnium (Hf), vanadium (V), niobium (Nb), manganese (Mn), magnesium (Mg), zirconium (Zr), beryllium (Be), and the like; an alloy containing the above metal element as a component; an alloy containing the above metal elements in combination; or the like can be used. Alternatively, a semiconductor typified by polycrystalline silicon containing an impurity element such as phosphorus, or silicide such as nickel silicide may be used. There is no particular limitation on the formation method of the conductive material, and a variety of formation methods such as an evaporation method, a CVD method, a sputtering method, and a spin coating method can be employed.

A Cu—X alloy (X is Mn, Ni, Cr, Fe, Co, Mo, Ta, or Ti) may be used as the conductive material. A layer formed using a Cu—X alloy can be processed with a wet etching process, resulting in lower manufacturing cost. Alternatively, an aluminum alloy containing one or more elements selected from titanium, tantalum, tungsten, molybdenum, chromium, neodymium, and scandium may be used as the conductive material.

As the conductive material that can be used for the conductive layer, a conductive material containing oxygen, such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added, can be used. Moreover, a conductive material containing nitrogen, such as titanium nitride, tantalum nitride, or tungsten nitride, can be used. In addition, a stacked-layer structure in which a conductive material containing oxygen, a conductive material containing nitrogen, and a material containing the above-described metal element are combined as appropriate can be used for the conductive layer.

For example, the conductive layer may have a single layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, or a three-layer structure including a titanium layer, an aluminum layer stacked over the titanium layer, and a titanium layer stacked thereover.

A plurality of conductive layers formed using the above-described materials may be stacked and used. The conductive layer may have a stacked-layer structure in which a material containing the above-described metal element and a conductive material containing oxygen are combined, for example. Alternatively, a stacked-layer structure in which a material containing the above-described metal element and a conductive material containing nitrogen are combined may be used. Alternatively, a stacked-layer structure in which a material containing the above-described metal element, a conductive material containing oxygen, and a conductive material containing nitrogen are combined may be used.

For example, the conductive layer may have a three-layer structure in which a conductive layer containing copper is stacked over a conductive layer containing oxygen and at least one of indium and zinc, and a conductive layer containing oxygen and at least one of indium and zinc is stacked thereover. In that case, a side surface of the conductive layer containing copper is preferably covered with the conductive layer containing oxygen and at least one of indium and zinc. Alternatively, a plurality of conductive layers containing oxygen and at least one of indium and zinc may be stacked and used as the conductive layer, for example.

[Insulating Layer]

For each of the insulating layers, a single layer or a stack layer of materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. A material in which a plurality of materials selected from an oxide material, a nitride material, an oxynitride material, and a nitride oxide material are mixed may be used.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

It is particularly preferable that the insulating layer 372 and the insulating layer 329 be formed using an insulating material through which impurities are less likely to pass. For example, a single layer or a stacked layer of an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Examples of the insulating material through which impurities are less likely to pass include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material through which impurities are less likely to pass is used for the insulating layer 372, impurity diffusion from the substrate 371 side can be inhibited, and the reliability of the transistor can be improved. When the insulating material through which impurities are less likely to pass is used for the insulating layer 329, impurity diffusion from the above the insulating layer 329 can be inhibited, and the reliability of the transistor can be improved.

As the insulating layer, an insulating layer that can function as a planarization layer may be used. The insulating layer that can function as a planarization layer can be formed using an organic material having heat resistance, such as polyimide, an acrylic resin, a benzocyclobutene resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that a plurality of insulating layers formed of these materials may be stacked.

Note that the siloxane-based resin corresponds to a resin including a Si—O—Si bond formed using a siloxane-containing material as a starting material. The siloxane-based resin may include an organic group (e.g., an alkyl group or an aryl group) or a fluoro group as a substituent. In addition, the organic group may include a fluoro group.

A surface of the insulating layer or the like may be subjected to CMP treatment. By the CMP treatment, unevenness of a sample surface can be reduced, and coverage with an insulating layer or a conductive layer formed later can be increased.

[Semiconductor Layer]

As a semiconductor material used for the semiconductor layer of the transistor, either an amorphous semiconductor or a semiconductor having crystallinity (a microcrystalline semiconductor, a polycrystalline semiconductor, a single crystal semiconductor, or a semiconductor partly including crystal regions) may be used.

For example, silicon, germanium, or the like can be used as a semiconductor material used for the semiconductor layer of the transistor. Alternatively, a compound semiconductor such as silicon carbide, gallium arsenide, a metal oxide, or a nitride semiconductor, an organic semiconductor, or the like can be used.

For example, amorphous silicon can be used as a semiconductor material used for the transistor. In particular, amorphous silicon has high mass productivity and can be easily provided over a large-sized substrate. Note that amorphous silicon used in a transistor contains a large amount of hydrogen in general. Thus, amorphous silicon containing a large amount of hydrogen may be called "hydrogenated amorphous silicon" or "a-Si:H". Amorphous silicon can be formed at a temperature lower than that for polycrystalline silicon; thus, the highest temperature in a manufacturing process can be lowered. Therefore, low heat-resistance materials can be used for a substrate, a conductive layer, an insulating layer, and the like.

Alternatively, silicon having crystallinity, such as microcrystalline silicon, polycrystalline silicon, or single crystal silicon, can be used as a semiconductor material used for the transistor. In particular, polycrystalline silicon can be formed at a temperature lower than that for single crystal silicon and has higher field-effect mobility and higher reliability than amorphous silicon.

Furthermore, an oxide semiconductor, which is a kind of metal oxide, can be used as a semiconductor material used for the transistor. Typically, an oxide semiconductor containing indium, or the like can be used. An oxide semiconductor can achieve higher field-effect mobility and higher reliability than amorphous silicon. Moreover, an oxide semiconductor has high mass productivity and can be easily provided over a large-sized substrate.

An oxide semiconductor, which is a kind of metal oxide, has a wider bandgap and lower carrier density than silicon and thus is preferably used for the semiconductor layer of the transistor. The use of an oxide semiconductor for the semiconductor layer of the transistor is preferable because current flowing between the source and the drain of the transistor in an off state can be reduced.

An oxide semiconductor, which is a kind of metal oxide, preferably has an energy gap of 2 eV or more, further preferably 2.5 eV or more, still further preferably 3 eV or more. The use of such an oxide semiconductor having a wide energy gap can reduce the off-state current of the transistor.

An oxide semiconductor, which is a kind of metal oxide, preferably contains a material represented by an In-M-Zn-based oxide that contains at least indium, zinc, and M (a metal such as aluminum, titanium, gallium, germanium, yttrium, zirconium, lanthanum, cerium, tin, neodymium, or hafnium), for example. In order to reduce variations in electrical characteristics of the transistor using the oxide semiconductor, a stabilizer is preferably contained in addition to them.

Examples of the stabilizer include, as well as the metals that are described above as M, gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, lutetium, or the like can be given.

As a metal oxide forming the semiconductor layer, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used, for example.

Note that here, an In—Ga—Zn-based oxide means an oxide containing In, Ga, and Zn as its main components and there is no limitation on the ratio of In to Ga and Zn. Furthermore, a metal element other than In, Ga, and Zn may be contained.

[Methods for Forming Layers]

The insulating layers, the semiconductor layer, the conductive layers used for forming electrodes and wirings, and the like can be formed by a sputtering method, a chemical vapor deposition (CVD) method, a vacuum evaporation method, a pulsed laser deposition (PLD) method, an atomic layer deposition (ALD) method, or the like. As the CVD method, a plasma-enhanced chemical vapor deposition (PECVD) method or a thermal CVD method may be used. As the thermal CVD method, for example, a metal organic chemical vapor deposition (MOCVD: Metal Organic CVD) method may be used.

Alternatively, the insulating layers, the semiconductor layer, the conductive layers used for forming electrodes and wirings, and the like that form the display device may be formed by a method such as spin coating, dipping, spray coating, ink-jetting, dispensing, screen printing, offset printing, slit coating, roll coating, curtain coating, and knife coating.

A PECVD method can provide a high-quality film at a relatively low temperature. With the use of a film formation method that does not use plasma at the time of film formation, such as an MOCVD method, an ALD method, or a thermal CVD method, damage is not easily caused on a formation surface. A wiring, an electrode, an element (e.g., a transistor or a capacitor), or the like included in a semiconductor device might be charged up by receiving charges from plasma, for example. In that case, accumulated charges might break the wiring, electrode, element, or the like included in the semiconductor device. By contrast, in the case of a film formation method not using plasma, such plasma damage is not caused; thus, the yield of semiconductor devices can be increased. Since plasma damage during film formation is not caused, a film with few defects can be obtained.

Unlike a film formation method in which particles ejected from a target or the like are deposited, a CVD method and an ALD method are film formation methods in which a film is formed by reaction at a surface of an object. Thus, a CVD method and an ALD method are film formation methods that are less likely to be influenced by the shape of an object and thus have favorable step coverage. In particular, an ALD method can provide excellent step coverage and excellent thickness uniformity and thus is suitable for the case of covering a surface of an opening with a high aspect ratio, for example. On the other hand, an ALD method has a relatively low deposition rate; thus, it is sometimes preferable to combine an ALD method with another film formation method with a high deposition rate, such as a CVD method.

A CVD method and an ALD method enable control of the composition of a film to be obtained by using a flow rate ratio of source gases. For example, by a CVD method or an ALD method, a film with a certain composition can be formed depending on the flow rate ratio of source gases. Moreover, by changing the flow rate ratio of source gases during film formation by a CVD method or an ALD method, a film whose composition is continuously changed can be formed. In the case where a film is formed while changing the flow rate ratio of source gases, compared with the case where a film is formed using a plurality of deposition chambers, the time it takes for the film formation can be reduced by the amount of time taken for transfer and pressure adjustment. Thus, semiconductor devices can be manufactured with improved productivity in some cases.

When the layers (thin films) that form the display device are processed, a photolithography method or the like can be used for the processing. Alternatively, island-shaped layers may be formed by a film formation method using a blocking mask. Alternatively, a nanoimprinting method, a sandblasting method, a lift-off method, or the like may be used for the processing of the layers. As a photolithography method, a method in which a resist mask is formed over a layer (thin film) to be processed, part of the layer (thin film) is selected and removed by using the resist mask as a mask, and the resist mask is removed, and a method in which a photosensitive layer is formed, and then the layer is exposed to light and developed to be processed into a desired shape are given.

In the case of using light in the photolithography method, an i-line (a wavelength of 365 nm), a g-line (a wavelength of 436 nm), and an h-line (a wavelength of 405 nm), or combined light of them can be used for light exposure. Besides, ultraviolet light, KrF laser light, ArF laser light, or the like can be used. Light exposure may be performed by liquid immersion light exposure technique. As the light used for the light exposure, extreme ultra-violet light (EUV) or X-rays may be used. Instead of the light used for the light exposure, an electron beam can be used. It is preferable to use extreme ultra-violet light, X-rays, or an electron beam because extremely minute processing can be performed. Note that in the case of performing light exposure by scanning of a beam such as an electron beam, a photomask is not needed.

For removal (etching) of the layers (thin films), a dry etching method, a wet etching method, a sandblasting method, or the like can be used. Alternatively, the etching methods may be used in combination.

This embodiment can be implemented in an appropriate combination with the structures described in the other embodiments and the like.

Embodiment 6

In this embodiment, a structure example of an OS transistor that can be used in the display device or the like of one embodiment of the present invention is described.

<Structure Example of Transistor>

FIG. 22(A) is a top view illustrating a structure example of a transistor. FIG. 22(B) is a cross-sectional view along the line X1-X2 in FIG. 22(A), and FIG. 22(C) is a cross-sectional view along the line Y1-Y2. Here, in some cases, the direction of the line X1-X2 is referred to as a channel length direction and the direction of the line Y1-Y2 as a channel width direction. FIG. 22(B) is a diagram illustrating a cross-sectional structure of the transistor in the channel length direction, and FIG. 22(C) is a diagram illustrating a cross-sectional structure of the transistor in the channel width direction. Note that to clarify the device structure, some components are omitted in FIG. 22(A).

The semiconductor device of one embodiment of the present invention includes an insulating layer 812 to an insulating layer 820, a metal oxide film 821 to a metal oxide film 824, and a conductive layer 850 (a conductive layer 850a and a conductive layer 850b) to a conductive layer 853 (a conductive layer 853a and a conductive layer 853b). A transistor 801 is formed on an insulating surface. FIG. 22 illustrates the case where the transistor 801 is formed over an insulating layer 811. The transistor 801 is covered with the insulating layer 818 and the insulating layer 819.

Note that the insulating layers, the metal oxide films, the conductive layers, and the like that constitute the transistor 801 may be a single layer or may be a stack including a plurality of films. They can be formed by a variety of film formation methods such as a sputtering method, a molecular beam epitaxy method (MBE method), a pulsed laser ablation method (PLA method), a CVD method, and an atomic layer deposition method (ALD method). Note that examples of a CVD method include a plasma CVD method, a thermal CVD method, and a metal organic CVD method.

The conductive layer 850 includes a region that functions as a gate electrode of the transistor 801. The conductive layer 851 and the conductive layer 852 include regions that function as a source electrode and a drain electrode. The conductive layer 853 includes a region that functions as a back gate electrode. The insulating layer 817 includes a region that functions as a gate insulating layer on the gate electrode (front gate electrode) side, and an insulating layer formed of a stack of the insulating layers 814 to 816 includes a region that functions as a gate insulating layer on the back gate electrode side. The insulating layer 818 functions as an interlayer insulating layer. The insulating layer 819 functions as a barrier layer.

The metal oxide film 821 to the metal oxide film 824 are collectively referred to as an oxide layer 830. As illustrated in FIG. 22(B) and FIG. 22(C), the oxide layer 830 includes a region where the metal oxide film 821, the metal oxide film 822, and the metal oxide film 824 are stacked in this order. In addition, a pair of metal oxide films 823 are positioned over the conductive layer 851 and the conductive layer 852. When the transistor 801 is on, a channel formation region is mainly formed in the metal oxide film 822 of the oxide layer 830.

The metal oxide film 824 covers the metal oxide film 821 to the metal oxide film 823, the conductive layer 851, and the conductive layer 852. The insulating layer 817 is positioned between the metal oxide film 823 and the conductive layer 850. The conductive layer 851 and the conductive layer 852 each include a region that overlaps with the conductive layer 850 with the metal oxide film 823, the metal oxide film 824, and the insulating layer 817 therebetween.

The conductive layer 851 and the conductive layer 852 are formed from a hard mask for forming the metal oxide film 821 and the metal oxide film 822. Thus, the conductive layer 851 and the conductive layer 852 do not include a region that is in contact with the side surfaces of the metal oxide film 821 and the metal oxide film 822. For example, the metal oxide film 821, the metal oxide film 822, the conductive layer 851, and the conductive layer 852 can be formed through the following steps. First, a conductive film is formed over two stacked metal oxide films. This conductive film is processed (etched) into a desired shape so that a hard mask is formed. With the use of the hard mask, the shapes of the two metal oxide films are processed so that the metal oxide film 821 and the metal oxide film 822 that are stacked are formed. Next, the hard mask is processed into a desired shape so that the conductive layer 851 and the conductive layer 852 are formed.

Examples of insulating materials used for the insulating layer 811 to the insulating layer 818 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layer 811 to the insulating layer 818 are formed of a single layer or a stack containing these insulating materials. The layers forming the insulating layer 811 to the insulating layer 818 may contain a plurality of insulating materials.

Note that in this specification and the like, oxynitride refers to a compound in which the oxygen content is higher than the nitrogen content, and nitride oxide refers to a compound in which the nitrogen content is higher than the oxygen content.

In order to suppress an increase in oxygen vacancies in the oxide layer 830, the insulating layer 816 to the insulating layer 818 are preferably insulating layers containing oxygen. Further preferably, the insulating layer 816 to the insulating layer 818 are formed of an insulating film from which oxygen is released by heating (hereinafter, also referred to as an "insulating film containing excess oxygen"). Supplying oxygen from the insulating film containing excess oxygen to the oxide layer 830 can compensate for the oxygen vacancies in the oxide layer 830.

The reliability and electrical characteristics of the transistor 801 can be improved.

The insulating layer containing excess oxygen is a film from which oxygen molecules at more than or equal to $1.0 \times 10^{18}$ [molecules/cm$^3$] are released in TDS (Thermal Desorption Spectroscopy) at a film surface temperature of higher than or equal to 100° C. and lower than or equal to 700° C., or higher than or equal to 100° C. and lower than or equal to 500° C. Note that the number of released oxygen molecules is preferably $3.0 \times 10^{20}$ molecules/cm$^3$ or more.

The insulating film containing excess oxygen can be formed by performing treatment for adding oxygen to an insulating film. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used.

The hydrogen concentrations of the insulating layer 812 to the insulating layer 819 are preferably reduced so that an increase in hydrogen concentration of the oxide layer 830 is prevented. In particular, the hydrogen concentrations of the insulating layer 813 to the insulating layer 818 are preferably reduced. Specifically, the hydrogen concentrations are lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

The above-mentioned hydrogen concentrations are values measured by secondary ion mass spectrometry (SIMS).

The transistor 801 preferably has a structure in which the oxide layer 830 is surrounded by an insulating layer with oxygen and hydrogen barrier properties (hereinafter, also referred to as a barrier layer). Employing such a structure can prevent release of oxygen from the oxide layer 830 and entry of hydrogen into the oxide layer 830. The reliability and electrical characteristics of the transistor 801 can be improved.

For example, the insulating layer 819 functions as a barrier layer and at least one of the insulating layer 811, the insulating layer 812, and the insulating layer 814 functions as a barrier layer. The barrier layer can be formed of a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layer 811 to the insulating layer 818 is described. In this example, each of the insulating layer 811, the insulating layer 812, the insulating layer 815, and the insulating layer 819 functions as a barrier layer. The insulating layer 816 to the insulating layer 818 are oxide layers containing excess oxygen. The insulating layer 811 is silicon nitride, the insulating layer 812 is aluminum oxide, and the insulating layer 813 is silicon oxynitride. The insulating layer 814 to the insulating layer 816 that function as the gate insulating layer on the back gate electrode side are a stack of silicon oxide, aluminum oxide, and silicon oxide. The insulating layer 817 that functions as the gate insulating layer on the front gate side is silicon oxynitride. The insulating layer 818 that functions as the interlayer insulating layer is silicon oxide. The insulating layer 819 is aluminum oxide.

Examples of conductive materials used for the conductive layer 850 to the conductive layer 853 include a metal such as molybdenum, titanium, tantalum, tungsten, aluminum, copper, chromium, neodymium, and scandium; and a metal nitride containing the above metal as its component (tantalum nitride, titanium nitride, molybdenum nitride, and tungsten nitride). It is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A structure example of the conductive layer 850 to the conductive layer 853 is described. The conductive layer 850 is a single layer of tantalum nitride or tungsten. Alternatively, the conductive layer 850 is a stack of tantalum nitride, tantalum, and tantalum nitride. The conductive layer 851 is a single layer of tantalum nitride or a stack of tantalum nitride and tungsten. The structure of the conductive layer 852 is the same as that of the conductive layer 851. The conductive layer 853 is a stack of tantalum nitride and tungsten.

In order to reduce the off-state current of the transistor 801, the energy gap of the metal oxide film 822 is preferably large, for example. The energy gap of the metal oxide film 822 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide layer 830 preferably exhibits crystallinity. At least the metal oxide film 822 preferably exhibits crystallinity. With the above-described structure, the transistor 801 having favorable reliability and electrical characteristics can be achieved.

Examples of the oxide that can be used for the metal oxide film 822 include an In—Ga oxide, an In—Zn oxide, and an In-M-Zn oxide (M is Al, Ga, Y, or Sn). The metal oxide film 822 is not limited to an oxide layer containing indium. The metal oxide film 822 can be formed using a Zn—Sn oxide, a Ga—Sn oxide, or a Zn—Mg oxide, for example. The metal oxide film 821, the metal oxide film 823, and the metal oxide film 824 can also be formed using an oxide that is similar to that used for the metal oxide film 822. In particular, each of the metal oxide film 821, the metal oxide film 823, and the metal oxide film 824 can be formed using a Ga oxide.

When an interface state is formed at the interface between the metal oxide film 822 and the metal oxide film 821, a channel formation region is formed also in a region in the vicinity of the interface, which causes a change in threshold voltage of the transistor 801. It is therefore preferred that the metal oxide film 821 contain at least one of the metal elements contained in the metal oxide film 822 as its component. Accordingly, an interface state is less likely to be formed at the interface between the metal oxide film 822 and the metal oxide film 821, and variations in electrical characteristics such as threshold voltage of the transistor 801 can be reduced.

The metal oxide film 824 preferably contains at least one of the metal elements contained in the metal oxide film 822 as its component. Thus, interface scattering is less likely to occur at the interface between the metal oxide film 822 and the metal oxide film 824, and carrier transfer is less likely to be inhibited; hence, the field-effect mobility of the transistor 801 can be increased.

It is preferred that the metal oxide film 822 have the highest carrier mobility among the metal oxide film 821 to the metal oxide film 824. Accordingly, a channel can be formed in the metal oxide film 822 that is provided in a position apart from the insulating layer 816 and the insulating layer 817.

For example, in a metal oxide containing In, such as an In-M-Zn oxide, carrier mobility can be increased by an increase in the In content. In the In-M-Zn oxide, the s orbital of heavy metal mainly contributes to carrier transfer, and a larger number of s orbitals overlap by increasing the indium content; thus, an oxide having a high indium content has higher mobility than an oxide having a low indium content. Consequently, with the use of an oxide having a high indium content for the metal oxide film, carrier mobility can be increased.

For this reason, for example, the metal oxide film 822 is formed using an In—Ga—Zn oxide, and the metal oxide film 821 and the metal oxide film 823 are formed using a Ga oxide. For example, when the metal oxide film 821 to the metal oxide film 823 are formed using an In-M-Zn oxide, the In content of the metal oxide film 822 is made higher than the In content of the metal oxide film 821 and the metal oxide film 823. When the In-M-Zn oxide is formed by a sputtering method, the In content can be changed by changing the atomic ratio of the metal elements of a target.

For example, the atomic ratio In:M:Zn of the metal elements of a target used for forming the metal oxide film 822 is preferably 1:1:1, 3:1:2, or 4:2:4.1. For example, the atomic ratio In:M:Zn of the metal elements of a target used for forming the metal oxide film 821 and the metal oxide film 823 is preferably 1:3:2 or 1:3:4. The atomic ratio of an In-M-Zn oxide formed using a target of In:M:Zn=4:2:4.1 is approximately In:M:Zn=4:2:3.

In order to provide the transistor 801 with stable electrical characteristics, it is preferable to reduce the concentration of impurities in the oxide layer 830. In the metal oxide, hydrogen, nitrogen, carbon, silicon, and a metal element other than its main component are impurities. For example, hydrogen and nitrogen contribute to formation of donor states, thereby increasing the carrier density. In addition, silicon and carbon contribute to formation of impurity states in the metal oxide. The impurity states serve as traps and might cause the electrical characteristics of the transistor to deteriorate.

For example, the oxide layer 830 includes a region where the silicon concentration is lower than or equal to $2 \times 10^{18}$ atoms/cm$^3$, preferably lower than or equal to 2×10$^{17}$ atoms/cm$^3$. The same applies to the carbon concentration of the oxide layer 830.

The oxide layer 830 includes a region where the concentration of an alkali metal is lower than or equal to 1×10$^{18}$ atoms/cm$^3$, preferably lower than or equal to 2×10$^{16}$ atoms/cm$^3$. The same applies to the concentration of an alkaline earth metal in the metal oxide film 822.

The oxide layer 830 includes a region where the hydrogen concentration is lower than 1×10$^{20}$ atoms/cm$^3$, preferably lower than 1×10$^{19}$ atoms/cm$^3$, further preferably lower than 5×10$^{18}$ atoms/cm$^3$, still further preferably lower than 1×10$^{18}$ atoms/cm$^3$.

The above-mentioned concentrations of the impurities in the oxide layer 830 are values obtained by SIMS.

In the case where the metal oxide film 822 contains oxygen vacancies, donor states are sometimes formed by entry of hydrogen into sites of oxygen vacancies. As a result, the oxygen vacancies become a factor in decreasing the on-state current of the transistor 801. Note that sites of oxygen vacancies become more stable by entry of oxygen than by entry of hydrogen. Thus, by reducing oxygen vacancies in the metal oxide film 822, the on-state current of the transistor 801 can be increased in some cases. Consequently, preventing entry of hydrogen into sites of oxygen vacancies by reducing hydrogen in the metal oxide film 822 is effective for on-state current characteristics.

Hydrogen contained in a metal oxide reacts with oxygen bonded to a metal atom to be water, and thus forms an oxygen vacancy in some cases. Entry of hydrogen into the oxygen vacancy sometimes generates an electron serving as a carrier. Furthermore, in some cases, bonding of part of hydrogen to oxygen bonded to a metal atom generates an electron serving as a carrier. Since the channel formation region is provided in the metal oxide film 822, when hydrogen is contained in the metal oxide film 822, the transistor 801 is likely to have normally-on characteristics. Accordingly, it is preferred that hydrogen in the metal oxide film 822 be reduced as much as possible.

Note that the metal oxide film 822 may have an n-type region 822*n* in a region in contact with the conductive layer 851 or the conductive layer 852. The region 822*n* is formed by a phenomenon in which oxygen in the metal oxide film 822 is extracted by the conductive layer 851 or the conductive layer 852, a phenomenon in which a conductive material in the conductive layer 851 or the conductive layer 852 is combined with an element in the metal oxide film 822, or the like. When the region 822*n* is formed, the contact resistance between the conductive layer 851 or the conductive layer 852 and the metal oxide film 822 can be reduced.

FIG. 22 illustrates an example where the oxide layer 830 has a four-layer structure; however, one embodiment of the present invention is not limited to this. For example, the oxide layer 830 can have a three-layer structure without the metal oxide film 821 or the metal oxide film 823. Alternatively, one or a plurality of metal oxide films that are similar to the metal oxide film 821 to the metal oxide film 824 can be provided at any two or more of the following positions: between given layers in the oxide layer 830, over the oxide layer 830, and under the oxide layer 830.

Figure 23:
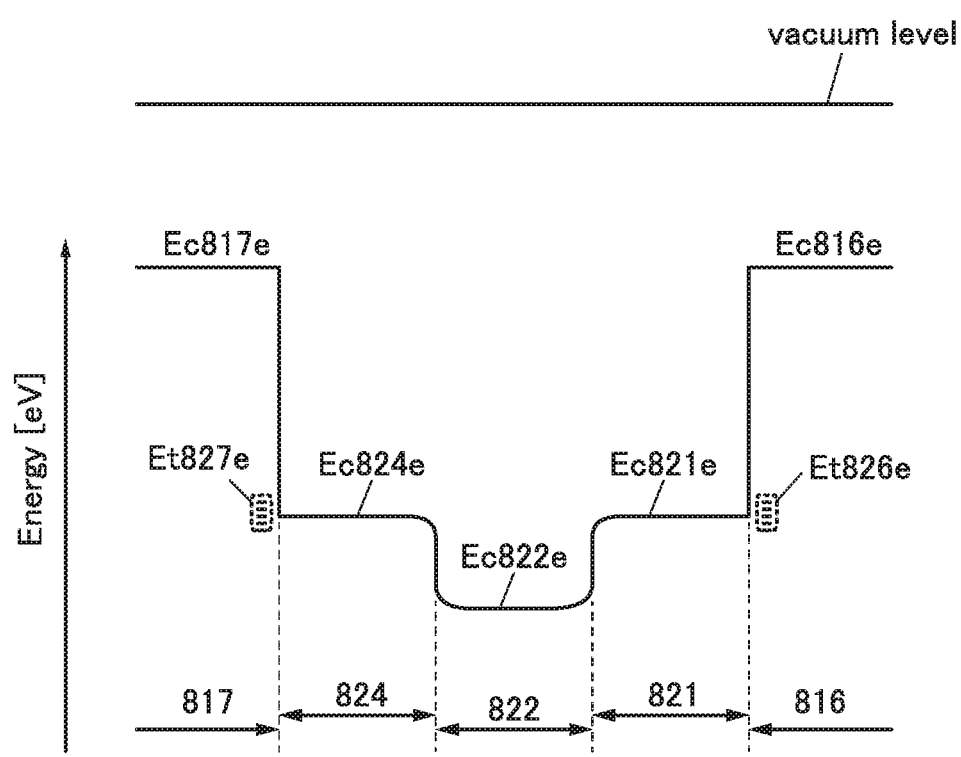
FIG. 23 A diagram showing an energy band structure.

Effects obtained from the stack of the metal oxide film 821, the metal oxide film 822, and the metal oxide film 824 are described with reference to FIG. 23. FIG. 23 is a schematic diagram of the energy band structure of the channel formation region in the transistor 801.

In FIG. 23, Ec816*e*, Ec821*e*, Ec822*e*, Ec824*e*, and Ec817*e* indicate the energy of the conduction band minimums of the insulating layer 816, the metal oxide film 821, the metal oxide film 822, the metal oxide film 824, and the insulating layer 817, respectively.

The vertical axis in FIG. 25 represents the level of energy (Energy). Here, the energy difference between the vacuum level and the conduction band minimum (also referred to as "electron affinity") is a value obtained by subtracting an energy gap from the energy difference between the vacuum level and the valence band maximum (also referred to as an ionization potential). Note that the energy gap can be measured using a spectroscopic ellipsometer (UT-300, HORIBA JOBIN YVON S.A.S.). Moreover, the energy difference between the vacuum level and the valence band maximum can be measured using an ultraviolet photoelectron spectroscopy (UPS) device (VersaProbe, ULVAC-PHI, Inc.).

Since the insulating layer 816 and the insulating layer 817 are insulators, Ec816*e* and Ec817*e* are closer to the vacuum level than Ec821*e*, Ec822*e*, and Ec824*e* (the insulating layers 816 and 817 have low electron affinities).

The metal oxide film 822 has a higher electron affinity than the metal oxide film 821 and the metal oxide film 824. For example, the difference in electron affinity between the metal oxide film 822 and the metal oxide film 821 and the difference in electron affinity between the metal oxide film 822 and the metal oxide film 824 are each greater than or equal to 0.07 eV and less than or equal to 1.3 eV. The differences in electron affinity are preferably greater than or equal to 0.1 eV and less than or equal to 0.7 eV, further preferably greater than or equal to 0.15 eV and less than or equal to 0.4 eV Note that the electron affinity is an energy difference between the vacuum level and the conduction band minimum.

When voltage is applied to the gate electrode (the conductive layer 850) of the transistor 801, a channel is mainly formed in the metal oxide film 822 having the highest electron affinity among the metal oxide film 821, the metal oxide film 822, and the metal oxide film 824.

An indium gallium oxide has a low electron affinity and a high oxygen-blocking property. Therefore, the metal oxide film 824 preferably contains an indium gallium oxide. The gallium atomic ratio [Ga/(In+Ga)] is, for example, higher than or equal to 70%, preferably higher than or equal to 80%, further preferably higher than or equal to 90%.

A mixed region of the metal oxide film 821 and the metal oxide film 822 sometimes exists between the metal oxide film 821 and the metal oxide film 822. Moreover, a mixed region of the metal oxide film 824 and the metal oxide film 822 sometimes exists between the metal oxide film 824 and the metal oxide film 822. Because the mixed regions have a lower interface state density, a region in which the metal oxide film 821, the metal oxide film 822, and the metal oxide film 824 are stacked has a band structure where the energy in the vicinity of each interface is changed continuously (also referred to as continuous junction).

Electrons transfer mainly through the metal oxide film 822 in the oxide layer 830 having such an energy band structure. Thus, even when a state exists at the interface between the metal oxide film 821 and the insulating layer 816 or at the interface between the metal oxide film 824 and the insulating layer 817, electron transfer in the oxide layer 830 is less likely to be inhibited by these interface states; hence, the on-state current of the transistor 801 can be increased.

In addition, as shown in FIG. 23, trap states Et826*e* and Et827*e* due to impurities or defects might be formed in the vicinity of the interface between the metal oxide film 821 and the insulating layer 816 and the vicinity of the interface between the metal oxide film 824 and the insulating layer 817, respectively; however, the metal oxide film 822 can be made apart from the trap states Et826e and Et827e owing to the existence of the metal oxide film 821 and the metal oxide film 824.

Note that when the difference between Ec821e and Ec822e is small, an electron in the metal oxide film 822 might reach the trap state Et826e by passing over the energy difference. When the electron is trapped at the trap state Et826e, negative fixed charge is generated at the interface with the insulating film, causing the threshold voltage of the transistor to be shifted in the positive direction. The same applies to the case where the energy difference between Ec822e and Ec824e is small.

In order to reduce a change in threshold voltage of the transistor 801 and make the electrical characteristics of the transistor 801 favorable, the difference between Ec821e and Ec822e and the difference between Ec824e and Ec822e are each preferably greater than or equal to 0.1 eV, further preferably greater than or equal to 0.15 eV.

Note that the transistor 801 can alternatively have a structure without a back gate electrode.

<Example of Stacked-Layer Structure>

Next, a structure of a semiconductor device including a stack of an OS transistor and another transistor is described.

Figure 24:
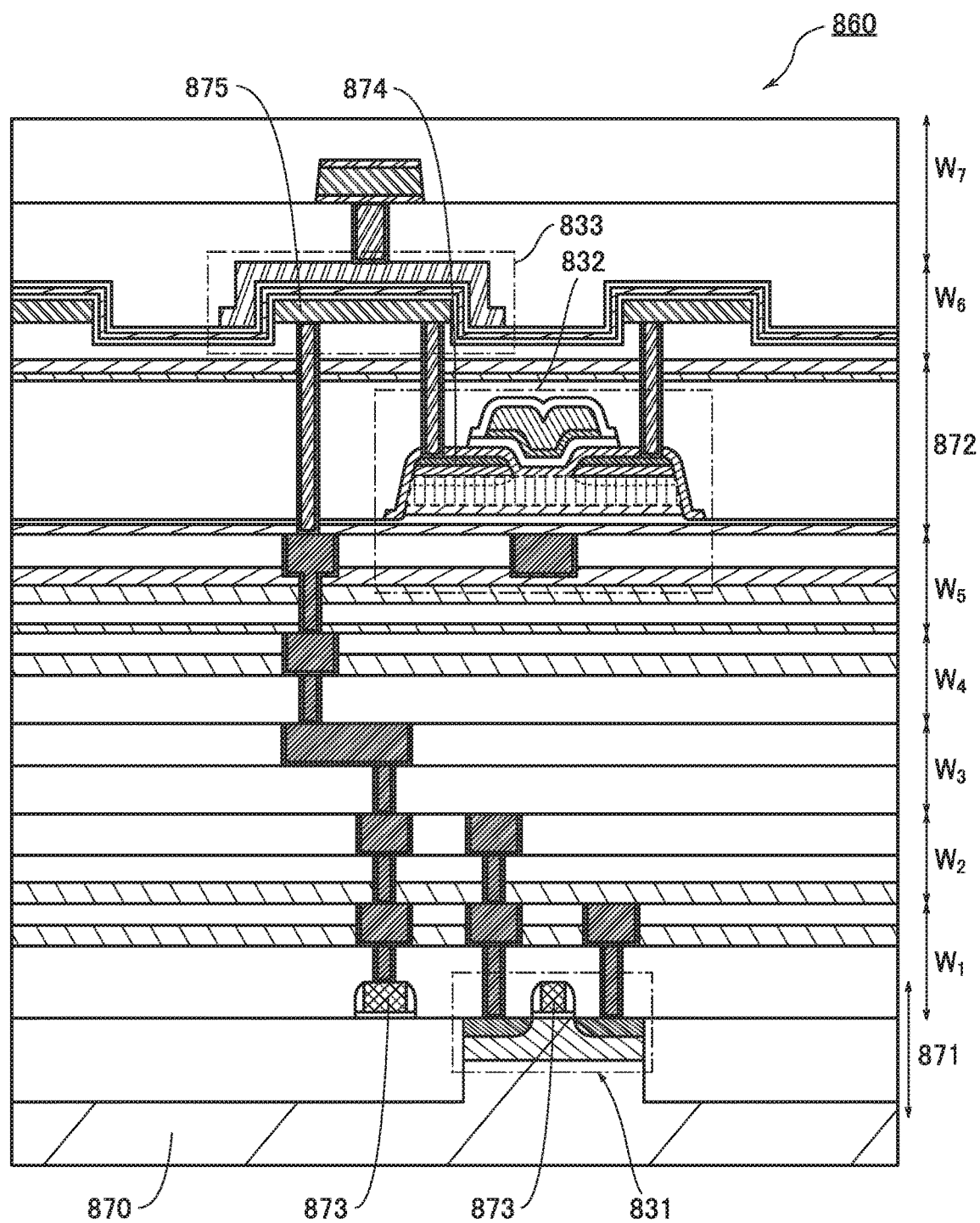
FIG. 24 A diagram illustrating a structure example of a semiconductor device.

FIG. 24 illustrates an example of a stacked-layer structure of a semiconductor device 860 in which a transistor 831 that is a Si transistor, a transistor 832 that is an OS transistor, and a capacitor 833 are stacked.

The semiconductor device 860 includes a stack of a CMOS layer 871, wiring layers Wi to W5, a transistor layer 872, and wiring layers W6 and W7.

The transistor 831 is provided in the CMOS layer 871. A channel formation region of the transistor 831 is provided in a single crystal silicon wafer 870. A gate electrode 873 of the transistor 831 is connected to one electrode 875 of the capacitor 833 through the wiring layers Wi to W5.

The transistor 832 is provided in the transistor layer 872. In FIG. 24, the transistor 832 has a structure similar to that of the transistor 801 (FIG. 22). An electrode 874 corresponding to one of a source and a drain of the transistor 832 is connected to the one electrode 875 of the capacitor 833. Note that FIG. 24 illustrates the case where the transistor 832 includes its back gate electrode in the wiring layer W5. The capacitor 833 is formed in the wiring layer W6.

The OS transistor and other elements are stacked in the above manner, whereby the circuit area can be reduced.

This embodiment can be implemented in an appropriate combination with the structures described in the other embodiments and the like.

Embodiment 7

In this embodiment, electronic devices to which the display device of one embodiment of the present invention can be applied are described with reference to FIG. 25.

Examples of the electronic devices are described with reference to FIG. 25. According to one embodiment of the present invention, a display device having an increased size and/or increased definition can have a favorable display quality and high visibility. Thus, the display device can be suitably used for a television device, a digital signage, a portable electronic device, a wearable electronic device (wearable device), an e-book reader, and the like. In addition, the display device can be suitably used for a VR (Virtual Reality) device, an AR (Augmented Reality) device, and the like.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display unit. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radioactive rays, flow rate, humidity, gradient, oscillation, smell, or infrared rays).

The electronic device of one embodiment of the present invention can have a variety of functions. For example, the electronic device can have a function of displaying a variety of data (e.g., a still image, a moving image, and a text image) on a display unit; a touch panel function; a function of displaying a calendar, date, time, or the like; a function of executing a variety of software (programs); a wireless communication function; a function of reading out a program or data stored in a recording medium; and the like.

Furthermore, an electronic device including a plurality of display units can have a function of displaying image data mainly on one display unit while displaying text data mainly on another display unit, a function of displaying a three-dimensional image by displaying images on a plurality of display units with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display unit, or the like. Note that functions of the electronic device of one embodiment of the present invention are not limited thereto, and the electronic devices can have a variety of functions.

Figure 25A:
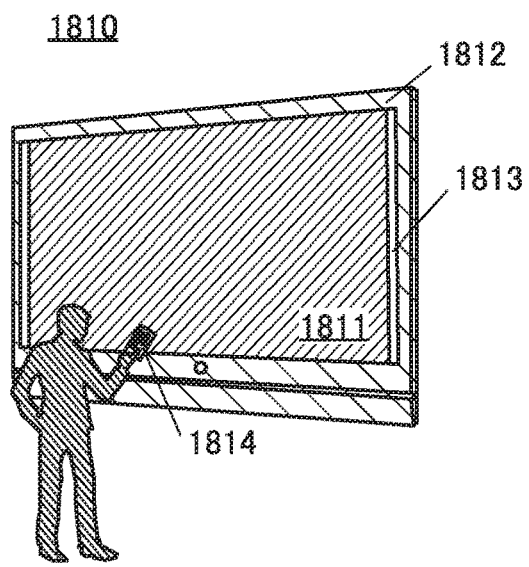
FIG. 25 Diagrams illustrating electronic devices.

FIG. 25(A) illustrates a television device 1810. The television device 1810 includes a display unit 1811, a housing 1812, a speaker 1813, and the like. An LED lamp, operation keys (including a power switch or an operation switch), a connection terminal, a variety of sensors, a microphone, and the like can be also included.

The television device 1810 can be controlled with a remote controller 1814.

As airwaves the television device 1810 can receive, ground waves, waves transmitted from a satellite, and the like can be given. Furthermore, as the airwaves, airwaves for analog broadcasting, digital broadcasting, image-and-sound broadcasting, audio-only broadcasting, and the like can be given. For example, airwaves transmitted in a certain frequency band in a UHF band (approximately 300 MHz to 3

GHz) or a VHF band (30 MHz to 300 MHz) can be received. With the use of a plurality of pieces of data received in a plurality of frequency bands, for example, the transfer rate can be increased and more information can thus be obtained. Accordingly, the display unit 1831 can display an image with a resolution higher than the full high definition. For example, an image with a resolution of 4K, 8K, 16K, or higher can be displayed.

A structure may be employed in which an image to be displayed on the display unit 1831 is generated using broadcasting data transmitted with a technology for transmitting data via a computer network such as the Internet, a LAN (Local Area Network), or Wi-Fi (registered trademark). In that case, the television device 1810 does not necessarily include a tuner.

Figure 25B:
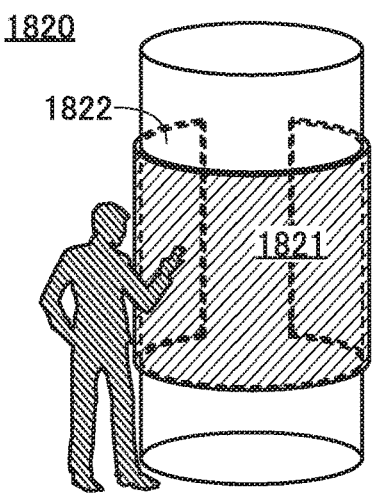

FIG. 25(B) illustrates a digital signage 1820 mounted on a cylindrical pillar 1822. The digital signage 1820 includes a display unit 1821.

The larger the display unit 1821, the more amount of information that can be provided at a time. In addition, the larger the display unit 1821 is, the more it attracts attention, so that the effectiveness of the advertisement can be increased, for example.

It is preferable to use a touch panel in the display unit 1821 because not only a still image or a moving image is displayed on the display unit 1821 but also users can operate intuitively. For an application for providing information such as route information or traffic information, usability can be enhanced by intuitive operation.

Figure 25C:
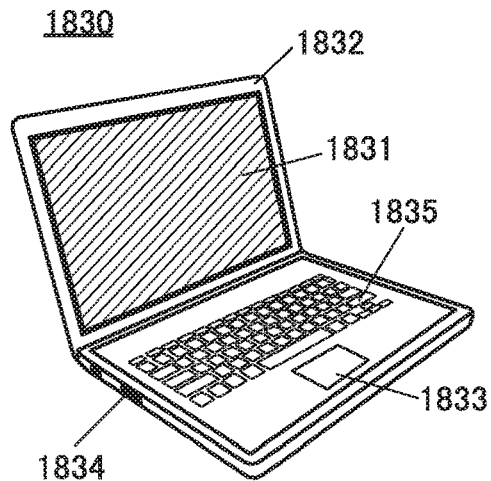

FIG. 25(C) illustrates a notebook personal computer 1830. The personal computer 1830 includes a display unit 1831, a housing 1832, a touch pad 1833, a connection port 1834, and the like.

The touch pad 1833 functions as an input means such as a pointing device or a pen tablet and can be controlled with a finger, a stylus, or the like.

Furthermore, a display element is incorporated in the touch pad 1833. As illustrated in FIG. 25(C), when input keys 1835 are displayed on a surface of the touch pad 1833, the touch pad 1833 can be used as a keyboard. In that case, a vibration module may be incorporated in the touch pad 1833 so that sense of touch is achieved by vibration when the input keys 1835 are touched.

Figure 25D:
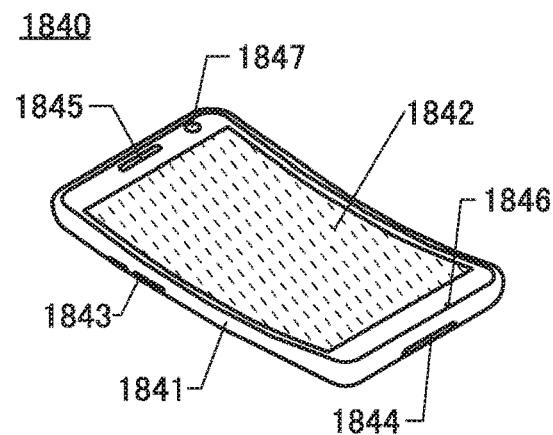

FIG. 25(D) illustrates an example of a portable information terminal. A portable information terminal 1840 illustrated in FIG. 25(D) includes a housing 1841, a display unit 1842, an operation button 1843, an external connection port 1844, a speaker 1845, a microphone 1846, a camera 1847, and the like.

The display unit 1842 is provided with the display device of one embodiment of the present invention.

The portable information terminal 1840 includes a touch sensor in the display unit 1842. All operations such as making a call and inputting a letter can be performed by a touch on the display unit 1842 with a finger, a stylus, or the like.

By an operation with the operation button 1843, power on/off operations or switching of types of images displayed on the display unit 1842 can be performed. For example, switching from a mail creation screen to a main menu screen can be performed.

When a sensing device such as a gyroscope sensor or an acceleration sensor is provided inside the portable information terminal 1840, the orientation (horizontal or vertical) of the portable information terminal 1840 can be determined and the orientation of display on the screen of the display unit 1842 can be automatically changed. The orientation of display on the screen can also be changed by a touch on the display unit 1842, an operation with the operation button 1843, sound input using the microphone 1846, or the like.

The portable information terminal 1840 has a function of, for example, one or more selected from a telephone set, a notebook, an information browsing system, and the like. Specifically, the portable information terminal can be used as a smartphone. The portable information terminal 1840 is capable of executing a variety of applications such as mobile phone calls, e-mailing, viewing and editing texts, music reproduction, video replay, Internet communication, and games.

Figure 25E:
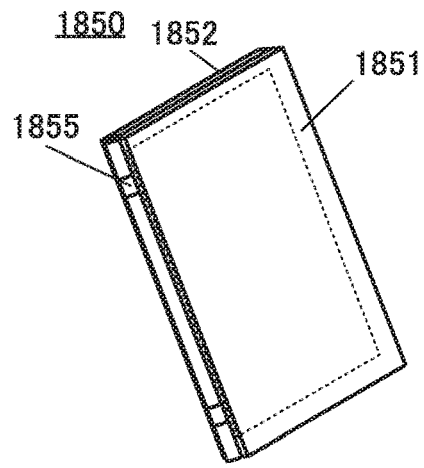
Figure 25F:
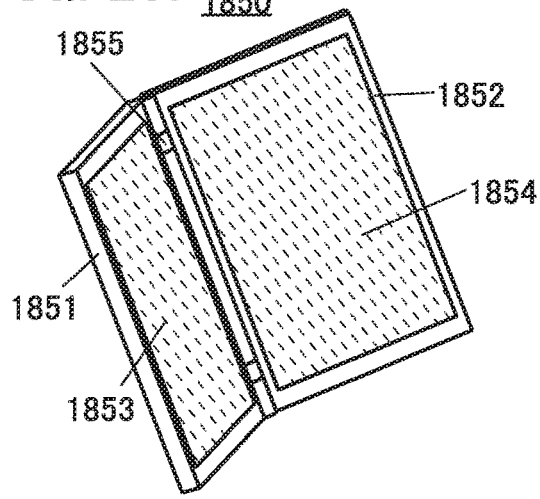

FIGS. 25(E) and 25(F) illustrate an example of a portable information terminal 1850.

The portable information terminal 1850 includes a housing 1851, a housing 1852, a display unit 1853, a display unit 1854, a hinge 1855, and the like.

The housing 1851 and the housing 1852 are joined together with the hinge 1855. As for the portable information terminal 1850, the housing 1851 and the housing 1852 can be opened as illustrated in FIG. 25(F) from a folded state illustrated in FIG. 25(E).

For example, text information can be displayed on the display unit 1853 and the display unit 1854; thus, the portable information terminal can be used as an e-book reader. Furthermore, a still image or a moving image can be displayed on the display unit 1853 and the display unit 1854.

The portable information terminal 1850 can be in a folded state when being carried, and thus is highly versatile.

Note that the housing 1851 and the housing 1852 may include a power button, an operation button, an external connection port, a speaker, a microphone, and the like.

This embodiment can be implemented in an appropriate combination with the structures described in the other embodiments and the like.

REFERENCE NUMERALS

100: display device, 101: housing, 102: stand, 103: housing switch, 105: bus line, 110: control unit, 113: display region, 120: storage unit, 130: arithmetic unit, 131: neural network, 140: input/output unit, 150: communication unit, 160: display unit, 161: display region, 162: display region, 165: pixel

The invention claimed is:

1. An image processing method for generating image data to be displayed on a display device,
   wherein the display device comprises a display unit comprising a plurality of pixels, a scan line driver circuit, a first signal line driver circuit, and a second signal line driver circuit,
   wherein the display unit comprises a first display region and a second display region,
   wherein the display unit comprises a boundary region comprising a part of the first display region and a part of the second display region,
   wherein the first signal line driver circuit is configured to supply a signal to the first display region,
   wherein the second signal line driver circuit is configured to supply a signal to the second display region, and
   wherein the image processing method comprising:
   a first step of dividing first image data into n for generating n (n is an even number greater than or equal to 2) second image data;
   a second step of generating third image data corresponding to the boundary region;

a third step of increasing resolution of each of the n second image data for generating n fourth image data;

a fourth step of increasing resolution of the third image data for generating fifth image data; and a fifth step of generating sixth image data using the n fourth image data and the fifth image data, wherein the first step and the second step are performed in parallel.

2. The image processing method according to claim 1, wherein the display device comprises a plurality of arithmetic units, and wherein the first step and the second step are performed using different arithmetic units.

3. The image processing method according to claim 1, wherein resolution of the fourth image data is higher than resolution of the second image data.

4. The image processing method according to claim 1, wherein the third step is performed by a Rapid and Accurate Image Super-Resolution method, an Anchored Neighborhood Regression method, or an Adjusted Anchored Neighbor Regression method, or using a neural network.

5. The image processing method according to claim 1, wherein the fourth step is performed using a neural network.

6. The image processing method according to claim 1, wherein the display device is provided with n+1 or more arithmetic units so that the n fourth image data and the fifth image data are generated using different arithmetic units.

7. The image processing method according to claim 1, wherein the pixel comprises a transistor, and wherein the transistor comprises amorphous silicon in a semiconductor layer.

8. The image processing method according to claim 1, wherein the pixel comprises a transistor, and wherein the transistor comprises a metal oxide in a semiconductor layer.

9. The image processing method according to claim 1, wherein a screen size of the display unit is 30 inches diagonal or more.

10. The image processing method according to claim 1, wherein resolution of the sixth image data is 8K or more.

* * * * *